(12) United States Patent
Einaga et al.

(10) Patent No.: US 8,211,598 B2
(45) Date of Patent: Jul. 3, 2012

(54) BLACK PHOTOSENSITIVE RESIN COMPOSITION, AND COLOR FILTER AND METHOD OF PRODUCING THE SAME

(75) Inventors: Hiroyuki Einaga, Shizuoka (JP); Yoichi Maruyama, Shizuoka (JP); Kazuto Shimada, Shizuoka (JP); Tomotaka Tsuchimura, Shizuoka (JP); Hiroshi Taguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 466 days.

(21) Appl. No.: 12/464,148

(22) Filed: May 12, 2009

(65) Prior Publication Data
US 2009/0280416 A1 Nov. 12, 2009

(30) Foreign Application Priority Data
May 12, 2008 (JP) ................... 2008-125322

(51) Int. Cl.
*G02B 5/20* (2006.01)
(52) U.S. Cl. ........................... 430/7; 430/288.1
(58) Field of Classification Search ........................ None
See application file for complete search history.

(56) References Cited

U.S. PATENT DOCUMENTS

| | | | |
|---|---|---|---|
| 5,635,105 A | 6/1997 | Kawata et al. | |
| 2002/0081376 A1* | 6/2002 | Yonehara | 427/162 |

FOREIGN PATENT DOCUMENTS

| | | |
|---|---|---|
| EP | 1495864 A2 | 1/2005 |
| EP | 1826200 A2 | 8/2007 |
| JP | 2002-088136 A | 3/2002 |
| JP | 2002-146353 A | 5/2002 |
| JP | 2005-053070 A | 3/2005 |
| JP | 2006-169294 A * | 6/2006 |
| JP | 2006-232968 A * | 9/2006 |
| JP | 2006-259716 A | 9/2006 |
| WO | 2007/029885 A1 | 3/2007 |

OTHER PUBLICATIONS

Computer-generated translation of JP 2006-169294 (Jun. 2006).*
Computer-generated translation of JP 2006-232968 (Sep. 2006).*
Extended European Search Report dated Oct. 27, 2009.
Masaki Okazaki, et al.; "Polymerizable Discoticnematic Triphenylene Derivatives and their Application to an Optically Anisotropic Film"; John Wiley & Sons, Ltd., Aug. 1, 2000, Polymers for Advanced Technologies, vol. 11, No. 8-12, pp. 398 to 403.
Partial European Search Report dated Aug. 5, 2009.

* cited by examiner

*Primary Examiner* — John A. McPherson
(74) *Attorney, Agent, or Firm* — Sughrue Mion, PLLC

(57) ABSTRACT

A black photosensitive resin composition, a light-shielding color filter using the composition and its production method are provided, the black photosensitive resin composition including: a black colorant; a compound represented by Formula (I) or (II) as defined in the specification; and a photopolymerization initiator.

Formula (I):

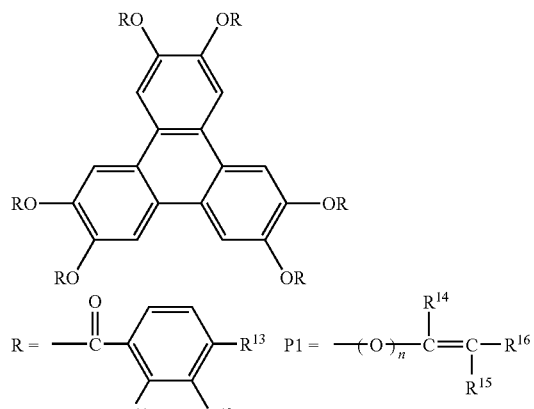

Formula (II):

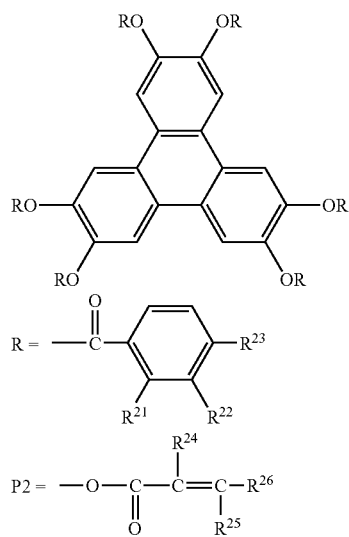

12 Claims, No Drawings

BLACK PHOTOSENSITIVE RESIN COMPOSITION, AND COLOR FILTER AND METHOD OF PRODUCING THE SAME

BACKGROUND OF THE INVENTION

1. Field of the Invention

The present invention relates to a black photosensitive resin composition colored black, and to a color filter and a method of producing the same.

2. Description of the Related Art

CCD, CMOS or the like solid-state image sensors have a light-shielding film for noise prevention and image quality enhancement. For forming the light-shielding film, for example, widely used is a photosensitive resin composition containing a black colorant such as carbon black or titanium black.

For the photosensitive resin composition for use in forming a light-shielding film (black pattern) for solid-state image sensors, desired is a black resist capable of sufficiently blocking the incidence of visible light. In order that a resist material could have sufficient light-shieldability, the content of the colorant of light-shielding material must be increased or the film thickness must be increased. As a result, the optical density of the film itself shall increase, and when the film is patterned through exposure to a light source of, for example, i-line or the like, the light could not reach the depth of the film and therefore the film could not be fully photocured. In such a case, the depth of the film may undergo overdevelopment and the pattern may be thereby thinned; and the adhesiveness of the pattern formed on a wafer by the subsequent development may be poor and the pattern may be peeled away from the wafer. In addition, the film surface layer could hardly be cured sufficiently, and surface layer defects may occur on the side surfaces of the pattern.

Relative to such phenomena, JP-A-2002-088136 (the term "JP-A" as used herein means an "unexamined published Japanese patent application") and JP A-2006-259716 disclose black photosensitive resin compositions comprising a compound having a specific skeleton, which, however, are still unsatisfactory for satisfying all the requirements of good stability (free from sensitivity change and patterning profile change with time), high light-shieldability and good adhesiveness to substrate of the black photosensitive resin compositions and the requirement of the absence of surface layer defects on the side surfaces of the formed patterns.

SUMMARY OF THE INVENTION

The present invention is to provide a black photosensitive resin composition comprising a compound represented by Formula (I) or (II). In addition, the present invention is to optimize the constitution of the black photosensitive resin composition and to provide a color filter equipped with a light-shielding color filter which has high light-shieldability, which is free from pattern defects and which has good adhesiveness to substrate.

For attaining the above tasks, specifically, the present invention provides the following:

(1) A black photosensitive resin composition, comprising:

a black colorant;

a compound represented by Formula (I) or (II); and a photopolymerization initiator:

Formula (I):

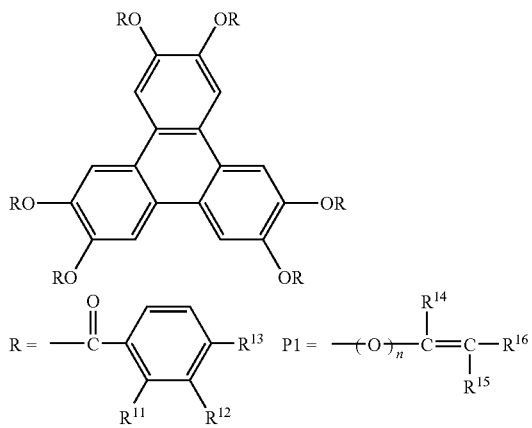

wherein $R^{11}$ and $R^{12}$ each independently represent a hydrogen atom or a methyl group;

$R^{13}$ represents a substituent P1 or an alkoxy group substituted with a substituent P1 at the terminal of the alkoxy group;

$R^{14}$ and $R^{15}$ in the substituent P1 each independently represent a hydrogen atom or an unsubstituted alkyl group;

$R^{16}$ in the substituent P1 represents a hydrogen atom, a 2-chloroethyl group, a methoxyethoxyethyl group or an unsubstituted alkyl group; and n represents 0 or 1:

Formula (II):

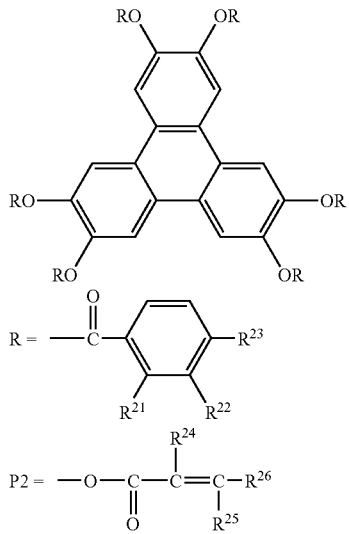

wherein $R^{21}$ and $R^{22}$ each independently represent a hydrogen atom or a methyl group;

$R^{23}$ represents an alkoxy group substituted with a substituent P2 at the terminal of the alkoxy group;

$R^{24}$ and $R^{25}$ in the substituent P2 each independently represent a hydrogen atom or an unsubstituted alkyl group;

$R^{26}$ in the substituent P2 represents a hydrogen atom, a 2-chloroethyl group, a methoxyethoxyethyl group or an unsubstituted alkyl group.

(2) The black photosensitive resin composition as described in (1) above, further comprising:

an alkali-soluble resin that includes a polymer containing monomers having at least one of a hydroxyl group and a carboxylic acid group as a main ingredient of the alkali-soluble resin, the polymer having a weight-average molecular weight of from 5000 to $1\times10^5$ in terms of polystyrene as measured by GPC method.

(3) The black photosensitive resin composition as described in (1) or (2) above, wherein a content of the compound represented by Formula (I) or (II) is from 0.01 to 20% by mass of the total solid content of the black photosensitive resin composition.

(4) The black photosensitive resin composition as described in any one of (1) to (3) above, wherein the black colorant includes at least one of carbon black and titanium black.

(5) The black photosensitive resin composition as described in any one of (1) to (4) above, wherein the photopolymerization initiator is an oxime-type initiator.

(6) The black photosensitive resin composition as described in any one of (2) to (5) above, wherein the polymer contains a hydroxyl group and a carboxylic acid group.

(7) A method of producing a light-shielding color filter, the method comprising:

applying the black photosensitive resin composition as described in any one of (1) to (6) above onto a support so as to form a coating layer;

exposing the coating layer via a photomask so as to form an exposed coating layer; and developing the exposed coating layer to form a pattern.

(8) A light-shielding color filter produced by the method as described in (7) above.

DETAILED DESCRIPTION OF THE INVENTION

The black photosensitive resin composition of the present invention and the image formation method of using it are described in detail hereinafter.

<Black Photosensitive Resin Composition>

The black photosensitive resin composition of the present invention comprises at least a black colorant, a compound represented by Formula (I) or (II) as a polymerizable monomer, and a photopolymerization initiator, for which generally used is a solvent. The composition may comprise at least a black colorant, a compound represented by Formula (I) or (II) as a polymerizable monomer, an alkali-soluble resin, and a photopolymerization initiator, for which generally used is a solvent. The main ingredient of the alkali-soluble resin is a polymer that contains monomers having an alcoholic hydroxyl group and/or a carboxylic acid group, and has a weight-average molecular weight (in terms of polystyrene as measured through GPC) of from 5000 to $1\times10^5$.

If desired, the black photosensitive resin composition of the present invention may further contain any other ingredient such as pigment dispersant and/or pigment derivative, or the like.

In the present invention, the photosensitive composition containing a black colorant comprises a polymerizable monomer having a specific structure, therefore capable of forming a light-shielding color filter having good color shieldability with no pattern defects and having excellent adhesiveness to substrate.

The constitutive ingredients of the black photosensitive resin composition of the present invention are described in detail hereinafter.

(Black Colorant)

The black photosensitive resin composition of the present invention contains at least one black colorant. Containing a black colorant, the composition may form a light-shielding film. The black colorant for use in the present invention includes not only black pigment and black dye but also mixed colorants of color pigments, dyes and others as combined except black.

The content of the black colorant in the black photosensitive resin composition of the present invention is preferably 20% by mass or more of the total solid content of black photosensitive resin composition, more preferably 30% by mass or more. (In this specification, mass ratio is equal to weight ratio.) The uppermost limit of the content of the black colorant is preferably at most 80% by mass from the viewpoint that the relative amount of the ingredients that contribute toward the photolithographic property of the composition can be kept in some degree, that the composition may be effectively photocured and that the adhesiveness of the composition to substrate and the film strength can be increased. When the content falls within the above range, then the composition may form a thin film having a high optical density.

One or more different types of the black colorants may be used either singly or in combination.

In the black photosensitive resin composition of the present invention, any known colorants such as red, blue, green, yellow, cyan, magenta, violet, orange and other pigments and/or dyes may be combined to be black and may be used in place of the black colorant therein. Further, in addition to the black colorant therein, for the purpose of controlling the light shieldability at a desired wavelength, any known colorants such as red, blue, green, yellow, cyan, magenta, violet, orange and other pigments and/or dyes may be added to the composition.

In case where any other pigment, dye or the like colorant is combined with the black colorant for use herein, the content of the additional colorant is preferably within a range of from 2 to 50 parts by mass relative to 100 parts by mass of the total of the black colorant and the additional colorant, more preferably from 2 to 30 parts by mass, even more preferably from 2 to 10 parts by mass.

As the black colorant, preferred are carbon black, titanium black, iron oxide, manganese oxide, graphite and the like, from the viewpoint that the colorant may realize a high optical density even when added in a small amount. Above all, more preferred are carbon black and titanium black.

The average particle diameter (average primary particle diameter) of the black colorant is preferably smaller from the viewpoint that such small particles give few impurities and that, using such small particles, the producibility of solid-state image sensors is good. The average primary particle diameter is preferably 100 nm or less, more preferably 50 nm or less, even more preferably 30 nm or less.

The average particle diameter may be determined by applying a colorant to a suitable substrate and analyzing it with a scanning electronic microscope.

Carbon black, as mentioned above, is black fine particles containing carbon fine particles, preferably containing carbon fine particles having a diameter of from 3 to 1000 nm or so. The surfaces of the fine particles may have various functional groups containing a carbon atom, a hydrogen atom, an oxygen atom, a sulfur atom, a nitrogen atom, a halogen atom, an inorganic atom, or the like.

Depending on the intended use thereof, the properties of carbon black may be changed variously by variously changing the particle diameter (particle size), the structure (particle configuration), or the surface condition (functional group). The degree of blackness and the affinity for coating base of carbon black may be changed, or carbon black may be so modified as to have electroconductivity.

As specific examples of carbon black, various commercial products are known, including, for example, Mitsubishi Chemical's Carbon Black #2400, #2350, #2300, #2200, #1000, #980, #970, #960, #950, #900, #850, MCF88, #650, MA600, MA7, MA8, MA11, MA10, MA220, IL30B, IL31B, IL7B, IL11B, IL52B, #4000, #4010, #55, #52, #50, #47, #45, #44, #40, #33, #32, #30, #20, #10, #5, CF9, #3050, #3150, #3250, #3750, #3950, Diablack A, Diablack N220M, Diablack N234, Diablack I, Diablack LI, Diablack II, Diablack N339, Diablack SH, Diablack SHA, Diablack LH, Diablack H, Diablack HA, Diablack SF, Diablack N550M, Diablack E, Diablack G, Diablack R, Diablack N760M, Diablack LP; Cancurve's Carbon Black Thermax N990, N991, N907, N908, N990, N991, N908, or the like;

Asahi Carbon's Carbon Black Asahi #80, Asahi #70, Asahi #70L, Asahi F-200, Asahi #66, Asahi #66HN, Asahi #60H, Asahi #60U, Asahi #60, Asahi #55, Asahi #50H, Asahi #51, Asahi #50U, Asahi #50, Asahi #35, Asahi #15, Asahi Thermal; Degussa's Carbon Black Color Black Fw200, Color Black Fw2, Color Black Fw2V, Color Black Fw1, Color Black Fw18, Color Black S170, Color Black S160, Special Black 6, Special Black 5, Special Black 4, Special Black 4A, Printex U, Printex V, Printex 140U, Printex 140V, or the like; Showa Cabot's Showblack N134, Showblack N110, Showblack N234, Showblack N220, Showblack N219, Showblack N285, Showblack N339, Showblack N330, Showblack N326, Showblack N351, Showblack N330T, Showblack IP200, Showblack IP300, Showblack MAF, Showblack N500, Showblack N762;

Shinnikka Carbon's Nitelon #300, Nitelon #200, Nitelon #200H, Nitelon #2001S, Nitelon #200L, or the like; Tokai Carbon's Sheast 9H, Sheast 9, Sheast 7HM, Sheast 6, Sheast 600, Sheast 5H, Sheast KH, Sheast 3H, Sheast 3, Sheast 300, Sheast NH, Sheast N, Sheast 3M, Sheast SVH, Sheast 116HM, Sheast 116, Sheast SO, Sheast F, Sheast FM, Sheast V, Sheast S, or the like; Cabot's Vulcan 10H, Vulcan 9, Vulcan 7H, Vulcan 6, Vulcan 6LM, Regal 300, Vulcan M, Vulcan 3H, Vulcan 4H, Vulcan J, Vulcan 3, Vulcan N299, Sterling-SO, Sterling V, Sterling VH, Sterling 142, Sterling-NS, Regal-SRF, or the like.

In addition, further mentioned are Columbian's products, Engineered Carbon's products, and Sid Richardson's products.

As the case may be, carbon black for use herein preferably has an electric-insulating property.

Such insulating carbon black is carbon black showing an electric-insulating property when the volume resistance thereof, as a powder, is measured according to the method mentioned below. Specifically, carbon black particles have an organic compound on their surfaces, for example, the surfaces of carbon black particles have adsorbed an organic substance, or are coated with an organic substance, or an organic substance is chemically bonded to the surfaces (by grafting). Concretely, carbon black is dispersed in propylene glycol monomethyl ether along with a copolymer of benzyl methacrylate and methacrylic acid (70/30 by mol) (having a mass-average molecular weight of 30,000) in a ratio of 20/80 by mass to prepare a coating liquid, this is applied onto a chromium substrate having a thickness of 1.1 mm and a size of 10 cm×10 cm to form thereon a coating film having a dry thickness of 3 μm, then the coating film is heated on a hot plate at 220° C. for about 5 minutes, and thereafter using a Mitsubishi Chemical's high-resistance meter, Hirestor UP (MCP-HT450) according to JISK6911, the volume resistivity of the film is measured at 23° C. and a relative humidity of 65%. Preferably, the insulating carbon black has a volume resistivity, thus measured, of $10^5$ Ω·cm or more, more preferably $10^6$ Ω·cm or more, even more preferably $10^7$ Ω·cm or more.

The carbon black of the type usable herein is, for example, a resin-coated carbon black such as those described in JP-A-11-60988, JP-A-11-60989, JP-A-10-330643, JP-A-11-80583, JP-A-11-80584, JP-A-9-124969, JP-A-9-95625.

Titanium black for use herein is black particles having a titanium atom. Preferred are low-order titanium oxide, titanium oxinitride, or the like. The titanium black particles may be surface-modified, if desired, for the purpose of enhancing the dispersibility thereof and preventing their aggregation. Specifically, the particles may be coated with any of silicon oxide, titanium oxide, germanium oxide, aluminium oxide, magnesium oxide or zirconium oxide, or may be processed with a water-repellent substance as in JP-A-2007-302836.

The titanium black may contain one or more black pigments such as composite oxides with Cu, Fe, Mn, V, Ni or the like as well as cobalt oxide, iron oxide, carbon black, aniline black or the like, either singly or as combined for the purpose of controlling the dispersibility and the colorability thereof In this case, the titanium black particles shall account for 50% by mass or more of the pigment. In addition, for the purpose of controlling the light-shieldability thereof at a desired wavelength, any already-existing colorants may be added to the titanium black, for example, red, blue, green, yellow, cyan, magenta, violet, orange and the like pigments and dyes.

For producing the titanium black, employable are a method of heating and reducing a mixture of titanium oxide and metal titanium in a reducing atmosphere (JP-A-49-5432); a method of reducing ultra-fine titanium dioxide prepared through high-temperature hydrolysis of titanium tetrachloride, in a hydrogen-containing reducing atmosphere (JP-A-57-205322); a method of reducing titanium dioxide or titanium hydroxide at a high temperature in the presence of ammonia (JP-A-60-65069, JP-A-61-201610); a method of adhering a vanadium compound to titanium dioxide or titanium hydroxide and then reducing it at a high temperature in the presence of ammonia (JP-A-61-201610), to which, however, the present invention should not be limited thereto.

Commercial products may be used as the titanium black. Examples of commercial products are Mitsubishi Material's Titanium Black 10S, 12S, 13R, 13M, 13M-C, 13R, 13R-N; Ako Chemical's Tilack D, or the like.

Not specifically defined, the particle diameter of the titanium black particles is preferably from 3 to 2000 nm, from the viewpoint of the dispersibility and the colorability thereof, more preferably from 10 to 500 nm.

Not specifically defined, the specific surface area of the titanium black may be generally from 5 to 150 $m^2/g$ or so, preferably from 20 to 100 $m^2/g$ or so, as measured according to a BET method, in order that the titanium black processed with a water-repellent agent on the surface thereof could have a predetermined water-repellent property.

For dispersing the carbon black and the titanium black, usable is a dispersant having an acid value/amine value. Specifically, herein usable are Avecia's Sorsperse 24000, Sorsperse 33500; BYK-Chemie Japan's Disperbyk 161, or the like. "Having an acid value/amine value" as referred to herein means that the dispersant has a group having an acid value, or group having an amine value, or has both the two.

The other dispersant also usable herein is a polymer dispersant prepared by polymerizing a monomer such as (meth) acrylic acid, (meth)acrylate, (meth)acrylamide or its derivative, styrene or its derivative, or the like.

Examples of the monomer include styrene monomers such as styrene, o-methylstyrene, m-methylstyrene, p-methylstyrene, α-methylstyrene, p-methoxystyrene, p-tert-butylstyrene, p-phenylstyrene, o-chlorostyrene, m-chlorostyrene, p-chlorostyrene; (meth)acrylic monomers such as acrylic acid, methyl acrylate, ethyl acrylate, propyl acrylate, n-butyl acrylate, isobutyl acrylate, dodecyl acrylate, stearyl acrylate, 2-ethylhexyl acrylate, hydroxyethyl acrylate, hydroxypropyl acrylate, methacrylic acid, methyl methacrylate, ethyl methacrylate, propyl methacrylate, n-butyl methacrylate, isobutyl methacrylate, n-octyl methacrylate, dodecyl methacrylate, benzyl methacrylate, 2-ethylhexyl methacrylate, stearyl methacrylate, hydroxyethyl methacrylate, hydroxypropyl methacrylate; other various monomers such as ethylene, propylene, butylene, vinyl chloride, vinyl acetate, acrylonitrile, acrylamide, methacrylamide, N-vinylpyrrolidone. Homopolymers and copolymers of these monomers may be used as the dispersant. Of those, preferred are (meth)acrylate-based polymers.

In addition, resins such as polyurethane or polyimide, as well as siloxane-based polymers as in JP-A-2002-241616 and JP-A-2002-234995 are also usable for dispersing the particles.

The resin usable as the dispersant is not specifically defined in point of its molecular weight so far as it secures the dispersion of the particles. From the viewpoint of the dispersibility, the weight-average molecular weight of the resin is preferably from 500 to 200,000, more preferably from 800 to 50,000, even more preferably from 1,000 to 30,000.

As the dispersion medium in which the black colorant such as carbon black or titanium black is disperse, various water-soluble or water-insoluble materials are usable capable of functioning as a dispersion solvent. For example, usable are water; alcohols such as methyl alcohol, ethyl alcohol, isopropyl alcohol, butyl alcohol, allyl alcohol; glycols and their derivatives such as ethylene glycol, propylene glycol, propylene glycol monomethyl ether, diethylene glycol, polyethylene glycol, polypropylene glycol, diethylene glycol monoethyl ether, polypropylene glycol monoethyl ether, polyethylene glycol monoallyl ether, polypropylene glycol monoallyl ether; glycerol and its derivatives such as glycerol, glycerol monoethyl ether, glycerol monoallyl ether; ethers such as tetrahydrofuran, dioxane; ketones such as methyl ethyl ketone, methyl isobutyl ketone; hydrocarbons such as liquid paraffin, decane, decene, methylnaphthalene, decalin, kerosene, diphenylmethane, toluene, dimethylbenzene, ethylbenzene, diethylbenzene, propylbenzene, cyclohexane, partially-hydrogenated triphenyl; silicone oils such as polydimethylsiloxane, partially octyl-substituted polydimethylsiloxane, partially phenyl-substituted polydimethylsiloxane, fluorosilicone oil; halogenohydrocarbons such as chlorobenzene, dichlorobenzene, bromobenzene, chlorodiphenyl, chlorodiphenylmethane; fluorides such as Dailrol (manufactured by Daikin), Demnum (manufactured by Daikin); ester compounds such as ethyl benzoate, octyl benzoate, dioctyl phthalate, trioctyl trimellitate, dibutyl sebacate, ethyl (meth) acrylate, butyl (meth)acrylate, dodecyl (meth)acrylate, ethyl acetate, butyl acetate, propylene glycol monomethyl ether acetate; amide-type solvents such as N,N-dimethylacrylamide, N,N-diethylacrylamide, N-methylpyrrolidone, or the like. One or more of the above may be selected for use herein either singly or in combination.

(Polymerizable Monomer)

The black photosensitive resin composition of the present invention contains at least one compound represented by the following Formula (I) or (II) as a polymerizable monomer. As a result of assiduous studies, the present inventors have found that, when the polymerizable monomer of the type is used, then a light-shielding color filer excellent in light-shieldability, stability, and adhesiveness to substrate can be produced.

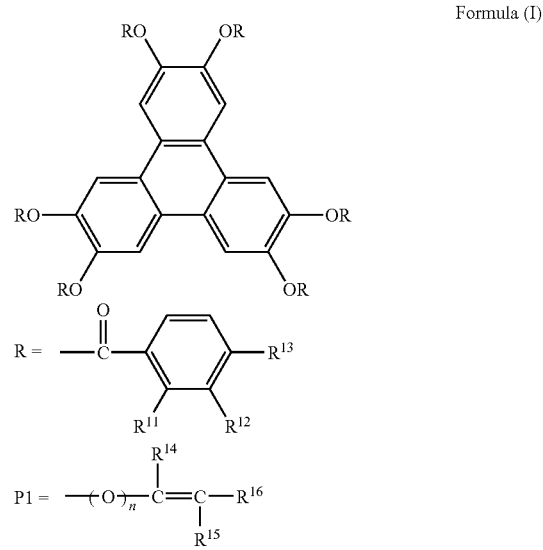

Formula (I)

wherein $R^{11}$ and $R^{12}$ each independently represent a hydrogen atom or a methyl group; $R^{13}$ represents a substituent P1 or an alkoxy group substituted with a substituent P1 at the terminal of the alkoxy group; $R^{14}$ and $R^{15}$ in the substituent P1 each independently represent a hydrogen atom or an unsubstituted alkyl group; $R^{16}$ in the substituent P1 represents a hydrogen atom, a 2-chloroethyl group, a methoxyethoxyethyl group, or an unsubstituted alkyl group; and n indicates 0 or 1.

Formula (II):

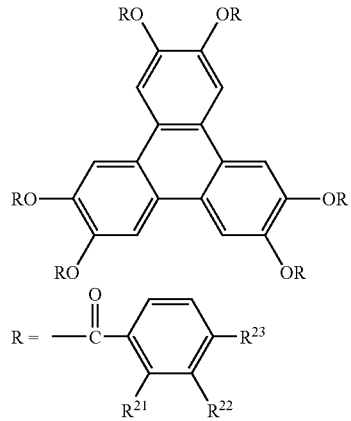

-continued

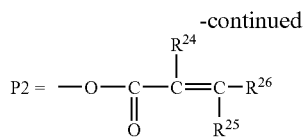

wherein $R^{21}$ and $R^{22}$ each independently represent a hydrogen atom or a methyl group; $R^{23}$ represents an alkoxy group substituted with a substituent P2 at the terminal of the alkoxy group; $R^{24}$ and $R^{25}$ in the substituent P2 each independently represent a hydrogen atom or an unsubstituted alkyl group; $R^{26}$ in the substituent P2 represents a hydrogen atom, a 2-chloroethyl group, a methoxyethoxyethyl group, or an unsubstituted alkyl group.

Hereinafter, Formula (I) is described in detail. $R^{11}$ and $R^{12}$ each independently represent a hydrogen atom or a methyl group. When n is 0, the substituent P1 represents an unsaturated double bond group. The substituents $R^{14}$ and $R^{15}$ each independently represent a hydrogen atom or an alkyl group (e.g., methyl, ethyl, n-propyl, isopropyl, n-butyl, pentyl, hexyl, heptyl, octyl, nonyl; preferably a lower alkyl group such as methyl or ethyl; more preferably methyl). Preferred is a combination where $R^{14}$ is a methyl group and $R^{15}$ is a hydrogen atom, or where $R^{14}$ and $R^{15}$ are both hydrogen atoms.

The substituent $R^{16}$ represents a hydrogen atom, or a substituted or unsubstituted alkyl group (e.g., methyl, ethyl, n-propyl, isopropyl, n-butyl, pentyl, hexyl, heptyl, octyl, nonyl, 2-chloroethyl, 3-methoxyethyl, methoxyethoxyethyl, preferably a lower alkyl such as methyl or ethyl, more preferably methyl), and is preferably a hydrogen atom or a lower alkyl group, more preferably a hydrogen atom.

The alkoxy residue substituted with the terminal substituent P1 represents an alkyleneoxy group (e.g., alkyleneoxy group such as ethyleneoxy, propyleneoxy, butyleneoxy, pentyleneoxy, hexyleneoxy, heptyleneoxy, or ether bond-containing substituted alkyleneoxy group such as ethyleneoxyethoxy). The terminal substituent P1 may directly bond to the aromatic ring.

When n is 1, the terminal substituent P1 in $R^{13}$ represents a vinyl ether group. The substituent $R^{14}$ and $R^{15}$ in P1 each independently represent a hydrogen atom, or an alkyl group (e.g., methyl, ethyl, n-propyl, isopropyl, n-butyl, pentyl, hexyl, heptyl, octyl, nonyl, preferably a lower alkyl group such as methyl or ethyl, more preferably methyl). Preferred is a combination where $R^{14}$ is a methyl group and $R^{15}$ is a hydrogen atom, or $R^{14}$ and $R^{15}$ are both hydrogen atoms.

The substituent $R^{16}$ represents a hydrogen atom, or a substituted or unsubstituted alkyl group (e.g., methyl, ethyl, n-propyl, isopropyl, n-butyl, pentyl, hexyl, heptyl, octyl, nonyl, 2-chloroethyl, methoxyethoxyethyl, preferably a lower alkyl such as methyl or ethyl, more preferably methyl), and is preferably a hydrogen atom or a lower alkyl group, more preferably a hydrogen atom. Accordingly, the substituent P1 is preferably an unsubstituted vinyloxy group, generally a functional group having a high polymerization activity.

The alkoxy residue substituted with the terminal substituent P1 represents an alkyleneoxy group (e.g., ethyleneoxy, propyleneoxy, butyleneoxy, pentyleneoxy, hexyleneoxy, heptyleneoxy), or an alkyleneoxy-substituted alkoxy group (e.g., ethyleneoxyethoxy).

Specific examples of the compound represented by Formula (I) for use in the present invention are mentioned below, by which, however, the present invention should not be restricted thereto.

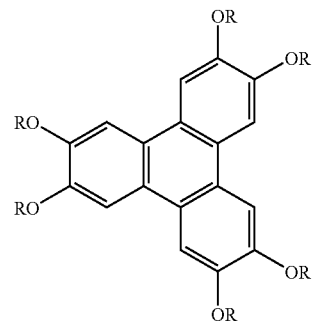

TP-1 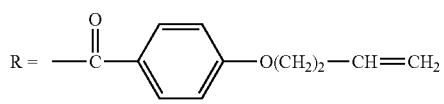

TP-2 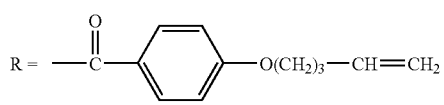

TP-3 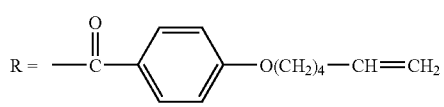

TP-4 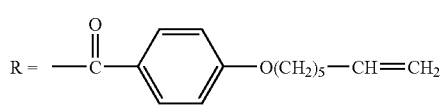

TP-5 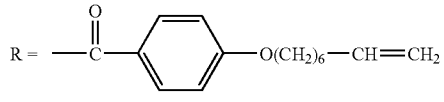

TP-6 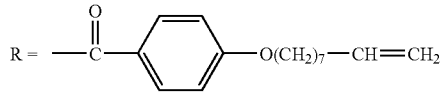

TP-7 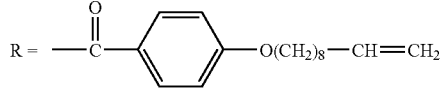

TP-8 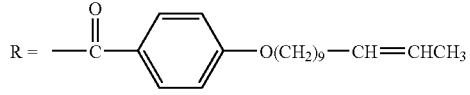

TP-9 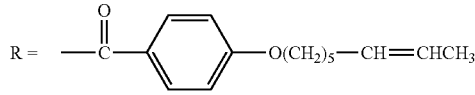

TP-10 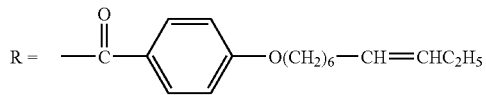

TP-11 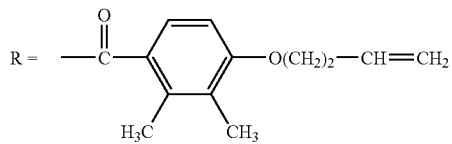

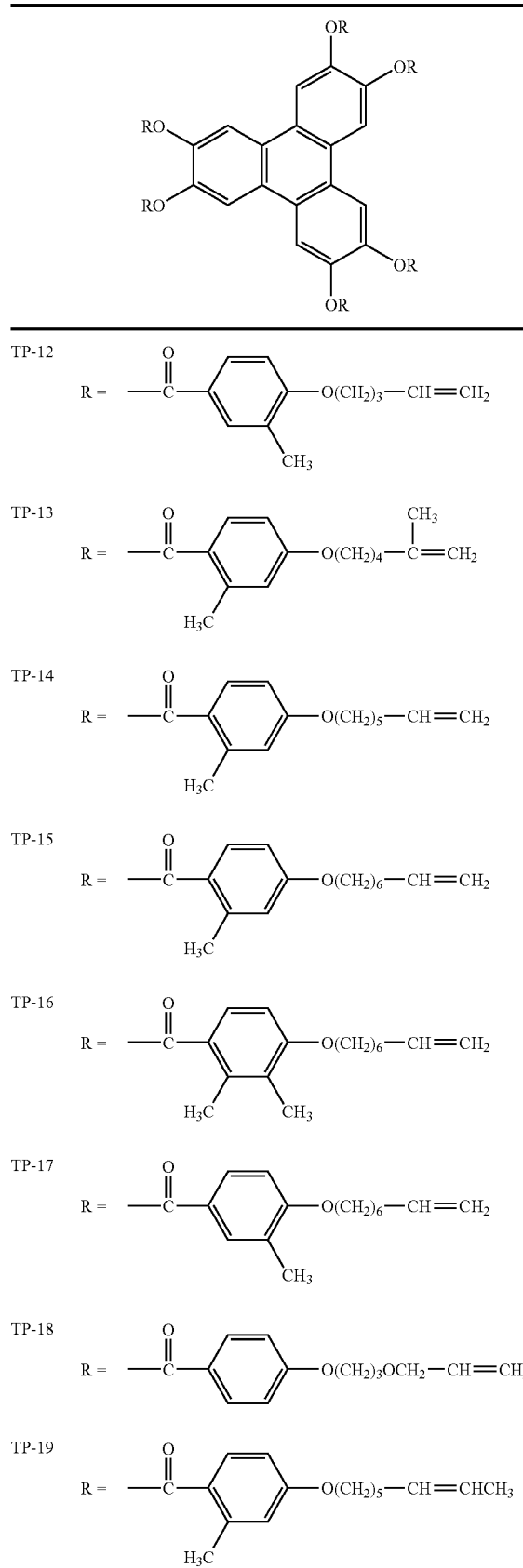
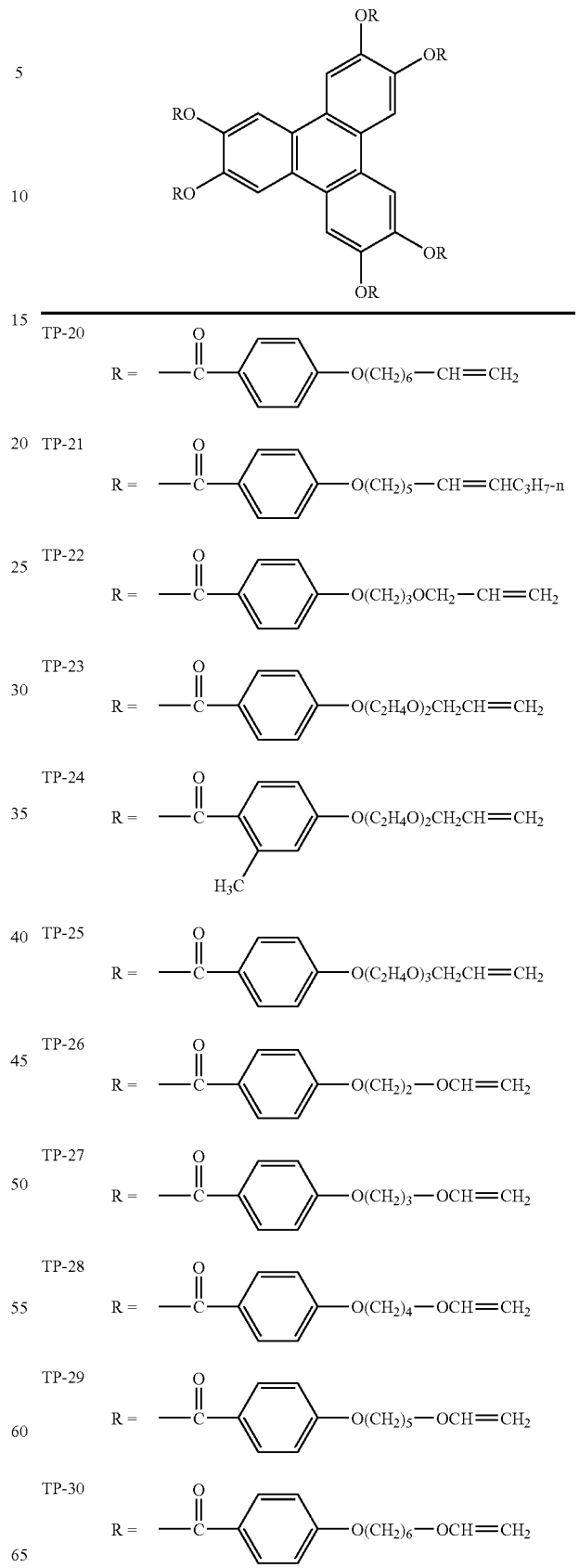

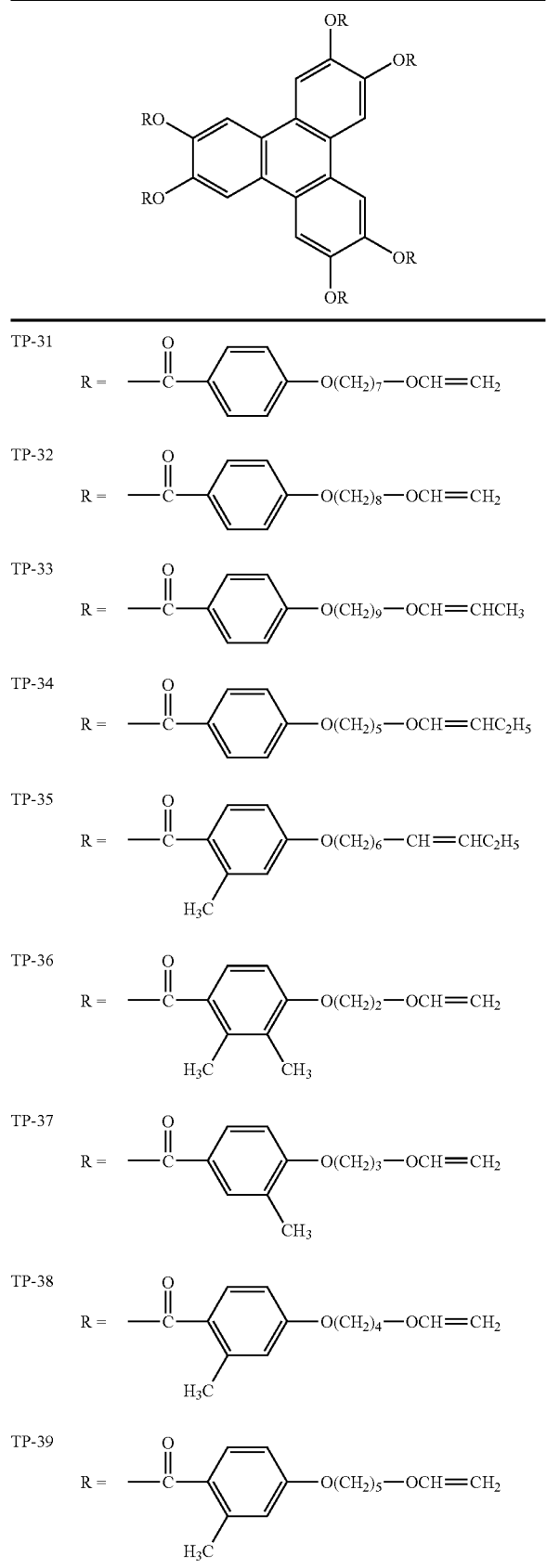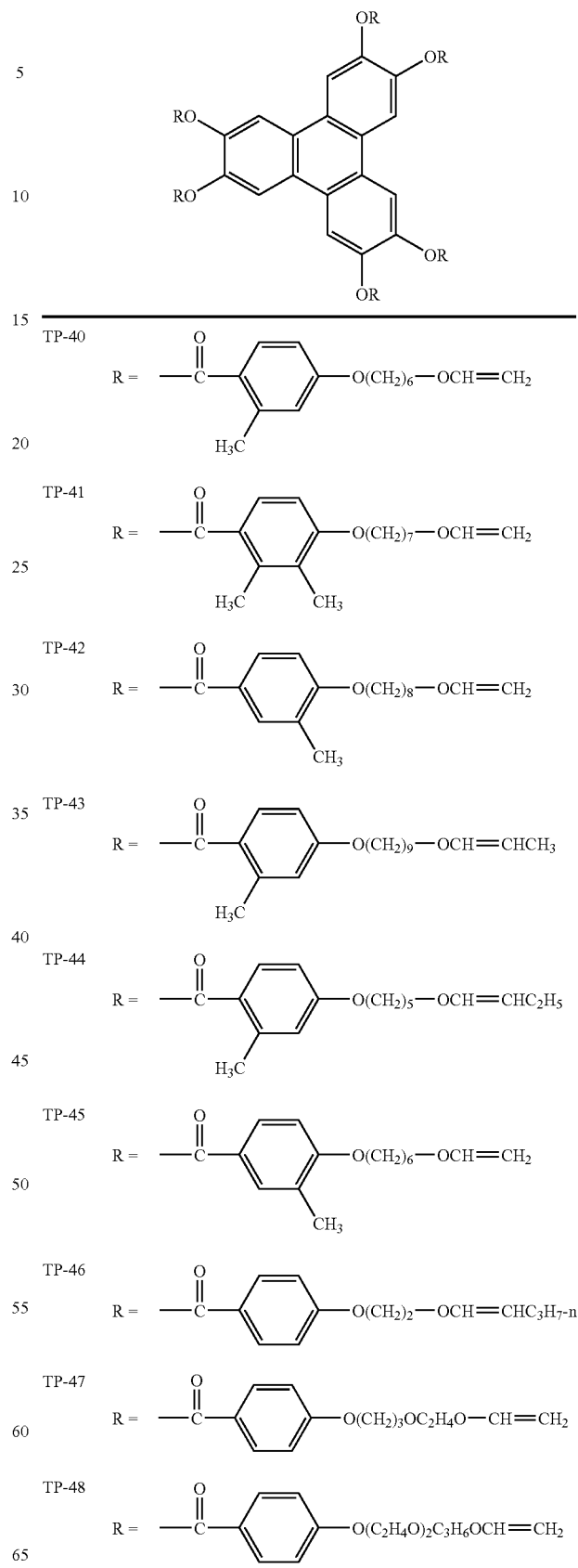

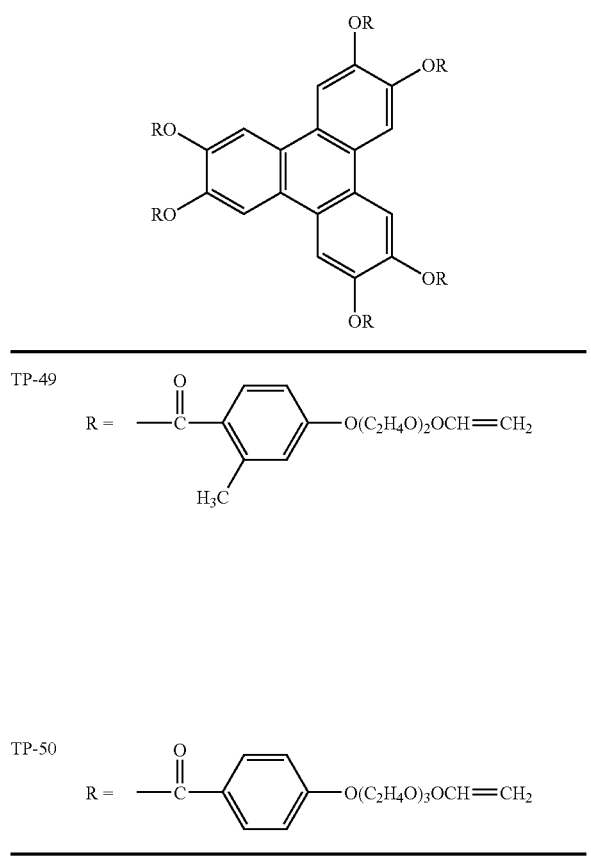

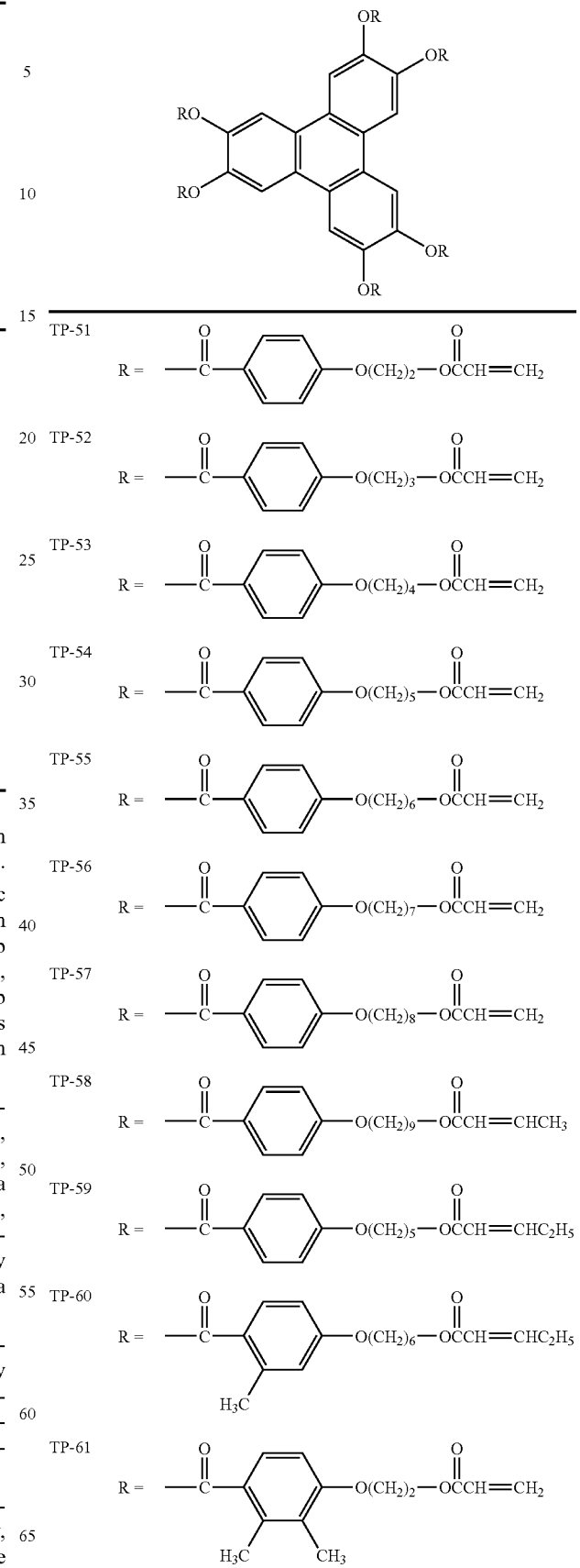

Next described in detail is Formula (II). $R^{21}$ and $R^{22}$ each independently represent a hydrogen atom or a methyl group.

The terminal substituent P2 in $R^{23}$ represents an acrylic group. The substituent $R^{24}$ and $R^{25}$ in the substituent P2 each independently represent a hydrogen atom or an alkyl group (e.g., methyl, ethyl, n-propyl, isopropyl, n-butyl, pentyl, hexyl, heptyl, octyl, nonyl, preferably a lower alkyl group such as methyl or ethyl, more preferably methyl). Preferred is a combination where $R^{24}$ is methyl and $R^{25}$ is a hydrogen atom, or where $R^{24}$ and $R^{25}$ are both hydrogen atoms.

The substituent $R^{26}$ represents a hydrogen atom, or a substituted or unsubstituted alkyl group (e.g., methyl, ethyl, n-propyl, isopropyl, n-butyl, pentyl, hexyl, heptyl, octyl, nonyl, 2-chloroethyl, methoxyethoxyethyl, preferably a lower alkyl such as methyl or ethyl, more preferably methyl), and is preferably a hydrogen atom. Accordingly, the substituent P2 is preferably an unsubstituted acryloxy, methacryloxy or crotonyloxy group, generally a functional group having a high polymerization activity.

The alkoxy residue substituted with the terminal substituent P2 represents an alkyleneoxy group (e.g., an alkyleneoxy group such as ethyleneoxy, propyleneoxy, butyleneoxy, pentyleneoxy, hexyleneoxy, heptyleneoxy, or an ether bond-containing substituted alkyleneoxy group such as ethyleneoxyethoxy).

Specific examples of the compound represented by Formula (II) for use in the present invention are mentioned below, by which, however, the present invention should not be restricted thereto.

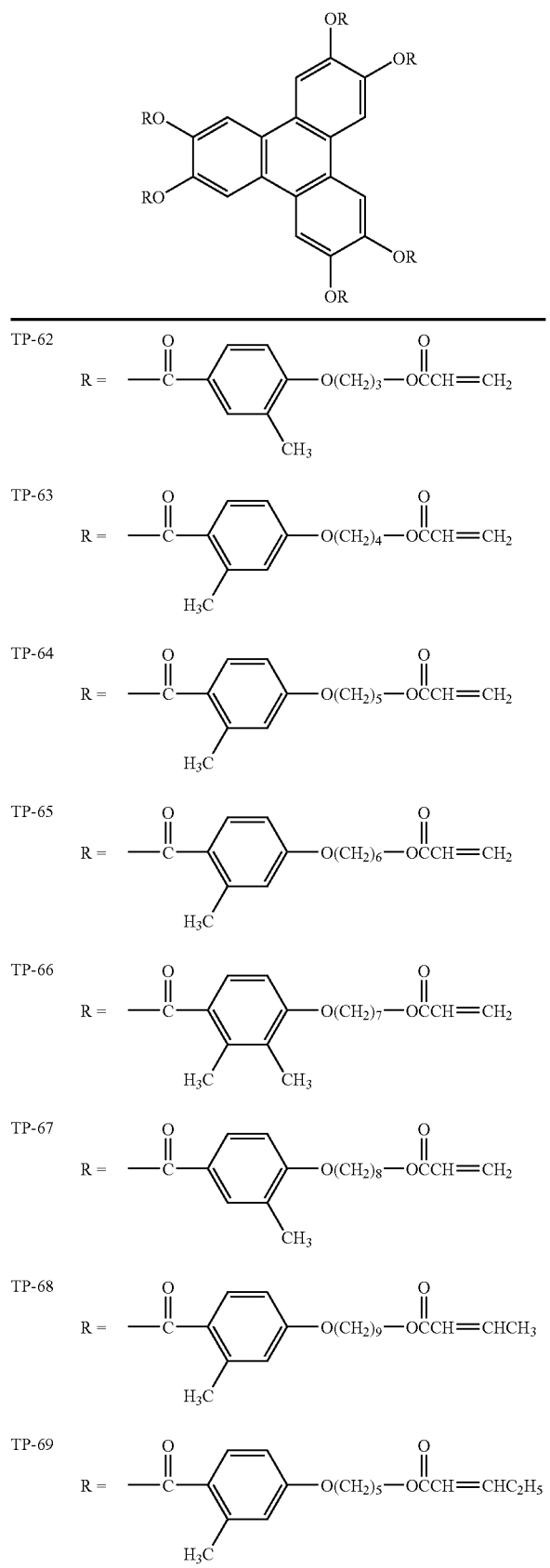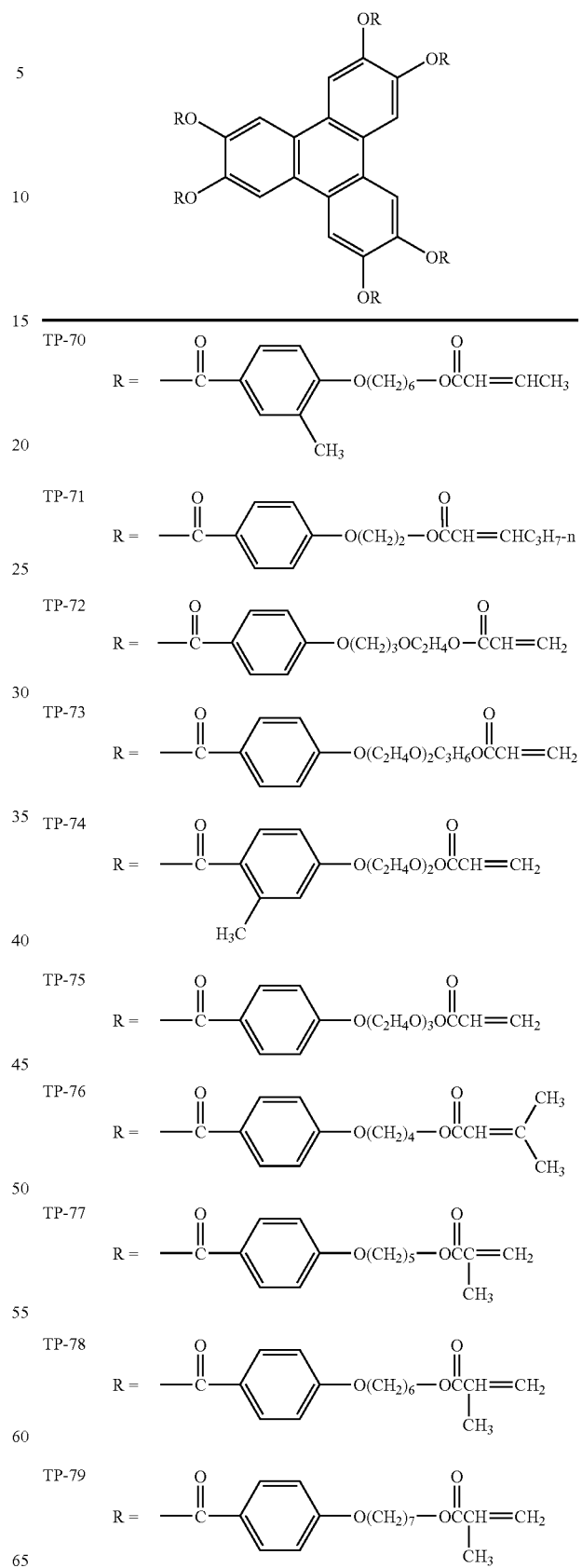

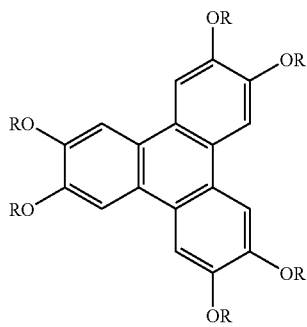

TP-80 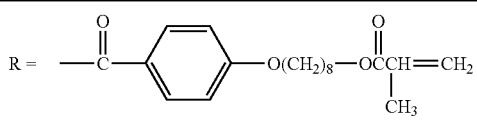

The content of the compound represented by Formula (I) or (II) (polymerizable monomer) in the black photosensitive resin composition of the present invention is preferably from 0.01% by mass to 30% by mass of the total solid content of the composition, more preferably from 0.01% by mass to 20% by mass, even more preferably from 0.01% by mass to 15% by mass. When the content of the polymerizable monomer is 0.01% by mass or more, then the adhesiveness of the composition to substrate increases and a light-shielding color filter having good patternability can be produced. When the content is 50% by mass or more, then the alkali developability of the composition may be poor and the composition could not be patterned.

(Other Photopolymerizable Compound)

The black photosensitive resin composition of the present invention may contain any other photopolymerizable compound than the polymerizable monomer represented by Formula (I) or (II). Containing any other photopolymerizable compound than the polymerizable monomer represented by Formula (I) or (II), the composition may additionally have a photo-patternable polymerization curing function.

As the polymerizable monomer, usable is an addition-polymerizable compound having at least one ethylenic unsaturated bond, and specifically, it may be selected from a group of compounds having at least one preferably at least two terminal ethylenic unsaturated bonds. The group of such compounds is widely known in this technical field, including, for example, compounds having various chemical morphologies of monomers, prepolymers, or that is, dimers, trimers and oligomers, and their mixtures and copolymers.

Examples of the monomers and their copolymers include unsaturated carboxylic acids (e.g., acrylic acid, methacrylic acid, itaconic acid, crotonic acid, isocrotonic acid, maleic acid), and their esters, and amides. Preferred are esters of an aliphatic polyalcohol compound and an unsaturated carboxylic acid; and amides of an aliphatic polyamine compound and an unsaturated carboxylic acid. Also preferred for use herein are addition reaction products of an unsaturated carboxylate or amide having a nucleophilic substituent such as a hydroxyl group, an amino group or a mercapto group and a mono functional or polyfunctional isocyanate or epoxy compound; and dehydrating condensation products thereof with a monofunctional or polyfunctional carboxylic acid. Also preferred are addition reaction products of an unsaturated carboxylate or amide having an electrophilic substituent such as an isocyanate group or an epoxy group and a monofunctional or polyfunctional alcohol, amine or thiol; and substitution reaction products of an unsaturated carboxylate or amide having a leaving substituent such as a halogen atom or a tosyloxy group and a monofunctional or polyfunctional alcohol, amine or thiol. As still other examples, also usable are compounds similar to the above, in which, however, the unsaturated carboxylic acid is replaced with an unsaturated phosphonic acid, styrene or vinyl ether.

Specific examples of the above-mentioned monomer, "ester of an aliphatic polyalcohol compound and an unsaturated carboxylic acid" are acrylates including ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxy)propyl ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, isocyanuric acid EO-modified triacrylate, or the like.

Methacrylates include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane, or the like.

Itaconates include ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, or the like. Crotonates include ethylene glycol dicrotonate, tetramethylene glycol dicrotonate, pentaerythritol dicrotonate, sorbitol tetradicrotonate, or the like. Isocrotonates include ethylene glycol diisocrotonate, pentaerythritol diisocrotonate, sorbitol tetraisocrotonate, or the like. Maleates include ethylene glycol dimaleate, triethylene glycol dimaleate, pentaerythritol dimaleate, sorbitol tetramaleate, or the like.

Further, as examples of other esters, preferred are aliphatic alcohol esters as in JP-B-51-47334 (the term "JP-B" as used herein means an "examined Japanese patent publication"), JP-A-57-196231, and those having an aromatic skeleton as in JP-A-59-5240, JP-A-59-5241, JP-A-2-226149; those having an amino group as in JP-A-1-165613, or the like. The ester monomers may be used as their mixtures.

Specific examples of the above-mentioned monomer, "amide of an aliphatic polyamine compound and an unsaturated carboxylic acid" include methylenebis-acrylamide, methylenebis-methacrylamide, 1,6-hexamethylenebis-acrylamide, 1,6-hexamethylenebis-methacrylamide, diethylenetriamine-trisacrylamide, xylylenebisacrylamide, xylylenebismethacrylamide, or the like. Examples of other preferred amide monomers are those having a cyclohexylene structure as in JP-B-54-21726.

Also preferred are urethane-type addition-polymerizable compounds to be produced through addition reaction of an isocyanate and a hydroxyl group. Their specific examples include vinylurethane compounds having at least two polymerizing vinyl groups in one molecule, as prepared through addition of a hydroxyl group-having vinyl monomer represented by the following Formula (A) to a polyisocyanate compound having at least two isocyanate groups in one molecule, as in JP-B-48-41708.

$$CH_2=C(R^4)COOCH_2CH(R^5)OH \quad (A)$$

[In Formula (A), $R^4$ and $R^5$ each independently represent a hydrogen atom or $CH_3$.]

Also preferred are urethane acrylates as in JP-A-51-37193, JP-B-2-32293, JP-B-2-16765; ethyleneoxide skeleton-having urethane compounds as in JP-B-58-49860, JP-B-56-17654, JP-B-62-39417, JP-B-62-39418. Further, addition-polymerizable compounds having an amino structure or a sulfide structure in the molecule, as in JP-A-63-277653, JP-A-63-260909, JP-A-1-105238 may give a black photosensitive resin composition having a rapid photosensitization speed.

As other examples, there are further mentioned polyfunctional acrylates and methacrylates, for example, polyester acrylates, and epoxyacrylates prepared through reaction of an epoxy resin and (meth)acrylic acid, as in JP-A-48-64183, JP-B-49-43191, JP-B-52-30490. Also mentioned are specific unsaturated compounds as in JP-B-46-43946, JP-B-1-40337, JP-B-1-40336; and vinylphosphonic acid compounds as in JP-A-2-25493. Also preferred are perfluoroalkyl group-having structures as in JP-A-61-22048. In addition, also usable are those introduced as photocurable monomers and oligomers in the Journal of the Adhesive Association of Japan, Vol. 20, No. 7, pp. 300-308 (1984).

The structure of the photopolymerizable compound to constitute the black photosensitive resin composition of the present invention, and the details relating to the single use or combined use of the compounds, the amount thereof and the method of using the compound may be determined in any desired manner, in accordance with the final performance planning of the black photosensitive resin composition. For example, the parameters may be selected from the following viewpoints.

Regarding the sensitivity, preferred is a structure having a larger unsaturated group content per one molecule; and more preferred is a difunctional or more polyfunctional structure. For increasing the strength of the cured film, preferred is a trifunctional or more polyfunctional structure. Combined use of compounds having a different functional number and having a different polymerizing group (e.g., acrylate, methacrylate, styrene compound, vinyl ether compound) may be effective for controlling both the sensitivity and the film strength.

Regarding the compatibility and the dispersibility with the other ingredients (e.g., photopolymerization initiator, black colorant (pigment, dye), binder polymer, or the like.) to be in the black photosensitive resin composition, the selection and use of the photopolymerizable compound is important; and for example, use of a low-purity compound and combined use of at least two different compounds may enhance the compatibility thereof. In addition, for the purpose of enhancing the adhesiveness of the film to a hard surface such as a support, a specific structure may be selected.

The content of the photopolymerizable compound in the black photosensitive resin composition is preferably from 5 to 20% by mass of the total solid content of the composition. In particular, the content of the difunctional or more polyfunctional (meth)acrylate monomer is preferably from 5 to 20% by mass of the total solid content of the composition.

When the content of the photopolymerizable compound is 5% by mass or more, then the composition may keep good photocurability and good patternability and may form a film having good film strength; and when it is 20% by mass or more, the surface curability of the composition may be too strong and the pattern resolution thereof may worsen.

For the above-mentioned reasons, the content of the photopolymerizable compound is more preferably from 5 to 15% by mass, even more preferably from 7.5 to 12.5% by mass.

(Alkali-Soluble Resin)

The black photosensitive resin composition of the present invention contains an alkali-soluble resin described below. The main ingredient of the alkali-soluble resin is a polymer containing monomers having a hydroxyl group and/or a carboxylic acid group, and has a weight-average molecular weight (in terms of polystyrene, as measured through GPC) of from 5000 to $1 \times 10^5$. As a result of assiduous studies, the present inventors have found that, when the resin composition comprises such an alkali-soluble resin as combined with the above-mentioned polymerizable monomer represented by Formula (I) or (II) therein, then it may form a black matrix excellent in good light-shieldability, stability and adhesiveness to substrate.

The morphology of the alkali-soluble resin for use in the present invention is described in detail hereinafter. The monomer having an alcoholic hydroxyl group in the present invention includes 2-hydroxyethyl (meth)acrylate, 2-hydroxypropyl (meth)acrylate, 2-hydroxybutyl (meth)acrylate, 4-hydroxybutyl (meth)acrylate, 2-hydroxyethyl (meth)acrylate/ε-caprolactone adduct, polyethylene glycol mono(meth)acrylate, polypropylene glycol mono(meth)acrylate, 2-hydroxyethyl (meth)acrylate dibasic acid anhydride/ethyleneoxide adduct, (meth)acrylic acid/phenyl glycidyl ether adduct, glycidyl (meth)acrylate/monocarboxylic acid adduct, allyl alcohol, allyloxy-ethanol, or the like. Preferably, the monomer is used in an amount of from 5 to 50% by weight of the copolymer. When the amount is less than 5% by weight, then the sensitivity of the composition may lower; and when it is more than 50% by weight, then the composition may lose the balance of swellability and developability.

The carboxylic acid group-having monomer for use in the present invention includes acrylic acid, methacrylic acid, crotonic acid, vinylbenzoic acid or (meth)acrylic acid/caprolactone adduct, adduct of hydroxyalkyl (meth)acrylate with acid anhydride such as phthalic anhydride. Preferably, the monomer is used in an amount of from 5 to 50% by weight of the copolymer. When the amount is less than 5% by weight, then the sensitivity of the composition may lower; and when it is more than 50% by weight, then the composition may lose the balance of developability.

The content of the monomer having an alcoholic hydroxyl group is preferably 1 to 50% by weight, more preferably 2.5 to 40% by weight, and particularly preferably 5.0 to 30% by weight, with respect to total raw monomers of the alkali-soluble resin in terms of developability.

The content of the monomer having a carboxylic acid group is preferably 1 to 50% by weight, more preferably 2.5 to 40% by weight, and particularly preferably 5.0 to 30% by weight, with respect to total raw monomers of the alkali-soluble resin in terms of developability similarly.

In the alkali-soluble resin for use in the present invention, the monomer copolymerizable with the alcoholic hydroxyl group-having monomer and/or the carboxylic acid group-having monomer includes aliphatic (meth)acrylates such as methyl (meth)acrylate, ethyl (meth)acrylate, butyl (meth)acrylate, cyclohexyl (meth)acrylate; aromatic (meth)acrylates such as phenyl (meth)acrylate, phenoxyethyl (meth)acrylate, benzyl (meth)acrylate; functional (meth)acrylates such as methoxyethyl (meth)acrylate; styrene and styrene derivatives; N-substituted maleimides such as phenylmaleimide, cyclohexylmaleimide, or the like. One or more such monomers may be used.

The molecular weight of the alkali-soluble resin prepared in the manner as above is preferably from 3000 to 150000, more preferably from 5000 to 100000. When the molecular weight is 3000 or less, then the sensitivity of the composition may be poor; and when the molecular weight is 150000 or more, then the developability of the composition may be low.
(Other Alkali-Soluble Resin)

The black photosensitive resin composition of the present invention may contain any other alkali-soluble resin (hereafter sometimes referred to as "other alkali-soluble resin") than the above-mentioned alkali-soluble resin of which the main ingredient is a polymer containing monomers having a hydroxyl group and/or a carboxylic acid group and having a weight-average molecular weight (in terms of polystyrene, as measured through GPC) of from 5000 to $1 \times 10^5$.

Other alkali-soluble resin is not particularly limited as long as the resin is soluble in alkali, but is preferably selected from the viewpoint of heat resistance, developability and availability.

Preferably, other alkali-soluble resin is a linear organic polymer and is soluble in an organic solvent and developable with an aqueous solution of weak alkali. The linear organic polymer of the type includes polymers having a carboxylic acid in the side branches, for example, methacrylic acid copolymers, acrylic acid copolymers, itaconic acid copolymers, crotonic acid copolymers, maleic acid copolymers, partially esterified maleic acid copolymers and the like as in JP-A-59-44615, JP-B-54-34327, JP-B-58-12577, JP-B-54-25957, JP-A-59-53836, JP-A-59-71048; and acidic cellulose derivatives having a carboxylic acid in the side branches are also usable.

The linear organic polymers may be those copolymerized with a hydrophilic monomer. Examples of the monomer include alkoxyalkyl(meth)acrylate, hydroxyalkyl (meth) acrylate, glycerol(meth)acrylate, (meth)acrylamide, N-methylolacrylamide, secondary or tertiary alkylacrylamide, dialkylaminoalkyl(meth)acrylate, morpholine (meth)acrylate, N-vinylpyrrolidone, N-vinylcaprolactam, vinylimidazole, vinyltriazole, methyl(meth)acrylate, ethyl(meth)acrylate, branched or linear propyl(meth)acrylate, branched or linear butyl(meth)acrylate, or phenoxyhydroxypropyl(meth) acrylate, or the like.

Other hydrophilic monomers usable herein are those having a tetrahydrofurfuryl group, a phosphoric acid group, a phosphate group, a quaternary ammonium base group, an ethyleneoxy chain, a propyleneoxy chain, a group derived from sulfonic acid or its derivative, a morpholinoethyl group, or the like.

For enhancing the crosslinking efficiency thereof, the alkali-soluble resin and other alkali-soluble resin may have a polymerizing group in the side branches; and for example, polymers having an allyl group, a (meth)acrylic group, an allyloxyalkyl group or the like in the side chains are also useful herein.

Examples of the polymerizing group-having polymer are commercial products, such as KS Resist-106 (manufactured by Osaka Organic Chemical Industry), Cyclomer P series (manufactured by Daicel Chemical industry), or the like. For enhancing the strength of the cured film, also useful are alcohol-soluble nylons and polyethers of 2,2-bis-(4-hydroxyphenyl)-propane/epichlorohydrin.

Of those various alkali-soluble resins and other alkali-soluble resins, preferred are polyhydroxystyrene resins, polysiloxane resins, acrylic resins, acrylamide resins, acryl/acrylamide copolymer resins, from the viewpoint of heat resistance; and from the viewpoint of developability control, preferred are acrylic resins, acrylamide resins, acryl/acrylamide copolymer resins.

As the acrylic resins, for example, preferred are copolymers to be produced through polymerization of monomers selected from benzyl(meth)acrylate, (meth)acrylic acid, hydroxyethyl(meth)acrylate, (met)acrylamide and the like; and commercial products, such as KS Resist-106 (manufactured by Osaka Organic Chemical Industry), Cyclomer P series (manufactured by Daicel Chemical industry), or the like.

As the alkali-soluble resin and other alkali-soluble resin, preferred are polymers having a weight-average molecular weight (in terms of polystyrene, as measured through GPC) of from 1000 to $2 \times 10^5$, from the viewpoint of developability and liquid viscosity, more preferably from 2000 to $1 \times 10^5$, even more preferably from 5000 to $5 \times 10^4$.

The content of the alkali-soluble resin and other alkali-soluble resin in the photosensitive resin composition is preferably from 10 to 90% by mass of the total solid content of the composition, from the viewpoint of developability, more preferably from 20 to 80% by mass, even more preferably from 30 to 70% by mass.
(Photopolymerization Initiator)

The black photosensitive resin composition of the present invention contains at least one photopolymerization initiator. The initiator acts on the photopolymerizable compound in the composition, and the composition may be patterned through irradiation with light.

The photopolymerization initiator is not particularly limited as long as the initiator is capable of initiating the polymerization of the photopolymerizable compound, but is preferably selected from the viewpoint of the characteristics, the initiation efficiency, the absorption wavelength, the availability and the cost. The photopolymerization initiator may be, for example, at least one active halogen compound selected from halomethyloxadiazole compounds and halomethyl-s-triazine compounds; and the initiator further includes 3-aryl-substituted coumarin compounds, rofin dimers, benzophenone compounds, acetophenone compounds and their derivatives, cyclopentadiene-benzene-iron complex and its salts, oxime compounds, or the like.

The active halogen compound, halomethyloxadiazole compound includes 2-halomethyl-5-vinyl-1,3,4-oxadiazole compounds as in JP-B-57-6096; and 2-trichloromethyl-5-styryl-1,3,4-oxadiazole, 2-trichloromethyl-5-(p-cyanostyryl)-1,3,4-oxadiazole, 2-trichloromethyl-5-(p-methoxystyryl)-1,3,4-oxadiazole, or the like.

The active halogen compound, halomethyl-s-triazine compound includes vinyl-halomethyl-s-triazine compounds as in JP-B-59-1281; 2-(naphth-1-yl)-4,6-bis-halomethyl-s-triazine compounds and 4-(p-aminophenyl)-2,6-di-halomethyl-s-triazine compounds as in JP-A-53-133428, or the like.

Specifically they include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphth-1-yl)-4,6-bis-trichloromethyl-s-triazine, 2-(4-methoxy-naphth-1-yl)-4,6-bis-trichloromethyl-s-triazine, 2-(4-ethoxy-naphth-1-yl)-4,6-bis-trichloromethyl-s-triazine, 2-(4-butoxy-naphth-1-yl)-4,6-bis-trichloromethyl-s-triazine, 2-[4-(2-methoxyethyl)-naphth-1-yl]-4,6-bis-trichloromethyl-s-triazine, 2-[4-(2-ethoxyethyl)-naphth-1-yl]-4,6-bis-trichloromethyl-s- triazine, 2-[4-(2-butoxyethyl)-naphth-1-yl]-4,6-bis-trichloromethyl-s-triazine, 2-(2-methoxy-naphth-1-yl)-4,6-bis-trichloromethyl-s-triazine, 2-(6-methoxy-5-methyl-naphth-2-yl)-4,6-bis-trichloromethyl-s-triazine, 2-(6-methoxy-naphth-2-yl)-4,6-bis-trichloromethyl-s-triazine, 2-(5-methoxy-naphth-1-yl)-4,6-bis-trichloromethyl-s-triazine, 2-(4,7-dimethoxy-naphth-1-yl)-4,6-bis-trichloromethyl-s-triazine, 2-(6-ethoxy-naphth-2-yl)-4,6-bis-trichloromethyl-s-triazine, 2-(4,5-dimethoxy-naphth-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl)aminophenyl]-2,6-di(trichloromethyl)-s-triazine, 4-[o-methyl-p-N,N-di(chloroethyl)aminophenyl]-2,6-di(trichloromethyl)-s-triazine, 4-(p-N-chloroethylaminophenyl)-2,6-di(trichloromethyl)-s-triazine, 4-(p-N-ethoxycarbonylmethylaminophenyl)-2,6-di(trichloromethyl)-s-triazine, 4-[p-N,N-di(phenyl))aminophenyl]-2,6-di(trichloromethyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di(trichloromethyl)-s-triazine, 4-[m-N,N-di(ethoxycarbonylmethyl)aminophenyl]-2,6-di(trichloromethyl)-s-triazine, 4-[m-bromo-p-N,N-di(ethoxycarbonylmethyl)aminophenyl]-2,6-di(trichloromethyl)-s-triazine, 4-[m-chloro-p-N,N-di(ethoxycarbonylmethyl)aminophenyl]-2,6-di(trichloromethyl)-s-triazine, 4-[m-fluoro-p-N,N-di(ethoxycarbonylmethyl)aminophenyl]-2,6-di(trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di(ethoxycarbonylmethyl)aminophenyl]-2,6-di(trichloromethyl)-s-triazine, 4-[o-bromo-p-N,N-di(chloroethyl)aminophenyl]-2,6-di(trichloromethyl)-s-triazine, 4-[o-chloro-p-N,N-di(chloroethyl)aminophenyl]-2,6-di(trichloromethyl)-s-triazine, 4-[o-fluoro-p-N,N-di(chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di(chloroethyl)aminophenyl]-2,6-di(trichloromethyl)-s-triazine, 4-[m-fluoro-p-N,N-di(chloroethyl)aminophenyl]-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine, 4-(o-fluoro-p-N-chloroethylaminophenyl)-2,6-di(trichloromethyl)-s-triazine, or the like.

In addition, also usable are Midori Chemical's TAZ series (e.g., TAZ-107, TAZ-110, TAZ-104, TAZ-109, TAZ-140, TAZ-204, TAZ-113, TAZ-123), Panchim's T series (e.g., T-OMS, T-BMP, T-R, T-B), Ciba Specialty Chemicals' Irgacure series (e.g., Irgacure 651, Irgacure 184, Irgacure 500, Irgacure 1000, Irgacure 149, Irgacure 819, Irgacure 261), Darocure series (e.g., Darocure 1173), 4,4'-bis(diethylamino)-benzophenone, 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone, 2-benzyl-2-dimethylamino-4-morpholinobutyrophenone, 2,2-dimethoxy-2-phenylacetophenone, and 2-(o-chlorophenyl)-4,5-diphenylimidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2-(p-dimethoxyphenyl)-4,5-diphenylimidazolyl dimer, 2-(2,4-dimethoxyphenyl)-4,5-diphenylimidazolyl dimer, 2-(p-methylmercaptophenyl)-4,5-diphenylimidazolyl dimer, benzoin isopropyl ether, or the like.

Of those photopolymerization initiators, preferred are oxime-type photopolymerization initiators as capable of forming a pattern having a good rectangular cross-sectional profile at a lower level of exposure to light. The oxime-type photopolymerization initiator may be selected from any known oxime-type initiators such as those in JP-A-2000-80068, JP-A-2001-233842.

Specific examples of the oxime-type photopolymerization initiator are commercial products, such as 2-(O-benzoyloxime)-1-[4-(phenylthio)phenyl]-1,2-octanedione, 1-(O-acetyloxime)-1-[9-ethyl-6-(2-methylbenzoyl)-9H-carbazol-3-yl]ethanone (both manufactured by Ciba Specialty Chemicals). Of those, preferred is 1-(O-acetyloxime)-1-[9-ethyl-6-(2-methylbenzoyl)-9H-carbazol-3-yl]ethanone for the same reasons as above.

In addition to the above, compounds represented by the following Formula (1) are also preferred for the polymerization initiator as capable of forming a pattern having a good rectangular cross-sectional profile at a lower level of exposure to light.

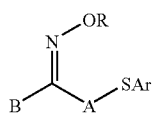

(1)

In Formula (1), R and B each independently represent a monovalent substituent; A represents a divalent organic group; and Ar represents an aryl group.

The monovalent substituent for R is preferably a monovalent non-metallic atomic group mentioned below. The monovalent non-metallic atomic group for R includes an alkyl group optionally having a substituent, an aryl group optionally having a substituent, an alkenyl group optionally having a substituent, an alkynyl group optionally having a substituent, an alkylsulfinyl group optionally having a substituent, an arylsulfinyl group optionally having a substituent, an alkylsulfonyl group optionally having a substituent, an arylsulfonyl group optionally having a substituent, an acyl group optionally having a substituent, an alkoxycarbonyl group optionally having a substituent, an aryloxycarbonyl group optionally having a substituent, a phosphinoyl group optionally having a substituent, a heterocyclic group optionally having a substituent, an alkylthiocarbonyl group optionally having a substituent, an arylthiocarbonyl group optionally having a substituent, a dialkylaminocarbonyl group optionally having a substituent, a dialkylaminothiocarbonyl group optionally having a substituent, or the like.

The alkyl group optionally having a substituent is preferably an alkyl group having from 1 to 30 carbon atoms, including, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a t-butyl group, a 1-ethylpentyl group, a cyclopentyl group, a cyclohexyl group, a trifluoromehtyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, a 3-nitrophenacyl group, or the like.

The aryl group optionally having a substituent is preferably an aryl group having from 6 to 30 carbon atoms, including, for example, a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, a o-, m- or p-tolyl group, a xylyl group, a o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranethenyl group, an acenaphthylenyl group, an aceanthrenyl group, a phenalenyl group, a fluorenyl group, an anthryl group, a bianthracenyl group, a teranthracenyl group, a quateranthracenyl group, an anthraqinolyl group, a phenanthryl group, a triphenylenyl group, a pyrenyl group, a chrysenyl group, a naphthacenyl group, a preiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, or the like.

The alkenyl group optionally having a substituent is preferably an alkenyl group having from 2 to 10 carbon atoms, including, for example, a vinyl group, an allyl group, a styryl group, or the like.

The alkynyl group optionally having a substituent is preferably an alkynyl group having from 2 to 10 carbon atoms, including, for example, an ethynyl group, a propynyl group, a propargyl group, or the like.

The alkylsulfinyl group optionally having a substituent is preferably an alkylsulfinyl group having from 1 to 20 carbon atoms, including, for example, a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, a methoxymethylsulfinyl group, or the like.

The arylsulfinyl group optionally having a substituent is preferably an arylsulfinyl group having from 6 to 30 carbon atoms, including, for example, a phenylsulfinyl group, a 1-naphthylsulfinyl group, a 2-naphthylsulfinyl group, a 2-chlorophenylsulfinyl group, a 2-methylphenylsulfinyl group, a 2-methylphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methylphenylsulfinyl group, a 4-methylsulfanylphenylsulfinyl group, a 4-phenylsulfanylphenylsulfinyl group, a 4-dimethylaminophenylsulfinyl group, or the like.

The alkylsulfonyl group optionally having a substituent is preferably an alkylsulfonyl group having from 1 to 20 carbon atoms, including, for example, a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, a perfluoroalkylsulfonyl group, or the like.

The arylsulfonyl group optionally having a substituent is preferably an arylsulfonyl group having from 6 to 30 carbon atoms, including, for example, a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, a 4-dimethylaminophenylsulfonyl group, or the like.

The acyl group optionally having a substituent is preferably an acyl group having from 2 to 20 carbon atoms, including, for example, an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, a 4-methoxybenzoyl group, or the like.

The alkoxycarbonyl group optionally having a substituent is preferably an alkoxycarbonyl group having from 2 to 20 carbon atoms, including, for example, a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a trifluoromethyloxycarbonyl group, or the like.

The aryloxycarbonyl group optionally having a substituent includes, for example, a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, a 4-methoxyphenyloxycarbonyl group, or the like.

The phosphinoyl group optionally having a substituent is preferably a phosphinoyl group having from 2 to 50 carbon atoms in total, including, for example, a dimethylphosphinoyl group, a diethylphosphinoyl group, a dipropylphosphinoyl group, a diphenylphosphnoyl group, a dimethoxyphosphinoyl group, a diethoxyphosphinoyl group, a dibenzoylphosphinoyl group, a bis(2,4,6-trimethylphenyl)phosphinoyl group, or the like.

The heterocyclic group optionally having a substituent is preferably an aromatic or aliphatic hetero ring containing any of a nitrogen atom, an oxygen atom, a sulfur atom and a phosphorus atom. For example, it includes a thienyl group, a benzo[b]thienyl group, a naphtho[2,3-b]thienyl group, a thianthrenyl group, a furyl group, a pyranyl group, a isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolidinyl group, an isoindolyl group, a 3H-indolyl group, a indolyl group, a 1H-indazolyl group, a purinyl group, a 4H-quinolidinyl group, an isoquinolyl group, a quinolyl group, a phthalazinyl group, a naphthyridinyl group, a quinoxalinyl group, an quinazolinyl group, a cinnolinyl group, a puteridinyl group, a 4aH-carbazolyl group, a carbazolyl group, a β-carborynyl group, a phenanthrydinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolyl group, an isoindolinyl group, a quinucridinyl group, a morpholinyl group, a thioxanthryl group, or the like.

The alkylthiocarbonyl group optionally having a substituent includes, for example, a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, a trifluoromethylthiocarbonyl group, or the like.

The arylthiocarbonyl group optionally having a substituent includes, for example, a 1-naphthylthiocarbonyl group, a 2-naphthylthiocarbonyl group, a 4-methylsulfanylphenylthiocarbonyl group, a 4-phenylsulafnylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-flyuorophenylthiocarbonyl group, a 4-cyanophenylthiocarbonyl group, a 4-methoxyphenylthiocarbonyl group, or the like.

The dialkylaminocarbonyl group optionally having a substituent includes, for example, a dimethylaminocarbonyl group, a diethylaminocarbonyl group, a dipropylaminocarbonyl group, a dibutylaminocarbonyl group, or the like.

The dialkylaminothiocarbonyl group optionally having a substituent includes, for example, a dimethylaminothiocarbonyl group, a dipropylaminothiocarbonyl group, a dibutylaminothiocarbonyl group, or the like.

Above all, R is more preferably an acyl group from the viewpoint of increasing the sensitivity, specifically, an acetyl group, an ethyloyl group, a propioyl group, a benzoyl group, a toluyl group.

The monovalent substituent for B includes an aryl group optionally having a substituent, a heterocyclic group optionally having a substituent, an arylcarbonyl group optionally having a substituent, or a heterocyclic carbonyl group optionally having a substituent. Especially preferably, the substituent has a structure mentioned below.

In the following structure, Y, X and n have the same meanings as those of Y, X and n in Formula (2) to be mentioned below, and their preferred examples are the same as those of the latter.

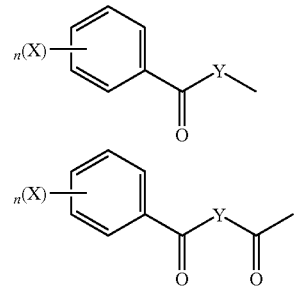

The divalent organic group for A includes an alkylene group having from 1 to 12 carbon atoms and optionally having a substituent, a cyclohexylene group optionally having a substituent, and an alkynylene group optionally having a substituent.

The substituent capable of being introduced into these groups includes, for example, a halogen atom such as a fluorine atom, a chlorine atom, a bromine atom, an iodine atom; an alkoxy group such as a methoxy group, an ethoxy group, a tert-butoxy group; an aryloxy group such as a phenoxy group, a p-tolyloxy group; an alkoxycarbonyl group such as a methoxycarbonyl group, a butoxycarbonyl group, a phenoxycarbonyl group; an acyloxy group such as an acetoxy group, a propionyloxy group, a benzoyloxy group; an acyl group such as an acetyl group, a benzoyl group, a isobutyryl group, an acryloyl group, a methacryloyl group, a methoxalyl group; an alkylsulfanyl group such as a methylsulfanyl group, a tert-butylsulfanyl group; an arylsulfanyl group such as a phenylsulfanyl group, a p-tolylsulfanyl group; an alkylamino group such as a methylamino group, a cyclohexylamino group; a dialkylamino group such as a dimethylamino group, a diethylamino group, a morpholino group, a piperidino group; an arylamino group such as a phenylamino group, a p-tolylamino group; an alkyl group such as a methyl group, an ethyl group, a tert-butyl group, a dodecyl group; an aryl group such as a phenyl group, a p-tolyl group, a xylyl group, a cumenyl group, a naphthyl group, an anthryl group, a phenanthryl group; and further, a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, a triphenylphenancylphosphoniumyl group, or the like.

Above all, A is preferably an unsubstituted alkylene group, an alkylene group substituted with an alkyl group (e.g., methyl group, ethyl group, tert-butyl group, dodecyl group), an alkylene group substituted with an alkenyl group (e.g., vinyl group, allyl group), or an alkylene group substituted with an aryl group (e.g., phenyl group, p-tolyl group, xylyl group, cumenyl group, naphthyl group, anthryl group, phenanthryl group, styryl group), from the viewpoint of increasing the sensitivity of the composition and retarding the coloration thereof under heat with time.

The aryl group for Ar is preferably an aryl group having from 6 to 30 carbon atoms, and this may have a substituent.

Specifically, this includes a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, a o-, m- or p-tolyl group, a xylyl group, a o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranethenyl group, an acenaphthylenyl group, an aceanthrenyl group, a phenalenyl group, a fluorenyl group, an anthryl group, a bianthracenyl group, a teranthracenyl group, a quateranthracenyl group, an anthraqinolyl group, a phenanthryl group, a triphenylenyl group, a pyrenyl group, a chrysenyl group, a naphthacenyl group, a preiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, or the like. Above all, preferred is a substituted or unsubstituted phenyl group from the viewpoint of increasing the sensitivity of the composition and retarding the coloration thereof under heat with time.

The substituent, which the phenyl group optionally has, for example, a halogen atom such as a fluorine atom, a chlorine atom, a bromine atom, an iodine atom; an alkoxy group such as a methoxy group, an ethoxy group, a tert-butoxy group; an aryloxy group such as a phenoxy group, a p-tolyloxy group; an alkylthioxy group such as a methylthioxy group, an ethylthioxy group, a tert-butylthioxy group; an arylthioxy group such as a phenylthioxy group, a p-tolylthioxy group; an alkoxycarbonyl group such as a methoxycarbonyl group, a butoxycarbonyl group, a phenoxycarbonyl group; an acyloxy group such as an acetoxy group, a propionyloxy group, a benzoyloxy group; an acyl group such as an acetyl group, a benzoyl group, a isobutyryl group, an acryloyl group, a methacryloyl group, a methoxalyl group; an alkylsulfanyl group such as a methylsulfanyl group, a tert-butylsulfanyl group; an arylsulfanyl group such as a phenylsulfanyl group, a p-tolylsulfanyl group; an alkylamino group such as a methylamino group, a cyclohexylamino group; a dialkylamino group such as a dimethylamino group, a diethylamino group, a morpholino group, a piperidino group; an arylamino group such as a phenylamino group, a p-tolylamino group; an alkyl group such as an ethyl group, a tert-butyl group, a dodecyl group; a hydroxyl group, a carboxyl group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, a triphenylphenancylphosphoniumyl group, or the like.

In Formula (1), the structure of "SAr" to be formed by Ar and S adjacent thereto is preferably the following from the viewpoint of the sensitivity of the composition.

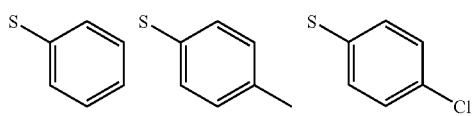

-continued

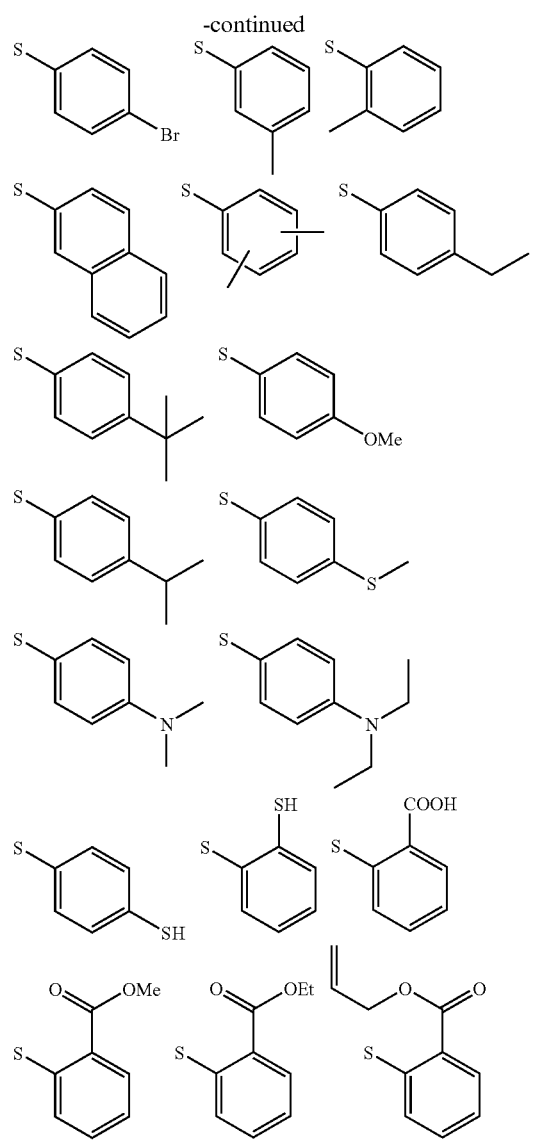

The oxime compounds represented by Formula (1) are preferably compounds represented by the following Formula (2):

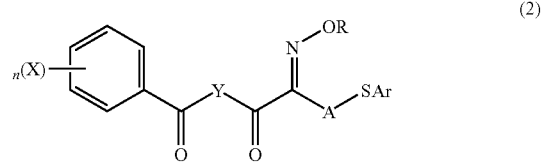

In Formula (2), R and X each independently represent a monovalent substituent; A and Y each independently represent a divalent organic group; Ar represents an aryl group; and n indicates an integer of from 0 to 5.

R, A and Ar in Formula (2) have the same meanings as those of R, A and Ar in Formula (1), and their preferred examples are also the same as those of the latter.

The monovalent substituent for X includes an alkyl group optionally having a substituent, an aryl group optionally having a substituent, an alkenyl group optionally having a substituent, an alkynyl group optionally having a substituent, an alkoxy group optionally having a substituent, an aryloxy group optionally having a substituent, an alkylthioxy group optionally having a substituent, an arylthioxy group optionally having a substituent, an acyloxy group optionally having a substituent, an alkylsulfanyl group optionally having a substituent, an arylsulfanyl group optionally having a substituent, an alkylsulfinyl group optionally having a substituent, an arylsulfinyl group optionally having a substituent, an alkylsulfonyl group optionally having a substituent, an arylsulfonyl group optionally having a substituent, an alkoxycarbonyl group optionally having a substituent, an aryloxycarbonyl group optionally having a substituent, a carbamoyl group optionally having a substituent, a sulfamoyl group optionally having a substituent, an amino group optionally having a substituent, a phosphinoyl group optionally having a substituent, a heterocyclic group optionally having a substituent, a halogen atom, or the like.

The alkyl group optionally having a substituent is preferably an alkyl group having from 1 to 30 carbon atoms, including, for example, a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromehtyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, a 3-nitrophenacyl group, or the like.

The aryl group optionally having a substituent is preferably an aryl group having from 6 to 30 carbon atoms, including, for example, a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, a o-, m- or p-tolyl group, a xylyl group, a o-, m- or p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranethenyl group, an acenaphthylenyl group, an aceanthrenyl group, a phenalenyl group, a fluorenyl group, an anthryl group, a bianthracenyl group, a teranthracenyl group, a quateranthracenyl group, an anthraqinolyl group, a phenanthryl group, a triphenylenyl group, a pyrenyl group, a chrysenyl group, a naphthacenyl group, a preiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, an ovalenyl group, or the like.

The alkenyl group optionally having a substituent is preferably an alkenyl group having from 2 to 10 carbon atoms, including, for example, a vinyl group, an allyl group, a styryl group, or the like.

The alkynyl group optionally having a substituent is preferably an alkynyl group having from 2 to 10 carbon atoms, including, for example, an ethynyl group, a propynyl group, a propargyl group, or the like.

The alkoxy group optionally having a substituent is preferably an alkoxy group having from 1 to 30 carbon atoms, including, for example, a methoxy group, an ethoxy group, a propyloxy group, an isopropyloxy group, a butoxy group, an isobutoxy group, a sec-butoxy group, a tert-butoxy group, a pentyloxy group, an isopentyloxy group, a hexyloxy group, a heptyloxy group, an octyloxy group, a 2-ethylhexyloxy group, a decyloxy group, a dodecyloxy group, an octadecyloxy group, an ethoxycarbonylmethyl group, a 2-ethylhexyloxycarbonylmethyloxy group, an aminocarbonylmethyloxy group, an N,N-dibutylaminocarbonylmethyloxy group, an N-methylaminocarbonylmethyloxy group, an N-ethylaminocarbonylmethyloxy group, an N-octylaminocarbonylmethyloxy group, an N-methyl-N-benzylaminocarbonylmethyloxy group, a benzyloxy group, a cyanomethyloxy group, or the like.

The aryloxy group optionally having a substituent is preferably an aryloxy group having from 6 to 30 carbon atoms, including, for example, a phenyloxy group, a 1-naphthyloxy group, a 2-naphthyloxy group, a 2-chlorophenyloxy group, a 2-methylphenyloxy group, a 2-methoxyphenyloxy group, a 2-butoxyphenyloxy group, a 3-chlorophenyloxy group, a 3-trifluoromethylphenyloxy group, a 3-cyanophenyloxy group, a 3-nitrophenyloxy group, a 4-fluorophenyloxy group, a 4-cyanophenyloxy group, a 4-methoxyphenyloxy group, a 4-dimethylaminophenyloxy group, a 4-methylsulfanylphenyloxy group, a 4-phenylsulfanylphenyloxy group, or the like.

The alkylthioxy group optionally having a substituent is preferably an alkylthioxy group having from 1 to 30 carbon atoms, including, for example, a methylthioxy group, an ethylthioxy group, a propylthioxy group, an isopropylthoxy group, a butylthioxy group, an isobutylthioxy group, a sec-butylthioxy group, a tert-butylthioxy group, a pentylthioxy group, an isopentylthioxy group, a hexylthioxy group, a heptylthioxy group, an octylthioxy group, a 2-ethylhexylthioxy group, a decylthioxy group, a dodecylthioxy group, an octadecylthioxy group, a benzylthioxy group, or the like.

The arylthioxy group optionally having a substituent is preferably an arylthioxy group having from 6 to 30 carbon atoms, including, for example, a phenylthioxy group, a 1-naphthylthioxy group, a 2-naphthylthioxy group, a 2-chlorophenylthioxy group, a 2-methylphenylthioxy group, a 2-methoxyphenylthioxy group, a 2-butoxyphenylthioxy group, a 3-chlorophenylthioxy group, a 3-trifluoromethylphenylthioxy group, a 3-cyanophenylthioxy group, a 3-nitrophenylthioxy group, a 4-fluorophenylthioxy group, a 4-cyanophenylthioxy group, a 4-methoxyphenylthioxy group, a 4-dimethylaminophenylthioxy group, a 4-methylsulfanylphenylthioxy group, a 4-phenylsulfanylphenylthioxy group, or the like.

The acyloxy group optionally having a substituent is preferably an acyloxy group having from 2 to 20 carbon atoms, including, for example, an acetyloxy group, a propanoyloxy group, a butanoyloxy group, a pentanoyloxy group, a trifluoromethylcarbonyloxy group, a benzoyloxy group, a 1-naphthylcarbonyloxy group, a 2-naphthylcarbonyloxy group, or the like.

The alkylsulfanyl group optionally having a substituent is preferably an alkylsulfanyl group having from 1 to 20 carbon atoms, including, for example, a methylsulfanyl group, an ethylsulfanyl group, a propylsulfanyl group, an isopropylsulfanyl group, a butylsulfanyl group, a hexylsulfanyl group, a cyclohexylsulfanyl group, an octylsulfanyl group, a 2-ethylhexylsulfanyl group, a decanoylsulfanyl group, a dodecanoylsulfanyl group, an octadecanoylsulfanyl group, a cyanomethylsulfanyl group, a methoxymethylsulfanyl group, or the like.

The arylsulfanyl group optionally having a substituent is preferably an arylsulfanyl group having from 6 to 30 carbon atoms, including, for example, a phenylsulfanyl group, a 1-naphthylsulfanyl group, a 2-naphthylsulfanyl group, a 2-chlorophenylsulfanyl group, a 2-methylphenylsulfanyl group, a 2-methoxyphenylsulfanyl group, a 2-butoxyphenylsulfanyl group, a 3-chlorophenylsulfanyl group, a 3-trifluoromethylphenylsulfanyl group, a 3-cyanophenylsulfanyl group, a 3-nitrophenylsulfanyl group, a 4-fluorophenylsulfanyl group, a 4-cyanophenylsulfanyl group, a 4-methoxyphenylsulfanyl group, a 4-mehtylsulfanylphenylsulfanyl group, a 4-phenylsulfanylphenylsulfanyl group, a 4-dimethylaminophenylsulfanyl group, or the like.

The alkylsulfinyl group optionally having a substituent is preferably an alkylsulfinyl group having from 1 to 20 carbon atoms, including, for example, a methylsulfinyl group, an ethylsulfinyl group, a propylsulfinyl group, an isopropylsulfinyl group, a butylsulfinyl group, a hexylsulfinyl group, a cyclohexylsulfinyl group, an octylsulfinyl group, a 2-ethylhexylsulfinyl group, a decanoylsulfinyl group, a dodecanoylsulfinyl group, an octadecanoylsulfinyl group, a cyanomethylsulfinyl group, a methoxymethylsulfinyl group, or the like.

The arylsulfinyl group optionally having a substituent is preferably an arylsulfinyl group having from 6 to 30 carbon atoms, including, for example, a phenylsulfinyl group, a 1-naphthylsulfinyl group, a 2-naphthylsulfinyl group, a 2-chlorophenylsulfinyl group, a 2-methylphenylsulfinyl group, a 2-methylphenylsulfinyl group, a 2-butoxyphenylsulfinyl group, a 3-chlorophenylsulfinyl group, a 3-trifluoromethylphenylsulfinyl group, a 3-cyanophenylsulfinyl group, a 3-nitrophenylsulfinyl group, a 4-fluorophenylsulfinyl group, a 4-cyanophenylsulfinyl group, a 4-methylphenylsulfinyl group, a 4-methylsulfanylphenylsulfinyl group, a 4-phenylsulfanylphenylsulfinyl group, a 4-dimethylaminophenylsulfinyl group, or the like.

The alkylsulfonyl group optionally having a substituent is preferably an alkylsulfonyl group having from 1 to 20 carbon atoms, including, for example, a methylsulfonyl group, an ethylsulfonyl group, a propylsulfonyl group, an isopropylsulfonyl group, a butylsulfonyl group, a hexylsulfonyl group, a cyclohexylsulfonyl group, an octylsulfonyl group, a 2-ethylhexylsulfonyl group, a decanoylsulfonyl group, a dodecanoylsulfonyl group, an octadecanoylsulfonyl group, a cyanomethylsulfonyl group, a methoxymethylsulfonyl group, or the like.

The arylsulfonyl group optionally having a substituent is preferably an arylsulfonyl group having from 6 to 30 carbon atoms, including, for example, a phenylsulfonyl group, a 1-naphthylsulfonyl group, a 2-naphthylsulfonyl group, a 2-chlorophenylsulfonyl group, a 2-methylphenylsulfonyl group, a 2-methoxyphenylsulfonyl group, a 2-butoxyphenylsulfonyl group, a 3-chlorophenylsulfonyl group, a 3-trifluoromethylphenylsulfonyl group, a 3-cyanophenylsulfonyl group, a 3-nitrophenylsulfonyl group, a 4-fluorophenylsulfonyl group, a 4-cyanophenylsulfonyl group, a 4-methoxyphenylsulfonyl group, a 4-methylsulfanylphenylsulfonyl group, a 4-phenylsulfanylphenylsulfonyl group, a 4-dimethylaminophenylsulfonyl group, or the like.

The acyl group optionally having a substituent is preferably an acyl group having from 2 to 20 carbon atoms, including, for example, an acetyl group, a propanoyl group, a butanoyl group, a trifluoromethylcarbonyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, a 4-methoxybenzoyl group, or the like.

The alkoxycarbonyl or aryloxycarbonyl group optionally having a substituent is preferably an alkoxycarbonyl group having from 2 to 20 carbon atoms or an aryloxycarbonyl group having from 6 to 20 carbon atoms, including, for example, a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, a phenoxycarbonyl group, a trifluoromethyloxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, a 4-methoxyphenyloxycarbonyl group, or the like.

The carbamoyl group optionally having a substituent is preferably a carbamoyl group having from 1 to 30 carbon atoms in total, including, for example, an N-methylcarbamoyl group, an N-ethylcarbamoyl group, an N-propylcarbamoyl group, an N-butylcarbamoyl group, an N-hexylcarbamoyl group, an N-cyclohexylcarbamoyl group, an N-octylcarbamoyl group, an N-decylcarbamoyl group, an N-octadecylcarbamoyl group, an N-phenylcarbamoyl group, an N-2-methylphenylcarbamoyl group, an N-2-chlorophenylcarbamoyl group, an N-2-isopropoxyphenylcarbamoyl group, an N-2-(2-ethylhexyl)phenylcarbamoyl group, an N-3-chlorophenylcarbamoyl group, an N-3-nitrophenylcarbamoyl group, an N-3-cyanophenylcarbamoyl group, an N-4-methoxyphenylcarbamoyl group, an N-4-cyanophenylcarbamoyl group, an N-4-methylsulfanylphenylcarbamoyl group, an N-4-phenylsulfanylphenylcarbamoyl group, an N-methyl-N-phenylcarbamoyl group, an N,N-dimethylcarbamoyl group, an N,N-dibutylcarbamoyl group, an N,N-diphenylcarbamoyl group, or the like.

The sulfamoyl group optionally having a substituent is preferably a sulfamoyl group having from 0 to 30 carbon atoms in total, including, for example, a sulfamoyl group, an N-alkylsulfamoyl group, an N-arylsulfamoyl group, an N,N-dialkylsulfamoyl group, an N,N-diarylsulfamoyl group, an N-alkyl-N-arylsulfamoyl group, or the like. More specifically, it includes an N-methylsulfamoyl group, an N-ethylsulfamoyl group, an N-propylsulfamoyl group, an N-butylsulfamoyl group, an N-hexylsulfamoyl group, an N-cyclohexylsulfamoyl group, an N-octylsulfamoyl group, an N-2-ethylhexylsulfamoyl group, an N-decylsulfamoyl group, an N-octadecylsulfamoyl group, an N-phenylsulfamoyl group, an N-2-methylphenylsulfamoyl group, an N-2-chlorophenylsulfamoyl group, an N-2-methoxyphenylsulfamoyl group, an N-2-isopropoxyphenylsulfamoyl group, an N-3-chlorophenylsulfamoyl group, an N-3-nitrophenylsulfamoyl group, an N-3-cyanophenylsulfamoyl group, an N-4-methoxyphenylsulfamoyl group, an N-4-cyanophenylsulfamoyl group, an N-4-dimethylaminophenylsulfamoyl group, an N-4-group, an N-4-phenylsulfanylphenylsulfamoyl group, an N-methyl-N-phenylsulfamoyl group, an N,N-dimethylsulfamoyl group, an N,N-dibutylsulfamoyl group, an N,N-diphenylsulfamoyl group, or the like.

The amino group optionally having a substituent is preferably an amino group having from 0 to 50 carbon atoms in total, including, for example, —NH$_2$, an N-alkylamino group, an N-arylamino group, an N-acylamino group, an N-sulfonylamino group, an N,N-dialkylamino group, an N,N-diarylamino group, an N-alkyl-N-arylamino group, an N,N-disulfonylamino group, or the like. More specifically, it includes an N-methylamino group, an N-ethylamino group, an N-propylamino group, an N-isopropylamino group, an N-butylamino group, an N-tert-butylamino group, an N-hexylamino group, an N-cyclohexylamino group, an N-octylamino group, an N-2-ethylhexylamino group, an N-decylamino group, an N-octadecylamino group, an N-benzylamino group, an N-phenylamino group, an N-2-methylphenylamino group, an N-2-chlorophenylamino group, an N-2-methoxyphenylamino group, an N-2-isopropoxyphenylamino group, an N-2-(2-ethylhexyl)phenylamino group, an N-3-chlorophenylamino group, an N-3-nitrophenylamino group, an N-3-cyanophenylamino group, an N-3-trifluoromethylphenylamino group, an N-4-methoxyphenylamino group, an N-4-cyanophenylamino group, an N-4-trifluoromethylphenylamino group, an N-4-methylsulfanylphenylamino group, an N-4-phenylsulfanylphenylamino group, an N-4-dimethylaminophenylamino group, an N-methyl-N-phenylamino group, an N,N-dimethylamino group, an N,N-diethylamino group, an N,N-dibutylamino group, an N,N-diphenylamino group, an N,N-diacetylamino group, an N,N-dibenzoylamino group, an N,N-(dibutylcarbonyl)amino group, an N,N-(dimethylsulfonyl)amino group, an N,N-(diethylsulfonyl)amino group, an N,N-(dibutylsulfonyl)amino group, an N,N-(diphenylsulfonyl)amino group, a morpholino group, a 3,5-dimethylmorpholino group, a carbazole group, or the like.

The phosphinoyl group optionally having a substituent is preferably a phosphinoyl group having from 2 to 50 carbon atoms in total, including, for example, a dimethylphosphinoyl group, a diethylphosphinoyl group, a dipropylphosphinoyl group, a diphenylphosphnoyl group, a dimethoxyphosphinoyl group, a diethoxyphosphinoyl group, a dibenzoylphosphinoyl group, a bis(2,4,6-trimethylphenyl)phosphinoyl group, or the like.

The heterocyclic group optionally having a substituent is preferably an aromatic or aliphatic hetero ring containing any of a nitrogen atom, an oxygen atom, a sulfur atom and a phosphorus atom. For example, it includes a thienyl group, a benzo[b]thienyl group, a naphtho[2,3-b]thienyl group, a thianthrenyl group, a furyl group, a pyranyl group, a isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolidinyl group, an isoindolyl group, a 3H-indolyl group, a indolyl group, a 1H-indazolyl group, a purinyl group, a 4H-quinolidinyl group, an isoquinolyl group, a quinolyl group, a phthalazinyl group, a naphthyridinyl group, a quinoxalinyl group, a quinazolinyl group, a cinnolinyl group, a puteridinyl group, a 4aH-carbazolyl group, a carbazolyl group, a P-carborynyl group, a phenanthrydinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolyl group, an isoindolinyl group, a quinucridinyl group, a morpholinyl group, a thioxanthryl group, or the like.

The halogen atom includes a fluorine atom, a chlorine atom, a bromine atom, an iodine atom, or the like.

The alkyl group optionally having a substituent, the aryl group optionally having a substituent, the alkenyl group optionally having a substituent, the alkynyl group optionally having a substituent, the alkoxy group optionally having a substituent, the aryloxy group optionally having a substituent, the alkylthioxy group optionally having a substituent, the arylthioxy group optionally having a substituent, the acyloxy group optionally having a substituent, the alkylsulfanyl group optionally having a substituent, the arylsulfanyl group optionally having a substituent, the alkylsulfinyl group optionally having a substituent, the arylsulfinyl group optionally having a substituent, the alkylsulfonyl group optionally having a substituent, the arylsulfonyl group optionally having a substituent, the acyl group optionally having a substituent, the alkoxycarbonyl group optionally having a substituent, the carbamoyl group optionally having a substituent, the sulfamoyl group optionally having a substituent, the amino group optionally having a substituent and the heterocyclic group optionally having a substituent mentioned in the above may be substituted with any other substituent.

The substituent includes, for example, a halogen atom such as a fluorine atom, a chlorine atom, a bromine atom, an iodine atom; an alkoxy group such as a methoxy group, an ethoxy group, a tert-butoxy group; an aryloxy group such as a phenoxy group, a p-tolyloxy group; an alkoxycarbonyl group such as a methoxycarbonyl group, a butoxycarbonyl group, a phenoxycarbonyl group; an acyloxy group such as an acetoxy group, a propionyloxy group, a benzoyloxy group; an acyl group such as an acetyl group, a benzoyl group, an isobutyryl group, an acryloyl group, a methacryloyl group, a methoxalyl group; an alkylsulfanyl group such as a methylsulfanyl group, a tert-butylsulfanyl group, an arylsulfanyl group such as a phenylsulfanyl group, a p-tolylsulfanyl group; an alkylamino group such as a methylamino group, a cyclohexylamino group; a dialkylamino group such as a dimethylamino group, a diethylamino group, a morpholino group, a piperidino group; an arylamino group such as a phenylamino group, a p-tolylamino group; an alkyl group such as a methyl group, an ethyl group, a tert-butyl group, a dodecyl group, an aryl group such as a phenyl group, a p-tolyl group, a xylyl group, a cumenyl group, a naphthyl group, an anthryl group, a phenanthryl group; and a hydroxyl group, a carboxy group, a formyl group, a mercapto group, a sulfo group, a mesyl group, a p-toluenesulfonyl group, an amino group, a nitro group, a cyano group, a trifluoromethyl group, a trichloromethyl group, a trimethylsilyl group, a phosphinico group, a phosphono group, a trimethylammoniumyl group, a dimethylsulfoniumyl group, a triphenylphenancylphosphoniumyl group, or the like.

Of those, X is preferably an alkyl group optionally having a substituent, an aryl group optionally having a substituent, an alkenyl group optionally having a substituent, an alkynyl group optionally having a substituent, an alkoxy group optionally having a substituent, an aryloxy group optionally having a substituent, an alkylthioxy group optionally having a substituent, an arylthioxy group optionally having a substituent, or an amino group optionally having a substituent, from the viewpoint of enhancing the solubility of the composition in solvent and increasing the absorption efficiency thereof in a long wavelength range.

In Formula (2), n indicates an integer of from 0 to 5, but is preferably an integer of from 0 to 2.

The divalent organic group for Y includes the following structures. In the following groups, "*" indicates the bonding position at which Y bonds to the adjacent carbon atom in Formula (2).

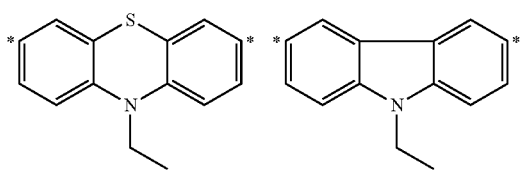
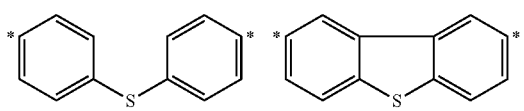
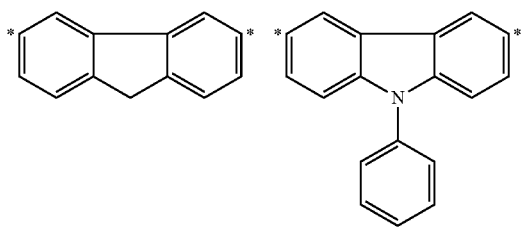
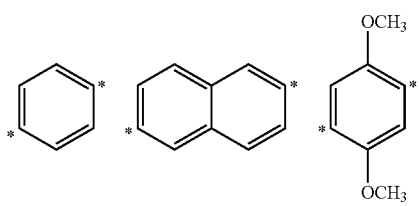

Above all, preferred are the following structures from the viewpoint of the sensitivity of the composition.

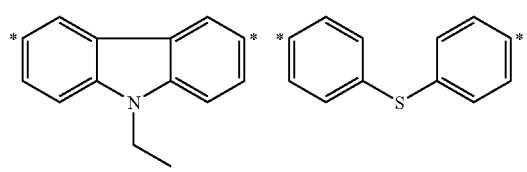

The oxime compounds represented by Formula (1) are preferably compounds represented by the following Formula (3):

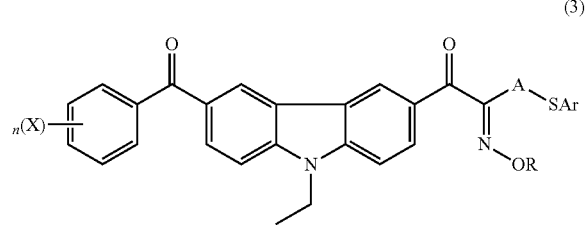

(3)

In Formula (3), R and X each independently represent a monovalent substituent; A represents a divalent organic group; Ar represents an aryl group; and n indicates an integer of from 0 to 5.

R, X, A, Ar and n in Formula (3) have the same meanings as R, X, A, Ar and n in Formula (2); and their preferred examples are also the same as those of the latter.

Specific examples of the oxime compounds represented by Formula (1) are shown below, to which, however, the present invention should not be limited thereto.

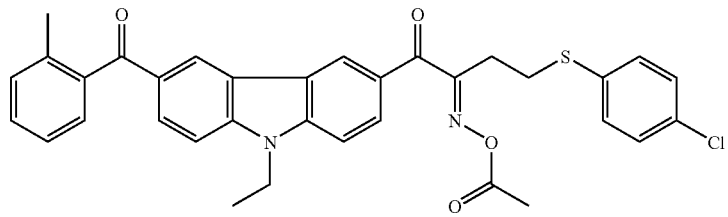

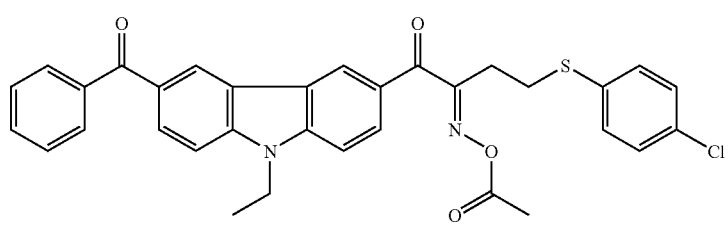

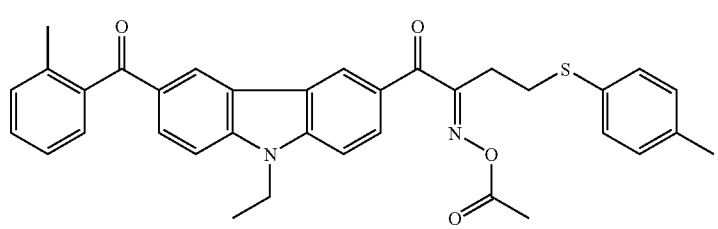

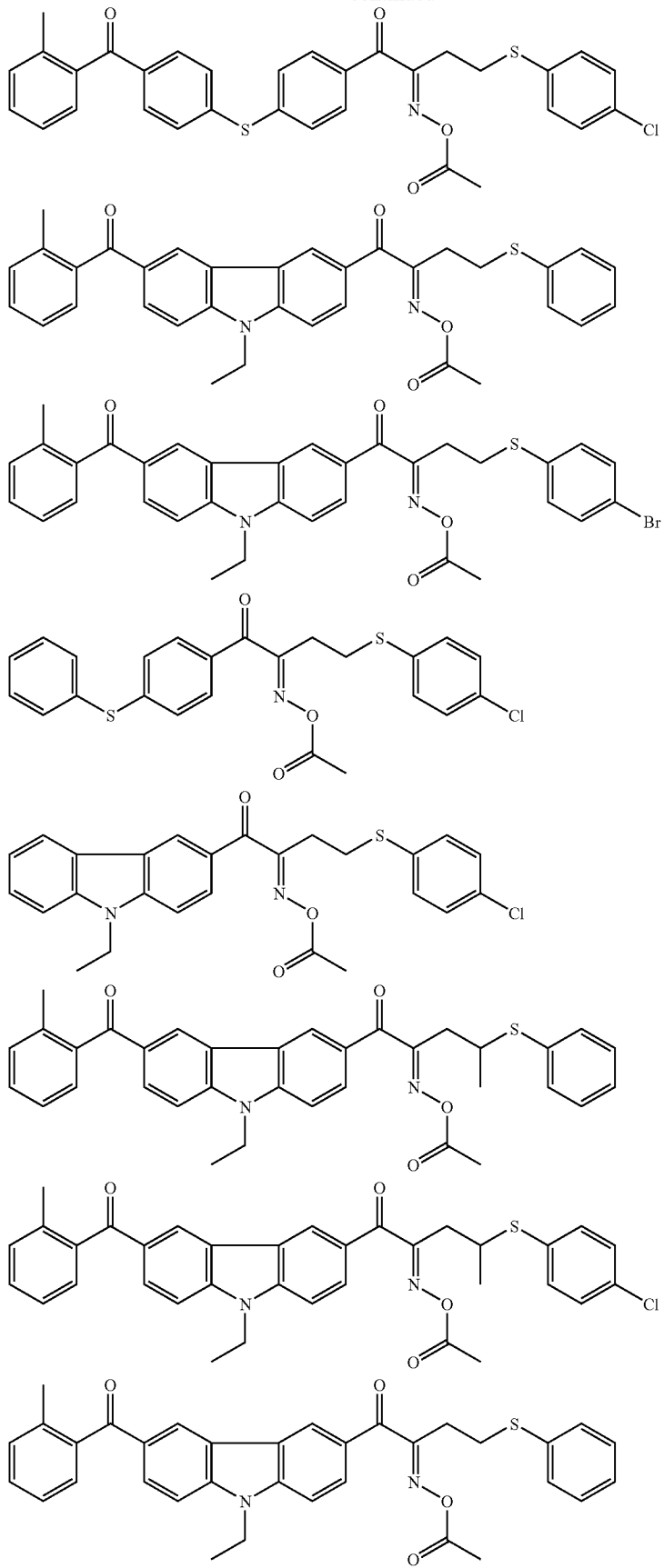

-continued
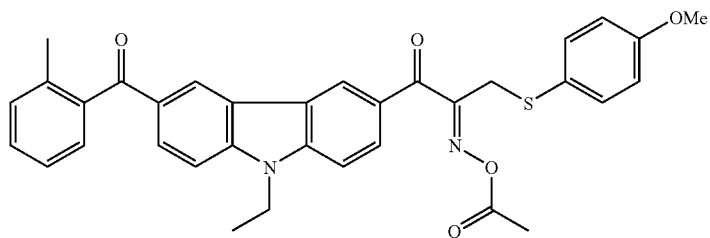
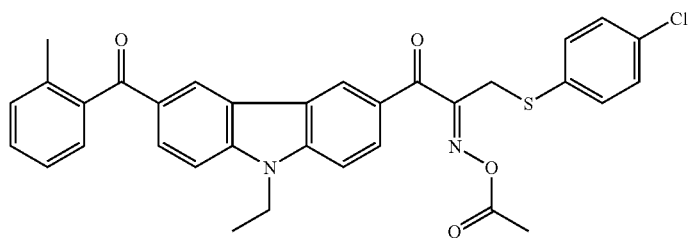
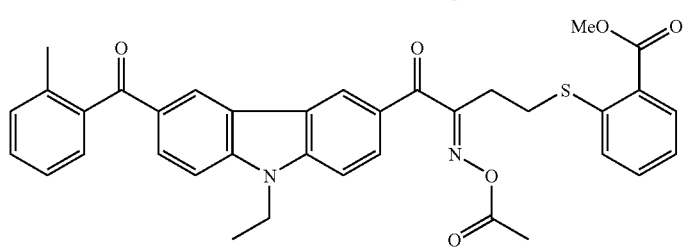
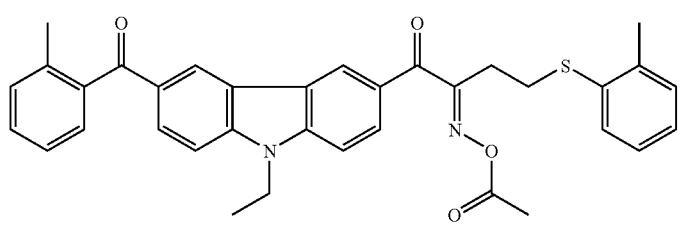
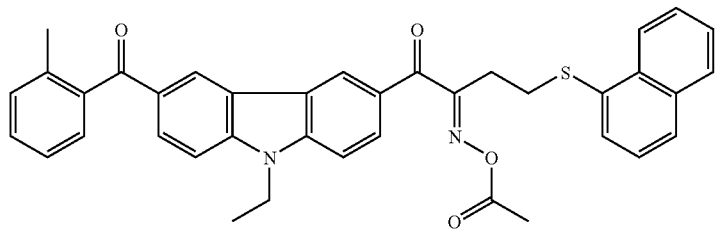
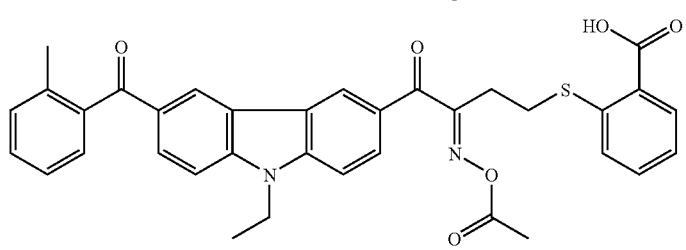
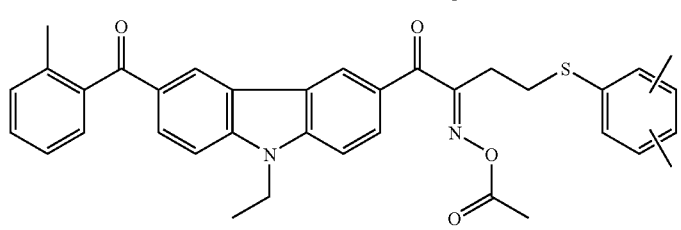

-continued
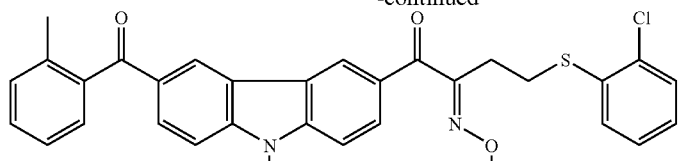
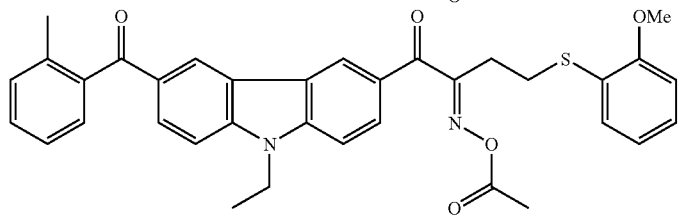
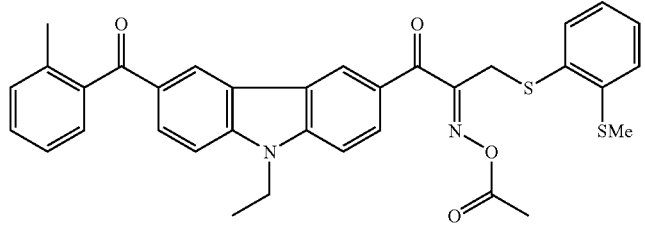
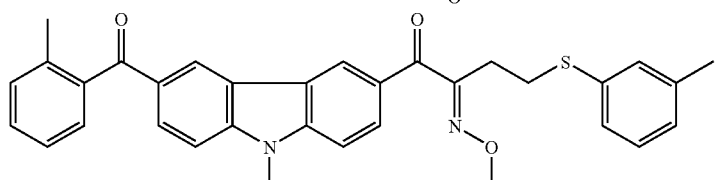
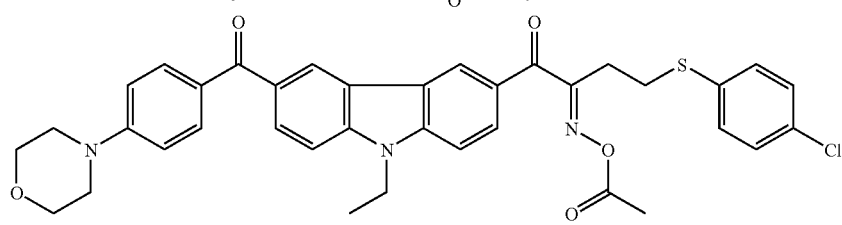
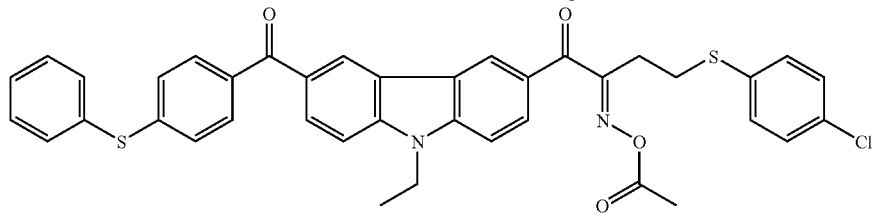
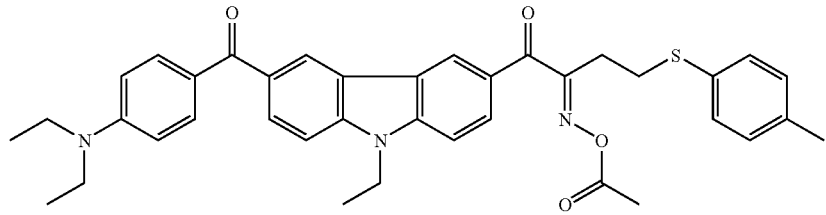
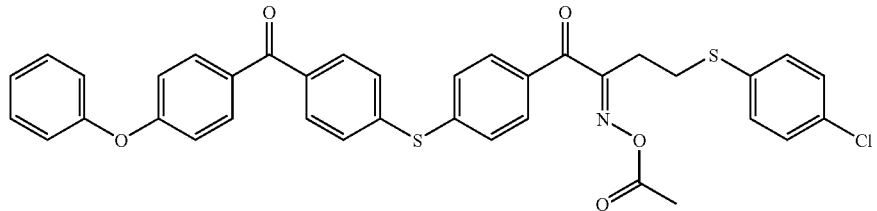

-continued
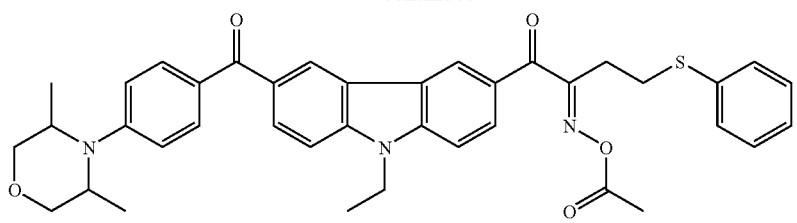
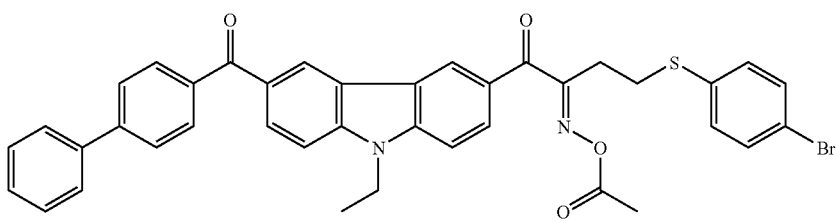
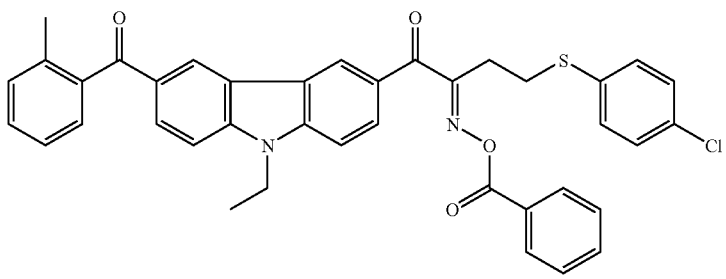
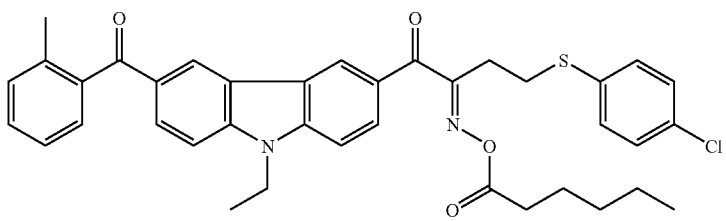
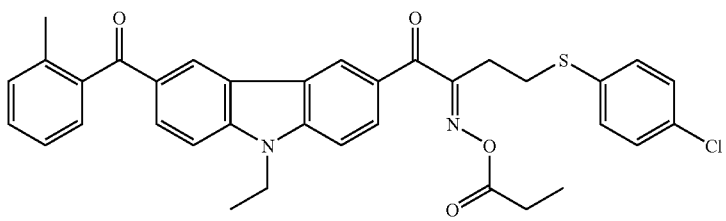
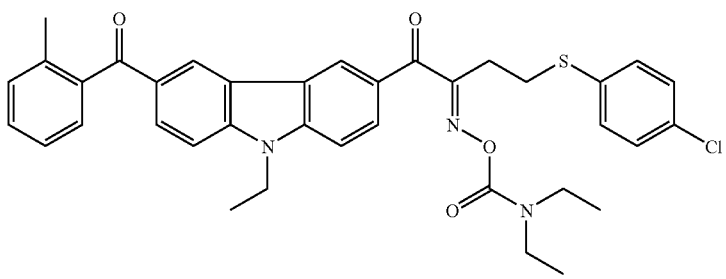

-continued
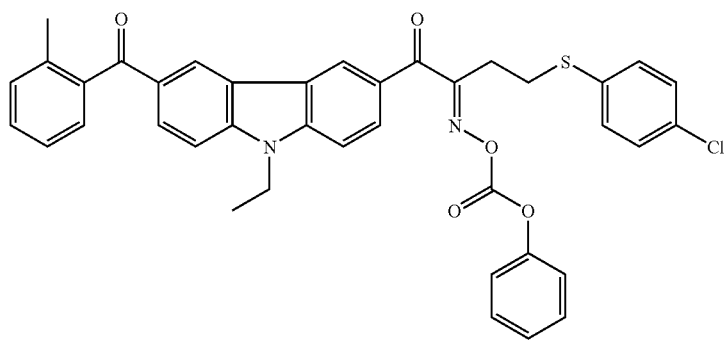
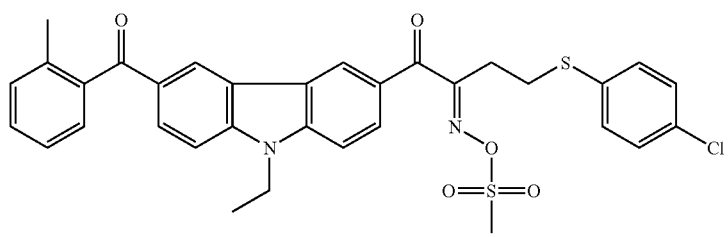
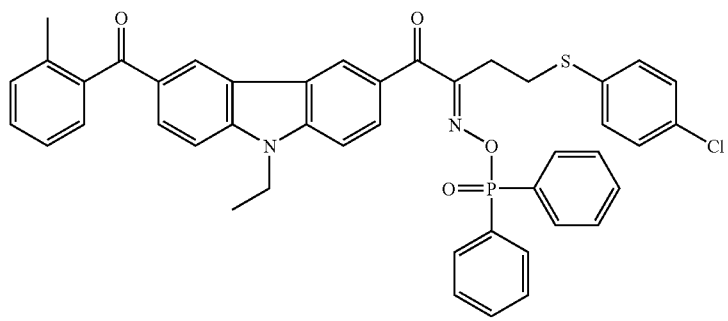
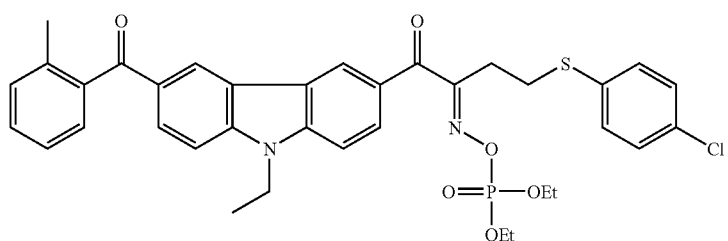
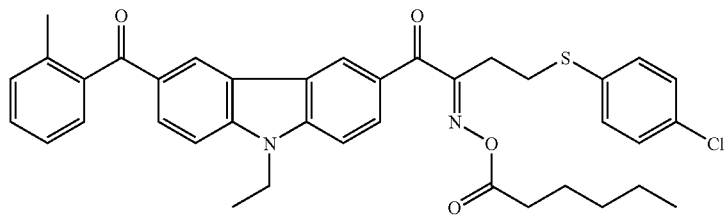
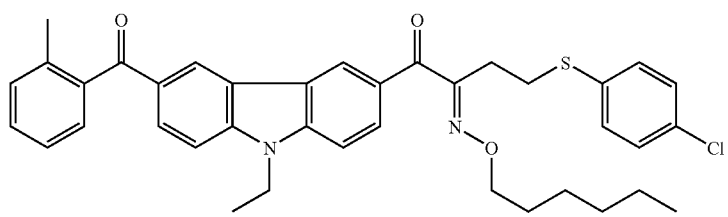

-continued
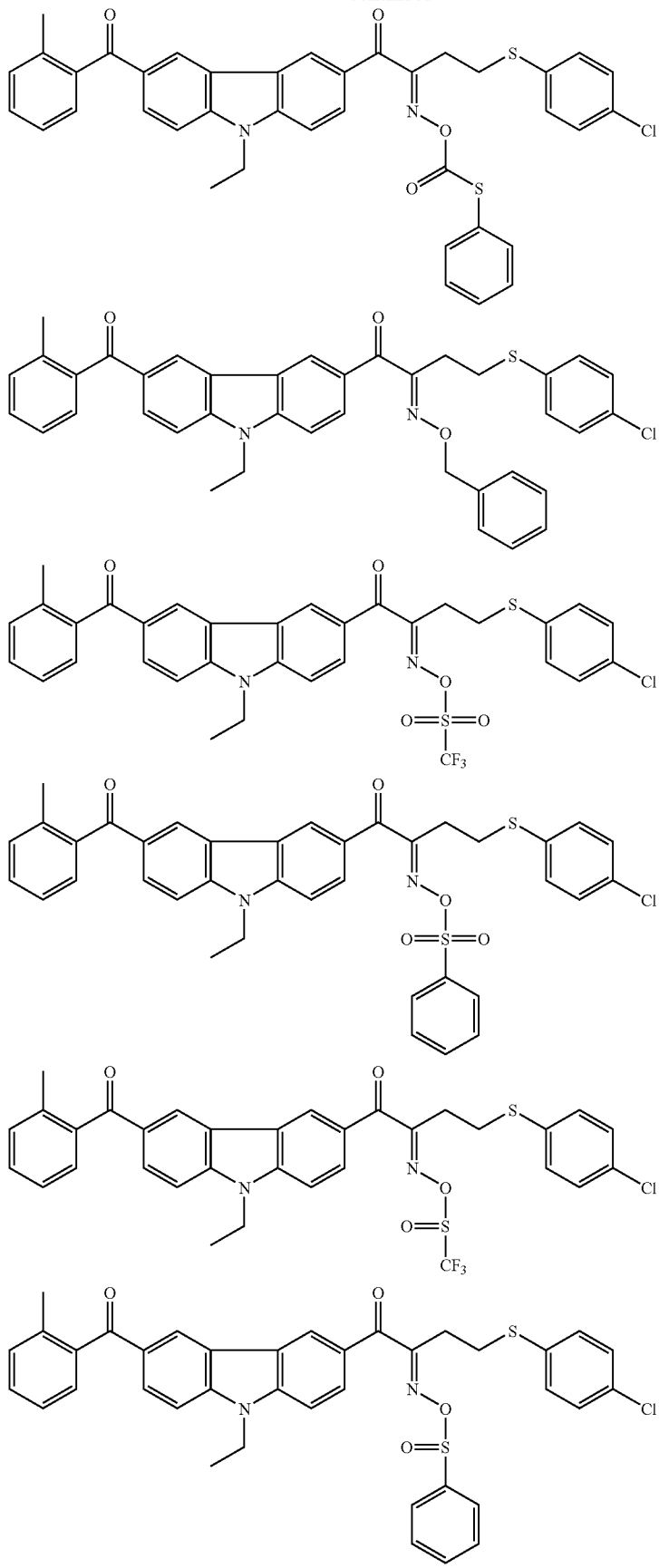

-continued
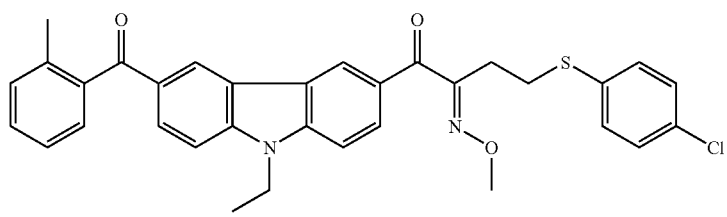
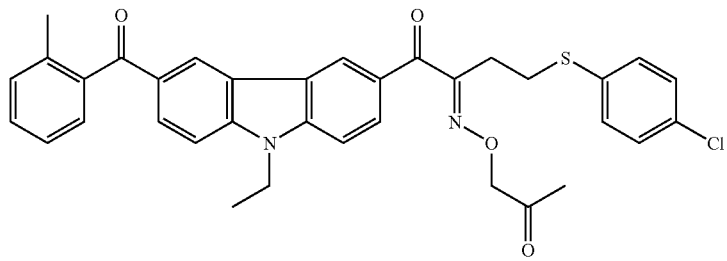
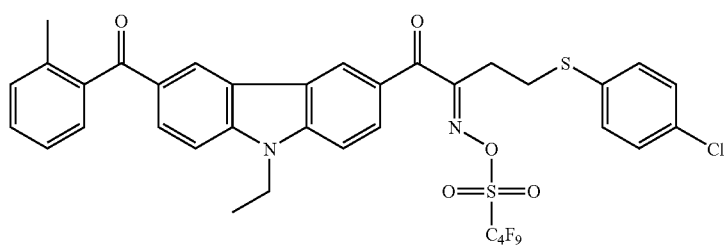
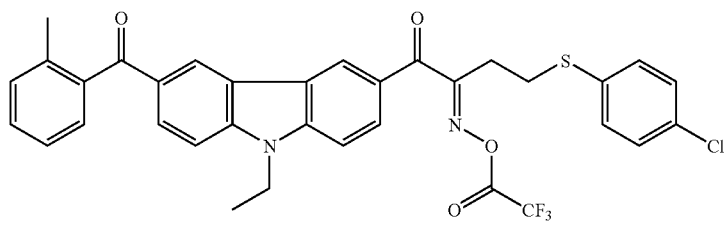
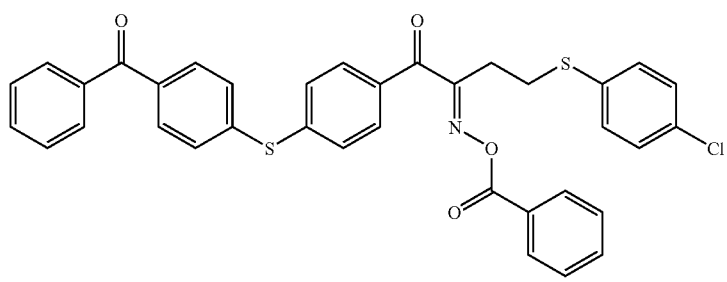
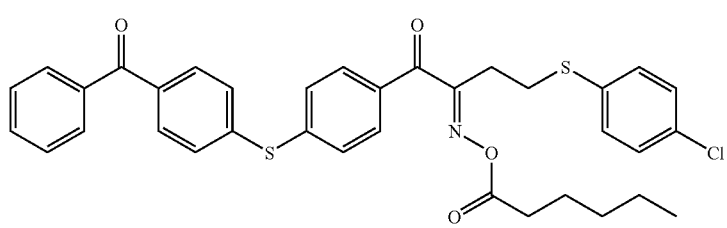
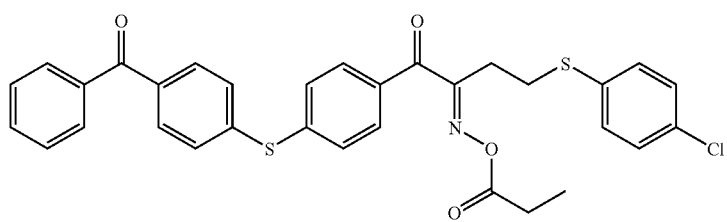

-continued
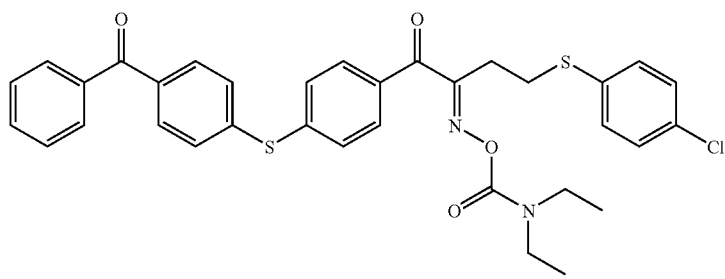
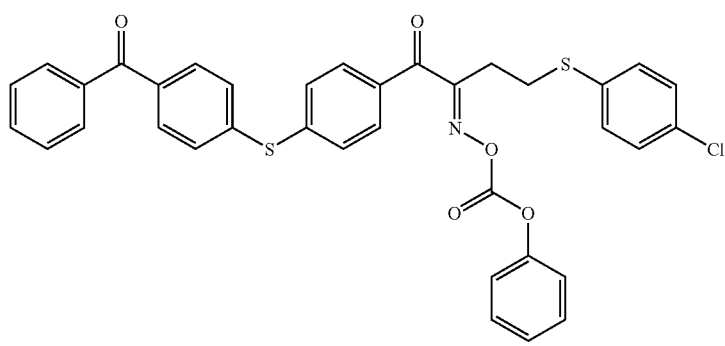
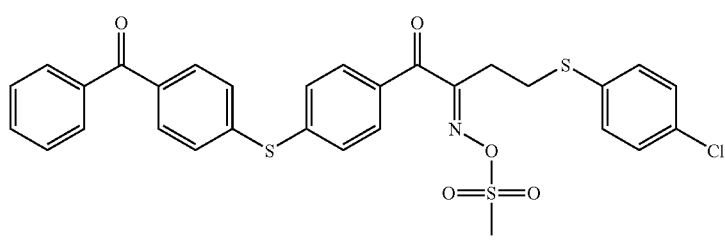
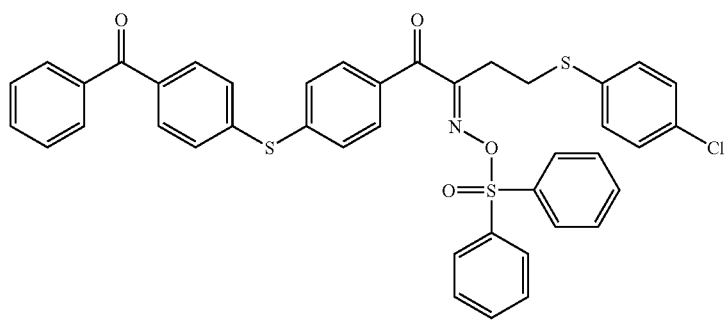
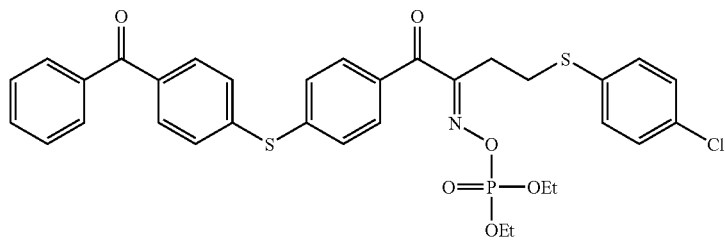
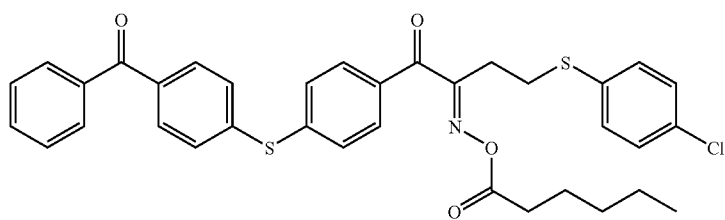

-continued
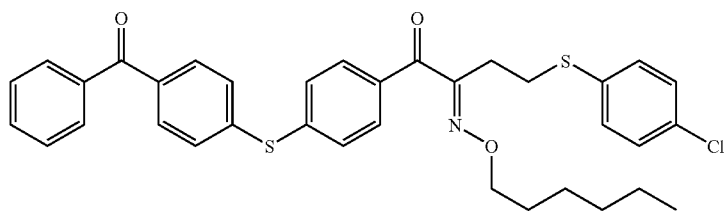
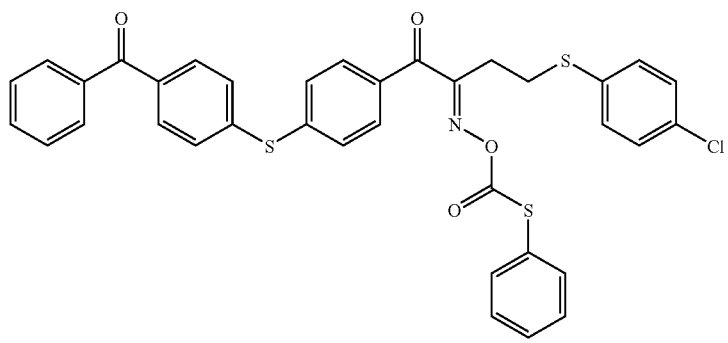
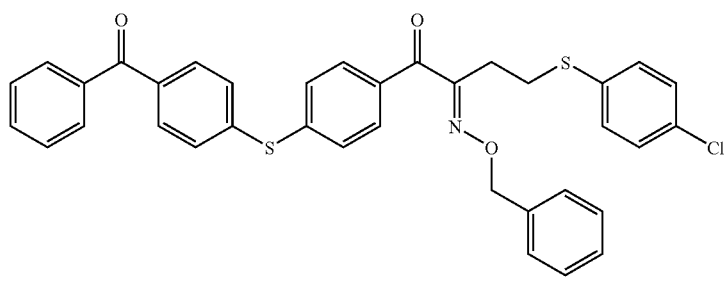
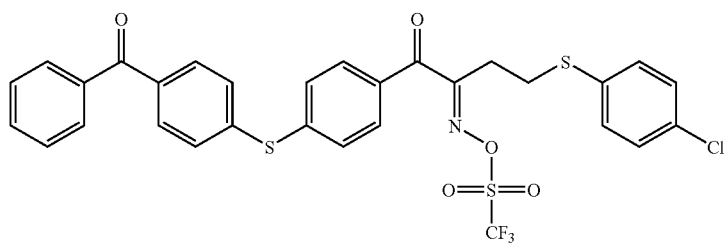
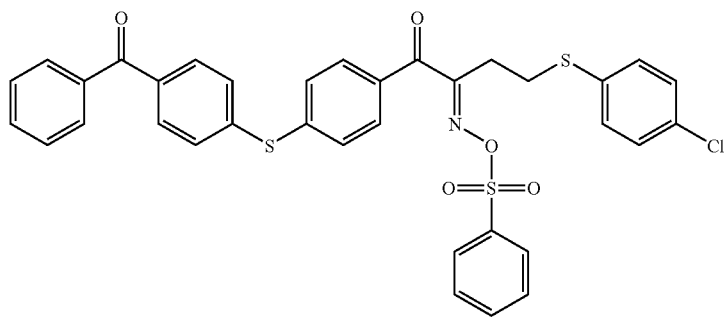
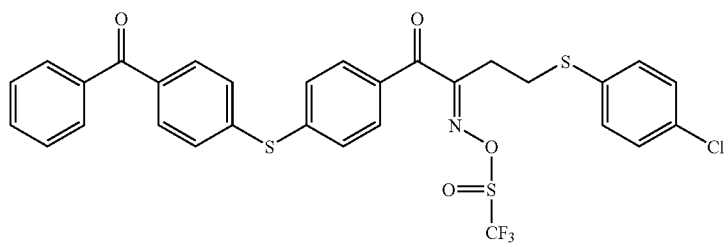

-continued
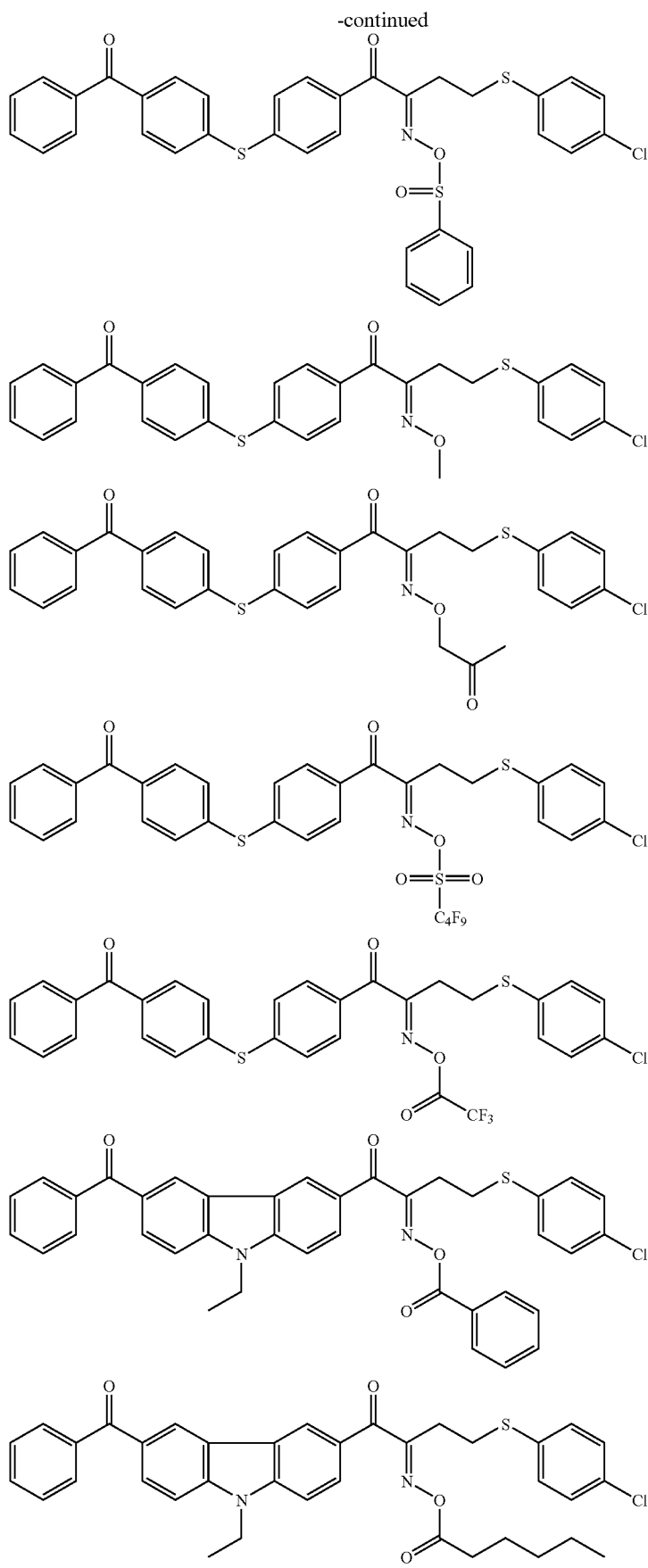

-continued
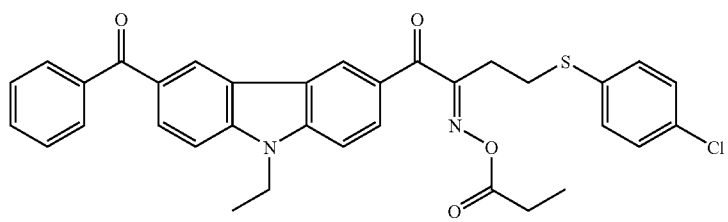
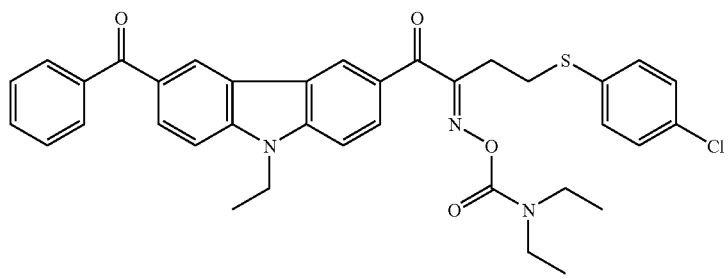
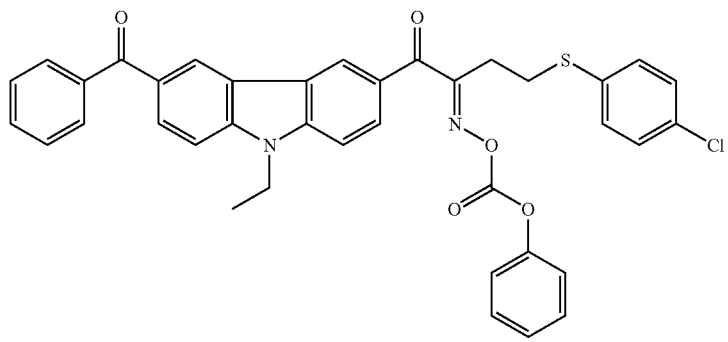
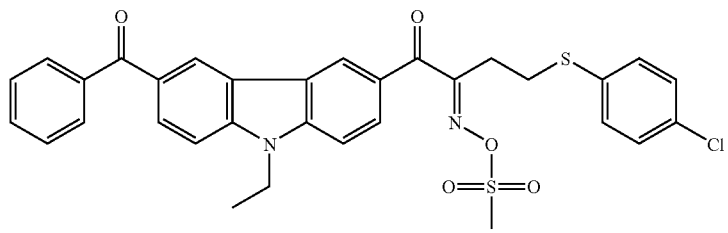
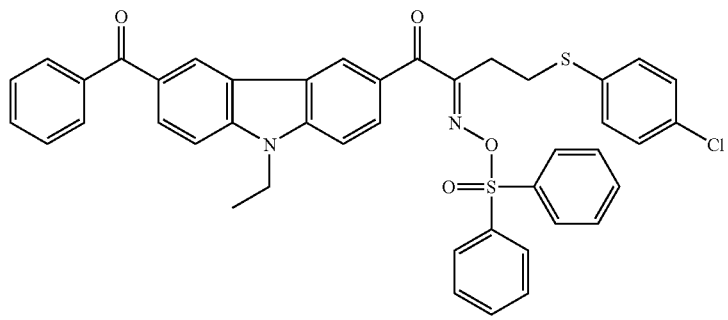
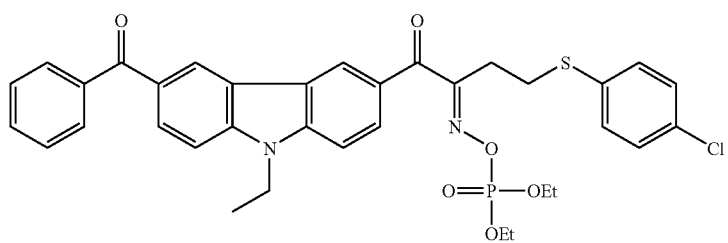

-continued
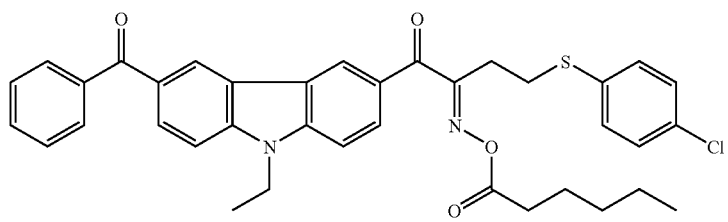
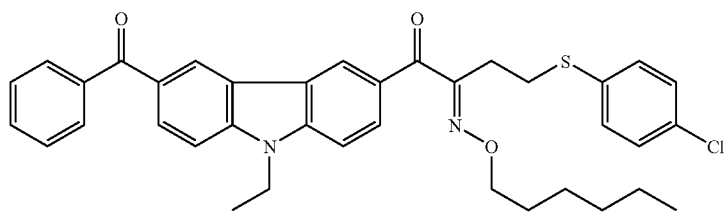
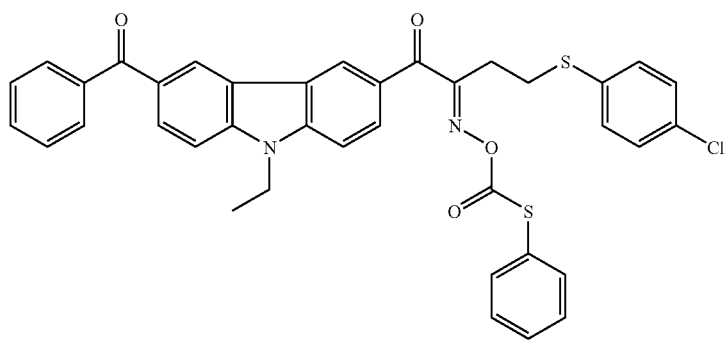
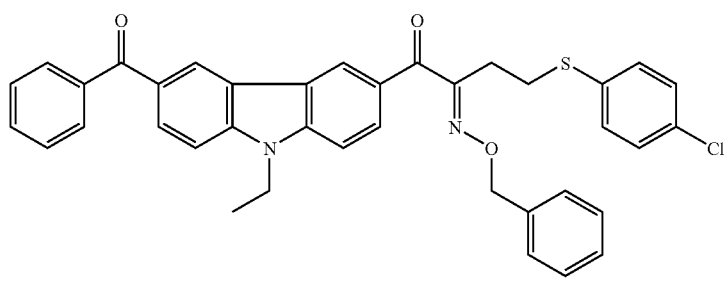
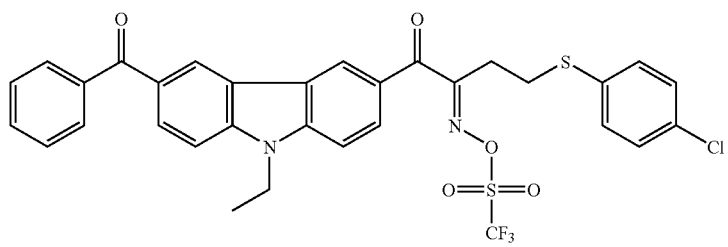
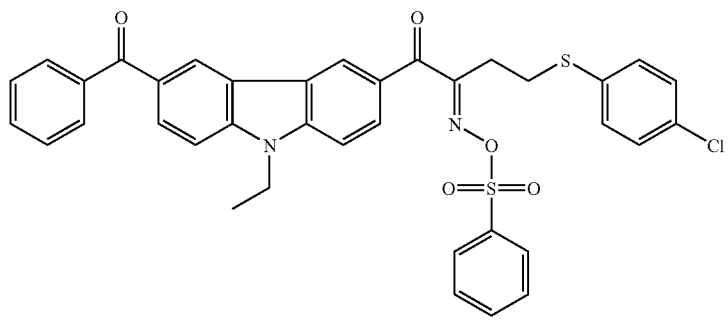

-continued

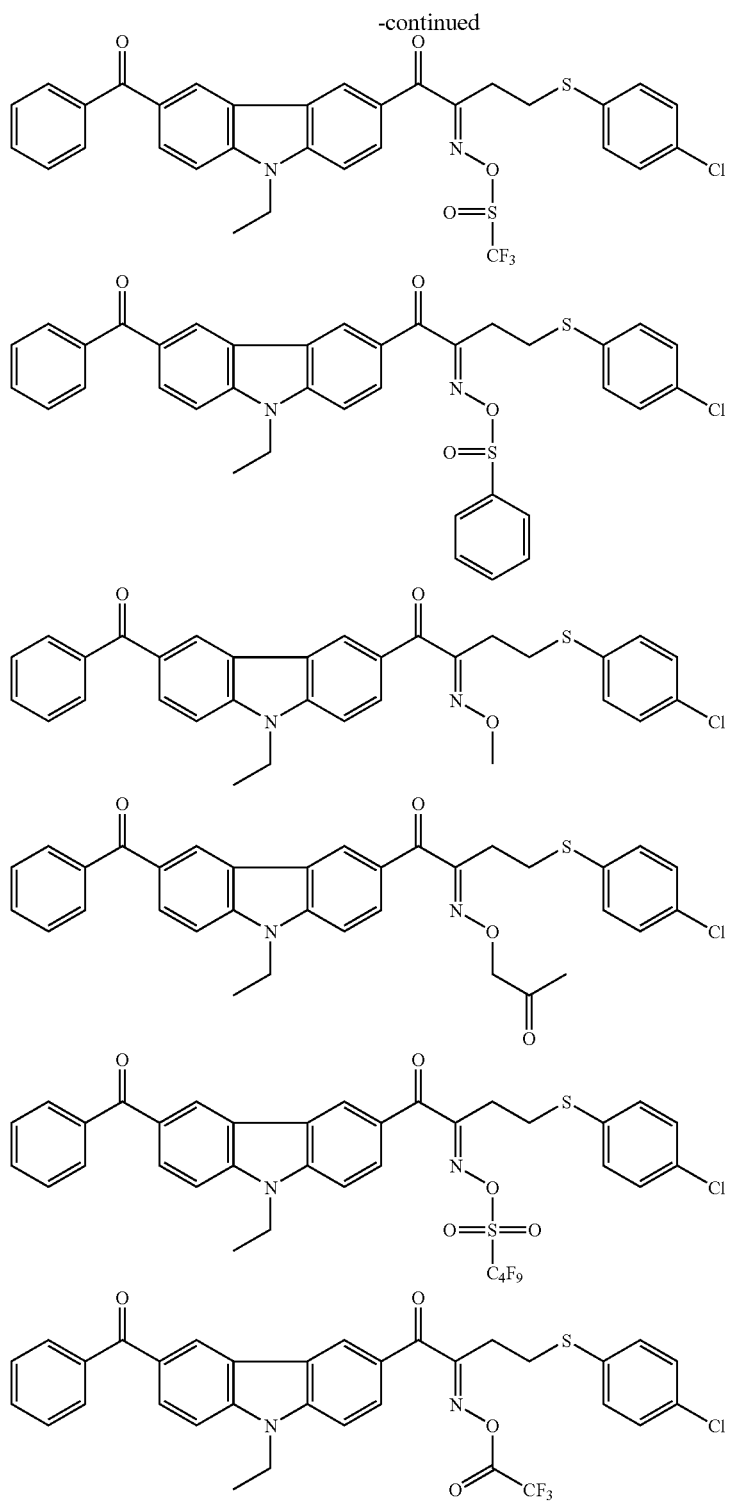

The oxime compounds represented by Formula (1) have a maximum absorption wavelength in a wavelength range of from 350 nm to 500 nm, more preferably having an absorption wavelength in a wavelength range of from 360 nm to 480 nm, even more preferably having a high absorbance at 365 nm and 455 nm. To that effect, the oxime compounds represented by Formula (1) have an absorption in a long wavelength range, as compared with any other conventional oxime compounds. Accordingly, when exposed to a light source at 365 nm or 405 nm, the compounds exhibit an excellent sensitivity.

The oxime compounds represented by Formula (1) preferably have a molar extinction coefficient at 365 nm or 405 nm of from 10000 to 300000, from the viewpoint of the sensitivity thereof, more preferably from 15000 to 300000, even more preferably from 20000 to 200000.

The molar extinction coefficient of the oxime compounds represented by Formula (1) may be determined at a concentration of 0.01 g/L in an ethyl acetate solvent, using a UV/visible light spectrophotometer (manufactured by Varian; Carry-5 Spectrophotometer).

The oxime compounds represented by Formula (1) for use in the present invention may be produced, for example, according to the method mentioned below, to which, however, the present invention should not be limited thereto.

Production of Compounds Represented by Formula (2):

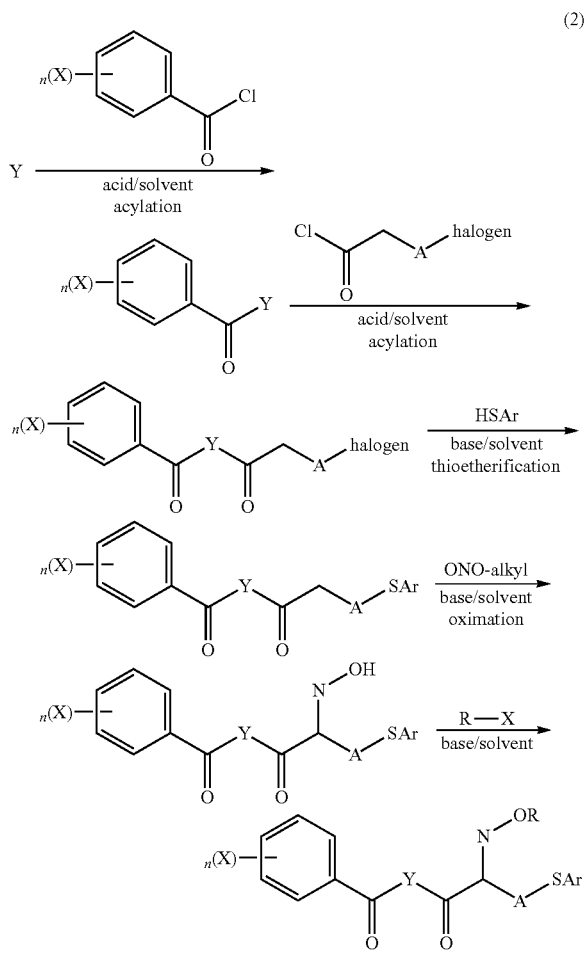

The oxime compound represented by Formula (1) is decomposed by light and has a function as a photopolymerization initiator to initiate and promote the polymerization of a photopolymerizable compound. In particular, the oxime compounds represented by Formula (1) have an excellent sensitivity to a light source at 365 nm or 405 nm.

The content of the photopolymerization initiator in the black photosensitive resin composition is preferably from 0.1 to 20% by mass of the total solid content of the composition, more preferably from 3.0 to 15.0% by mass. When the content of the photopolymerization initiator is 3.0% by mass or more, then the composition may have a high sensitivity to exposure to light; and when the content of the photopolymerization initiator is 15.0% by mass or less, then the composition is advantageous in point of the pattern resolution.

One or more different types of the photopolymerization initiators may be used herein either singly or in combination.

(Solvent)

The black photosensitive resin composition of the present invention contains a solvent.

The solvent includes acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethylsulfoxide, γ-butyrolactone, methyl lactate, ethyl lactate, or the like.

These solvents may be used either singly or in combination. The concentration of the solid ingredient to the solvent is preferably from 2 to 60% by mass.

(Other Ingredients)

In addition to the above-mentioned ingredients, the black photosensitive resin composition of the present invention may further contain any other ingredients such as a binder, a sensitizer, a co-sensitizer, a thermal polymerization inhibitor, or the like.

—Binder—

The black photosensitive resin composition of the present invention may contain a resin as a binder. As the resin, preferred is a linear organic polymer. The linear organic polymer for use herein may be any known one. Preferably, in order that the composition is developable with water or with weak alkali water, a linear organic polymer soluble or swellable in water or weak alkali water is selected. The linear organic polymer may be selected not only as a film-forming agent but also in accordance with the use thereof as a developing agent in water, weak alkali water or organic solvent. For example, when a water-soluble organic polymer is used, the composition is developable with water. The linear organic polymer of the type includes a radical polymer having a carboxylic acid group in the side branch thereof, for example, as in JP-A-59-44615, JP-B-54-34327, JP-B-58-12577, JP-B-54-25957, JP-A-54-92723, JP-A-59-53836, JP-A-59-71048, or that is, a resin prepared through homopolymerization or copolymerization of a carboxyl group-having monomer, a resin prepared through hydrolysis or half-esterification or half-amidation of an acid anhydride unit formed through homopolymerization or copolymerization of an acid anhydride-having monomer, an epoxyacrylate prepared through modification of an epoxy resin with an unsaturated monocarboxylic acid and an acid anhydride, or the like. The carboxyl group-having monomer includes acrylic acid, methacrylic acid, itaconic acid, crotonic acid, maleic acid, fumaric acid, 4-carboxylstyrene, or the like; and the acid anhydride-having monomer includes maleic anhydride, or the like.

Also usable are acidic cellulose derivatives having a carboxylic acid group in the side branch thereof. In addition, also useful are derivatives prepared by adding a cyclic acid anhydride to a hydroxyl group-having polymer.

—Sensitizer—

The black photosensitive resin composition of the present invention may contain a sensitizer. The sensitizer is preferably one capable of sensitizing the photopolymerization initiator according to an electron transfer mechanism or an energy transfer mechanism.

The sensitizer includes the compounds mentioned below, having an absorption wavelength in a wavelength range of from 300 to 450 nm. Specifically, for example, they are polynuclear aromatics (e.g., phenanthrene, anthracene, pyrene, perylene, triphenylene, 9,10-dialkoxyanthracene), xanthenes (e.g., fluoresceine, eosine, erythrosine, rhodamine B, rose bengal), thioxanthones (e.g., isopropylthioxanthone, diethylthioxanthone, chlorothioxanthone), cyanines (e.g., thiacarbocyanine, oxacarbocyanine), merocyanines (e.g., merocyanine, carbomerocyanine), phthalocyanines, thiazines (e.g., thionin, methylene blue, tolidine blue), acridines (e.g., acridine orange, chloroflavin, acryflavin), anthraquinones (e.g., anthraquinone), squaliums (e.g., squalium), acridine orange, coumarins (e.g., 7-diethylamino-4-methylcoumarin), ketocoumarins, phenothiazines, phenazines, styrylbenzenes, azo compounds, diphenylmethane, triphenylmethane, distyrylbenzenes, carbazoles, porphyrins, spiro compounds, quinacridones, indigo, styryl, pyrylium compounds, pyrromethene compounds, pyrazolotriazole compounds, benzothiazole compounds, barbituric acid derivatives, thiobarbituric acid derivatives, aromatic ketone compounds such as acetophenone, benzophenone, thioxanthone, Michler's ketone, heterocyclic compounds such as N-aryloxazolidinones, or the like.

In case where the black photosensitive resin composition of the present invention contains a sensitizer, the content of the sensitizer in the photosensitive resin composition is preferably from 0.1 to 20% by mass of the total solid content of the composition, more preferably from 0.5 to 15% by mass, from the viewpoint of the light absorption efficiency to the depth and the initiation decomposition efficiency thereof.
—Co-Sensitizer—

The black photosensitive resin composition of the present invention may contain a co-sensitizer. The co-sensitizer has an effect of further enhancing the sensitivity of the photopolymerization initiator and the sensitizer to active radiations, or protecting the polymerizability of the photopolymerizable compound from being retarded by oxygen.

Examples of the co-sensitizer include amines, for example, the compounds described in M. R. Sander et al's Journal of Polymer Society, Vol. 10, p. 3173 (1972); JP-B-44-20189, JP-A-51-82102, JP-A-52-134692, JP-A-59-138205, JP-A-60-84305, JP-A-62-18537, JP-A-64-33104; and Research Disclosure No. 33825. Specifically mentioned are triethanolamine, ethyl p-dimethylaminobenzo ate, p-formyldimethylaniline, p-methylthiodimethylaniline, or the like. Other examples of the co-sensitizer are thiols and sulfides, for example, the thiol compounds described in JP-A-53-702, JP-B-55-500806, JP-A-5-142772, and the disulfide compounds described in JP-A-56-75643. Specifically mentioned are 2-mercaptobenzothiazole, 2-mercaptobenzoxazole, 2-mercaptobenzimidazole, 2-mercapto-4(3H)-quinazoline, β-mercaptonaphthalene, or the like. Still other examples are amino acid compounds (e.g., N-phenylglycine), the organic metal compounds described in JP-B-48-42965 (e.g., tributyltin acetate), the hydrogen donors described in JP-B-55-34414, the sulfur compounds described in JP-A-6-308727 (e.g., trithian), or the like.

In case where the black photosensitive resin composition of the present invention contains a co-sensitizer, the content of the co-sensitizer therein is preferably from 0.1 to 30% by mass of the total solid content of the black photosensitive resin composition from the viewpoint of enhancing the curing speed on the basis of the balance between the polymerization growth speed and the chain transfer, more preferably from 1 to 25% by mass, even more preferably from 0.5 to 20% by mass.

—Thermal Polymerization Inhibitor—

The black photosensitive resin composition of the present invention may contain a small amount of a thermal polymerization inhibitor. The thermal polymerization inhibitor may inhibit the unnecessary thermal polymerization of the photopolymerizable compound during production or storage of the composition. The thermal polymerization inhibitor includes hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxyamine cerous salt, or the like.

In case where the black photosensitive resin composition of the present invention contains a thermal polymerization inhibitor, the content of the thermal polymerization inhibitor therein is preferably from about 0.01 to about 5% by mass of the total solid content of the black photosensitive resin composition.

If desired, from the viewpoint of protecting the polymerization of the composition from being retarded by oxygen, a higher fatty acid derivative or the like such as behenic acid or behenamide may be added to the composition to thereby make the additive locally exist in the surface of the coating film during the process of drying it. The amount of the higher fatty acid derivative to be added is preferably from about 0.5 to about 10% by mass of the composition.
—Adhesiveness Enhancer—

The black photosensitive resin composition of the present invention may contain an adhesiveness enhancer capable of enhancing the adhesiveness of the composition to the hard surface of a support or the like. The adhesiveness enhancer includes a silane coupling agent, a titanium coupling agent, or the like.

The silane coupling agent includes, for example, γ-(2-aminoethyl)aminopropyltrimethoxysilane, γ-(2-aminoethyl)aminopropyldimethoxysilane, β-(3,4-epoxycyclohexyl)ethyltrimethoxysilane, γ-aminopropyltrimethoxysilane, γ-aminopropyltriethoxysilane, γ-methacryloxypropyltrimethoxysilane, γ-methacryloxypropyltriethoxysilane, γ-acryloxypropyltrimethoxysilane, γ-acryloxypropyltriethoxysilane, γ-isocyanatopropyltrimethoxysilane, γ-isocyanatopropyltriethoxysilane, N-3-(N-vinylbenzylaminoethyl)-γ-aminopropyltrimethoxysilane hydrochloride, γ-glycidoxypropyltrimethoxysilane, γ-glycidoxypropyltriethoxysilane, aminosilane, γ-mercaptopropyltrimethoxysilane, γ-mercaptopropyltriethoxysilane, methyltrimethoxysilane, methyltrimethoxysilane, vinyltriacetoxysilane, γ-chloropropyltrimethoxysilane, hexamethyldisilazane, γ-anilinopropyltrimethoxysilane, vinyltrimethoxysilane, vinyltriethoxysilane, vinyltris(β-methoxyethoxy)silane, octadecyldimethyl[3-(trimethoxysilyl)propyl]ammonium chloride, γ-chloropropylmethyldimethoxysilane, γ-mercaptopropylmethyldimethoxysilane, methyltrichlorosilane, dimethyldichlorosilane, trimethylchlorosilane, 2-(3,4-epoxycyclohexyl)ethyltrimethoxysilane, bisallyltrimethoxysilane, tetraethoxysilane, bis(trimethoxysilyl)hexane, phenyltrimethoxysilane, N-(3-acryloxy-2-hydroxypropyl)-3-aminopropyltriethoxysilane, N-(3-methacryloxy-2-hydroxypropyl)-3-aminopropyltriethoxysilane, (methacryloxymethyl)methyldiethoxysilane, (acryloxymethyl)methyldimethoxysilane, or the like.

Above all, preferred are γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, phenyltrimethoxysilane; and most preferred is γ-methacryloxypropyltrimethoxysilane.

In case where the black photosensitive resin composition of the present invention contains an adhesiveness enhancer, the content of the adhesiveness enhancer therein is preferably from 0.5 to 30% by mass of the total solid content of the photosensitive resin composition, more preferably from 0.7 to 20% by mass.

—Other Additives—

Any known additives such as an inorganic filler, a plasticizer, a fat sensitizer and the like may be added to the black photosensitive resin composition of the present invention. These additives may improve the physical properties of the cured film. The plasticizer includes, for example, dioctyl phthalate, didodecyl phthalate, triethylene glycol dicaprylate, dimethylene glycol phthalate, tricresyl phosphate, dioctyl adipate, dibutyl sebacate, triacetylglycerin, or the like. In case where the composition contains a resin serving as a binder, the amount of the plasticizer to be in the composition may be 10% by mass or less of the total content by mass of the photopolymerizable compound and the resin.

The black photosensitive resin composition of the present invention can be prepared by mixing and dispersing the above-mentioned ingredients, using various mixers and dispersers.

The black photosensitive resin composition of the present invention is favorable for forming a light-shielding film for use in solid-state image sensors such as CCD, CMOS, or the like. Specifically, the composition is especially favorable for forming a color filter for solid-state image sensors, which requires a microstructured color pattern formed in a thin film and having a good rectangular cross-sectional profile.

Specifically, in case where the thin film has a thickness of 1 μm or less, then the amount of the ingredients contributing toward the photolithographic capability of the film except the colorant therein decreases relatively, and the amount of the other ingredients further decreases owing to the increase in the amount of the black colorant in the film, whereby the quantity of light to pass through the film is decreased and in the depth of the film at which the degree of exposure to light is low, the film may undergo overdevelopment with the result that the patterned profile may have a reversed-taper shape and the pattern may readily peel away. This is more remarkable when the thickness of the film to be formed is from 0.005 μm to 0.9 μm (further, from 0.1 μm to 0.7 μm). In addition, in case where a light-shielding film is formed in accordance with the pixel pattern to constitute a color filter, for example, when one size of the pattern to be formed of the photosensitive resin composition of the present invention (the size of the pattern taken in the normal direction relative to the substrate) is 3 μm or less (for example, from 0.5 to 3.0 μm), the pattern forming capability may be worsened owing to the increase in the amount of the black colorant in the composition. In particular, when the pattern size is from 1.0 to 3.0 μm (further, from 1.5 to 3.0 μm), the problem is remarkable.

In producing such a color filter for solid-state image sensors, especially when the photosensitive resin composition of the present invention is used, the pattern forming capability can be effectively improved, and a pattern having a nearly rectangular cross-sectional profile can be produced; and further, the composition has a high sensitivity, and the adhesiveness of the formed pattern to the substrate may be enhanced, and accordingly, the pattern is prevented from being peeled away, and the image defects may be thereby prevented.

<<Light-Shielding Color Filter>>

The light-shielding color filter of the present invention is produced by the use of the above-mentioned photosensitive resin composition of the present invention.

The light-shielding color filter of the present invention is formed by the use of the photosensitive resin composition of the present invention which can form a micropattern with little development residue and which is excellent in the stability with time, and therefore, the development residue after the film formation is small. In addition, the pattern adhesiveness to the substrate on which the light-shielding color filter is formed is good.

The "light-shielding color filter" of the present invention is meant to indicate a light-shielding pattern formed through exposure to light of a photosensitive resin composition containing at least a black colorant, a photopolymerizable compound, a resin, a photopolymerization initiator and a solvent followed by development thereof The color of the "light-shielding color filter" of the present invention may be colorless black or gray, or may be colored gray or the like.

Although the thickness of the light-shielding color filter is not specifically defined, the thickness of the light-shielding color filter of the present invention is preferably from 0.1 μm to 10 μm from the viewpoint of more effectively attaining the effect of the invention, more preferably from 0.3 μm to 5.0 μm, even more preferably from 0.5 μm to 3.0 μm.

Although the pattern size of the light-shielding color filter is not specifically defined, the pattern size of the light-shielding color filter is preferably 1000 μm or less from the viewpoint of more effectively attaining the effect of the invention, more preferably 500 μm or less, even more preferably 300 μm or less. Also not specifically defined, the lowermost limit of the size is preferably 1 μm.

Although the spectral characteristics of the light-shielding color filter is not specifically defined, the spectral characteristics of the light-shielding color filter of the present invention are preferably such that the ratio of the optical density thereof at a wavelength of 1200 nm ($OD_{1200}$) to the optical density thereof at a wavelength of 365 nm ($OD_{365}$) [$OD_{1200}/OD_{365}$] is from 0.5 to 3, from the viewpoint of enhancing the light shieldability in the IR range that may be required by solid-stage image sensors, from the viewpoint of the balance between the light shieldability in the visible light range and that in the IR range, and from the viewpoint of more effectively attaining the effect of the invention.

The optical density (OD) is determined as follows: Using Hitachi Technologies' U-4100, the transmittance of the formed film is measured, and the resulting transmittance (% T) is converted into OD according to the following Expression 1:

$$\text{OD value} = -\text{Log}(\% \, T/100) \qquad \text{Expression 1}$$

In the present invention, the optical density at a wavelength λ nm is represented by "$OD_\lambda$".

Further, the optical density of the light-shielding color filter is more preferably as follows, from the viewpoint of the balance between the light shieldability thereof in the visible light range and that in the IR range, and from the viewpoint of more effectively attaining the effect of the present invention.

Specifically, the ratio [$OD_{1200}/OD_{365}$] is more preferably from 1.0 to 2.5, even more preferably from 1.3 to 2.0.

Preferably, the optical density of the light-shielding color filter at a wavelength of 1200 nm ($OD_{1200}$) is from 3 to 10, more preferably from 4 to 10.

Preferably, the optical density of the light-shielding color filter at a wavelength of 365 nm ($OD_{365}$) is from 1 to 7, more preferably from 2 to 6.

Preferably, the optical density of the light-shielding color filter in a wavelength range of from 900 nm to 1300 nm is from 2 to 10, more preferably from 3 to 9, even more preferably from 4 to 9.

The ratio of the light-shielding color filter [$OD_{900}/OD_{365}$] is preferably from 1.0 to 2.5, more preferably from 1.3 to 2.5.

The ratio of the light-shielding color filter [$OD_{1100}/OD_{365}$] is preferably from 1.0 to 2.5, more preferably from 1.3 to 2.5.

The ratio of the light-shielding color filter [$OD_{1300}/OD_{365}$] is preferably from 1.0 to 2.3, more preferably from 1.1 to 2.0.

The light-shielding color filter of the present invention is favorably used, for example, in solid-state image sensors of CCD, CMOS, or the like, in particular to solid-state image sensors of CCD, CMOS and the like having more than 1,000,000 pixels.

<<Method of Producing Light-Shielding Color Filter>>

The method of producing the light-shielding color filter of the present invention described in the above is not specifically defined. For example, preferred is a method comprising applying the above-mentioned photosensitive resin composition of the present invention onto a support, then exposing it to light via a mask, and developing it to form a pattern (this is hereinafter referred to as "method of producing light-shielding color filter of the present invention").

Specifically, the method of producing the light-shielding color filter of the present invention comprises a step of applying the photosensitive resin composition of the present invention onto a support to form a photosensitive layer thereon (hereinafter this step may be abbreviated as "photosensitive layer formation step"), a step of exposing the photosensitive layer to light via a mask (hereinafter this step may be abbreviated as "exposure step"), and a step of developing the exposed photosensitive layer to form a pattern (hereinafter this step may be abbreviated as "development step").

The constitutive steps of the method of producing the light-shielding color filter of the present invention are described below.

<Photosensitive Layer Formation Step>

In the photosensitive layer formation step, the photosensitive resin composition of the present invention is applied onto a support to form a photosensitive layer thereon.

The support for use in this step includes, for example, a photoelectric conversion element support for use for solid-state image sensors, for example, a silicon substrate or the like, and a complementary metal oxide semiconductor (CMOS), or the like.

If desired, the support may be coated with an undercoat layer for enhancing the adhesiveness thereof to the overlying layer, for preventing diffusion of substances or for planarizing the surface of the support.

For applying the photosensitive resin composition of the present invention onto a support, employable are any coating methods of slit coating, inkjet coating, spin coating, casting, roll coating, screen printing, or the like.

In producing the light-shielding color filter, the thickness of the coating film of the photosensitive resin composition is preferably from 0.35 μm to 3.0 μm from the viewpoint of the resolution and the developability thereof, more preferably from 0.50 μm to 2.5 μm.

The photosensitive resin composition applied onto the support is dried generally at 70° C. to 110° C. for 2 minutes to 4 minutes or so, whereby a photosensitive layer is formed thereon.

<Exposure Step>

In the exposure step, the photosensitive layer formed in the above photosensitive layer formation step is cured through exposure to light (in case where the layer is exposed to light via a mask, only the light-irradiated part of the coating film is cured).

Preferably, the exposure is attained through exposure to radiations, and the radiations preferred for the exposure are UV rays such as g-line, i-line, or the like. More preferred are radiations from high-pressure mercury lamp. The irradiation intensity is preferably from 5 mJ to 1500 mJ, more preferably from 10 mJ to 1000 mJ, most preferably from 10 mJ to 800 mJ.

<Development Step>

After the exposure step, the layer may be processed for alkali development (development step).

In the development step, the part not light-irradiated in the exposure step is dissolved out with an aqueous alkali solution. As a result, only the photocured part remains.

The developer is preferably an organic alkali developer not causing damage to the underlying circuit, or the like. The development temperature may be generally from 20° C. to 30° C., and the development time may be from 20 to 90 seconds.

The alkali for the developer may be an organic alkali compound, including, for example, aqueous ammonia, ethylamine, diethylamine, dimethylethanolamine, tetramethylammonium hydroxide, tetraethylammonium hydroxide, choline, pyrrole, piperidine, 1,8-diazabicyclo-[5,4,0]-7-undecene or the like. The compound may be diluted with pure water to have a concentration of from 0.001 to 10% by mass, preferably from 0.01 to 1% by mass, and the thus-prepared aqueous alkaline solution may be used as the developer. In case where the developer of such an aqueous alkaline solution is used, in general, the development is followed by rinsing with pure water.

The method of producing a light-shielding color filter of the present invention may include, if desired, a curing step of curing the formed pattern through heating and/or exposure to light, after the above-mentioned photosensitive layer formation step, the exposure step and the development step.

<<Solid-Stage Image Sensor>>

The solid-state image sensor of the present invention comprises the above-mentioned light-shielding color filter of the present invention.

The solid-state image sensor of the present invention comprises the light-shielding color filter of the present invention having little development residue, and therefore its noise may be reduced and its color reproducibility can be enhanced.

Regarding the constitution thereof, the solid-state image sensor of the present invention comprises a light-shielding color filter of the present invention, and its constitution is not specifically defined so far as it functions as a solid-state image sensor. For example, the solid-state image sensor of the present invention has, as formed on a support, a light-receiving element of plural photodiodes, polysilicon and the like to constitute the image-receiving area of the solid-stage image sensor element thereof (e.g., CCD image sensor element, CMOS image sensor element), and has, on the image-receiving element side (e.g., the other area than the area where the image-receiving layer is formed) or on the side opposite to that side, a light-shielding color filter of the present invention.

EXAMPLES

The invention is described more specifically with reference to the following Examples; however, the invention should not be limited to these Examples and may include any other changes or modification not overstepping the scope and the sprit of the invention. Unless otherwise specifically indicated, "part" means by mass.

Production Examples for the polymerizable monomer for use in the present invention, and Evaluation Examples for the properties of the composition containing the monomer are described below.

The polymerizable monomer of the present invention was produced according to the process mentioned below. Specifically, the process comprises synthesis of hexahydroxytriphenylene starting from 1,2-dimethoxybenzene, synthesis of acid chloride or mixed acid anhydride for side branch substituent, and their condensation. In this Example, processes for production of hexahydroxytriphenylene, and TP-5, TP-29 and TP-55 for the present invention are exemplified below.

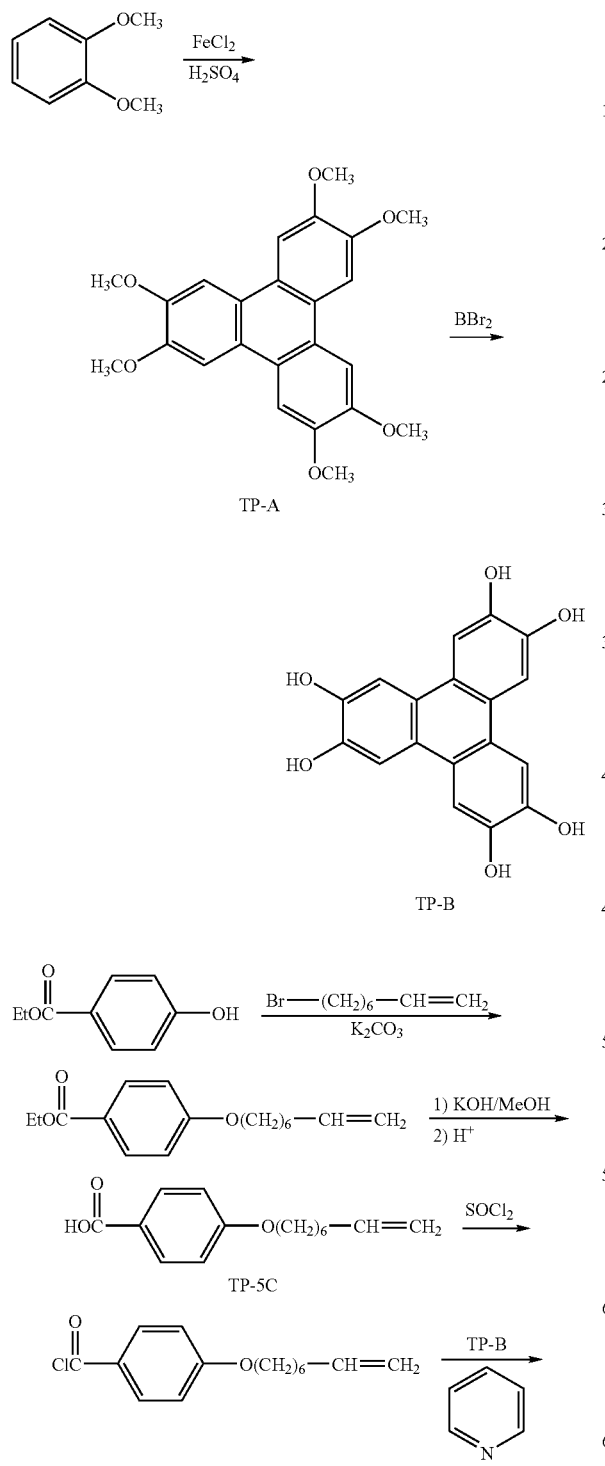

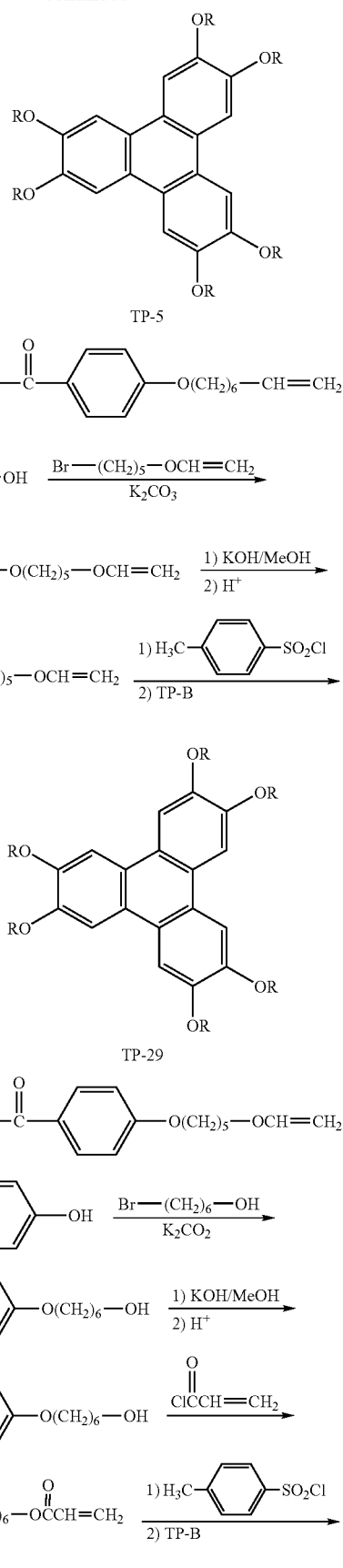

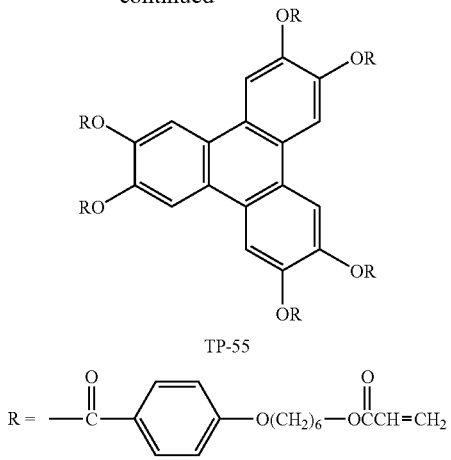

TP-55

R = —C(=O)—⟨C6H4⟩—O(CH2)6—OC(=O)CH=CH2

Production of Polymerizable Monomer

Synthesis Examples

Production of TP-A

Production of 2,3,6,7,10,11-hexamethoxytriphenylene (TP-A)

Ferric sulfate 6-hydrate (455 g) and hot water (193 mL) were put into a 2-liter three-neck flask cooled with ice, and vigorously stirred with a mechanical stirrer to completely dissolve them; and then 1,2-dimethoxybenzene (58.7 g) was added thereto. Next, with cooling with water, concentrated sulfuric acid (882 mL) was gradually added. After 24 hours, this was gradually poured into water with ice (9 L); and after 5 hours, the reaction mixture was filtered through a glass filter to prepare a crude crystal of TP-A (48.1 g, 83%).

Production of TP-B

Production of 2,3,6,7,10,11-hexahydroxytriphenylene (TP-B)

TP-A (48.1 g) was suspended in dichloromethane (850 mL), and boron tribromide (150 g) was gradually added thereto. After 2 hours, this was poured into water with ice (7 L), and filtered with Celite. The intended product including Celite was taken out, again dissolved in methanol, and filtered; and the filtrate was concentrated under reduced pressure. The resulting residue was filtered under reduced pressure, and washed with a mixed solvent of acetonitrile and dichloromethane to give the intended product (32.7 g, 86%).

Production of TP-5

Production of 4-(7-octenyloxy)-benzoic acid (TP-5C)

p-hydroxybenzoic acid (33.2 g), 8-bromo-1-octene (57.3 g), potassium carbonate (41.5 g) and N,N-dimethylacetamide (200 mL) were put into a 500-mL three-neck flask, and stirred at 120° C. for 5 hours. After cooled, the reaction mixture was poured into water (200 mL), extracted with ethyl acetate (500 mL), and washed two times with water (100 mL). This was dried with anhydrous magnesium sulfate and then filtered. The solvent was removed through concentration under reduced pressure, the residue was dissolved in methanol (100 mL), and a methanol solution (20 mL) of potassium hydroxide (16.8 g) was dropwise and gradually added thereto, and heated under reflux for 2 hours. After cooled, the formed crystal was collected through filtration and washed with water. This was dried to give TP-5C (63.3 g, 85%).

Production of 2,3,6,7,10,11-hexa(4-(7-octenyloxy)benzoyloxy)triphenylene (TP-5)

TP-5C (4.5 g) and thionyl chloride (5 mL) were put into a 100-mL three-neck flask, and heated under reflux for 2 hours. After the reaction, the excessive thionyl chloride was evaporated away under reduced pressure. TP-B (0.7 g) and pyridine (20 mL) were added to it, and stirred at room temperature for 4 hours. Under reduced pressure, the excessive pyridine was evaporated away, and the residue was purified through silica gel column chromatography to give TP-5 (2.73 g, 75%).
Identification Date of TP-5:
IR (cm$^{-1}$): 3080, 2940, 2860, 1740, 1605, 1580, 1510, 1470, 1420, 1315, 1250, 1170, 1120, 1070, 1010, 900, 840, 760, 695.

Production of TP-29

Production of 4-(5-vinyloxypentyloxy)benzoic acid (TP-29C)

Ethyl p-hydroxybenzoate (33.2 g), 5-bromopentylvinyl ether (58.0 g), potassium carbonate (41.5 g) and N,N-dimethylacetamide (200 mL) were put into a 500-mL three-neck flask, and stirred at 120° C. for 5 hours. After cooled, the reaction mixture was poured into water (200 mL), extracted with ethyl acetate (500 mL), and washed two times with water (100 mL). This was dried with anhydrous magnesium sulfate, and filtered. The solvent was removed through concentration under reduced pressure, the residue was dissolved in methanol (100 mL), and a methanol solution (20 mL) of potassium hydroxide (16.8 g) was dropwise and gradually added thereto, and heated under reflux for 2 hours. After cooled, the formed crystal was collected through filtration and dissolved in water (1 L). Concentrated hydrochloric acid (25.7 mL) was added thereto, and the precipitated crystal was collected through filtration under reduced pressure, and washed with water. This was dried to give 4-(5-vinyloxypentyloxy)benzoic acid (TP-29C) (64.3 g, 90%). Production of 2,3,6,7,10,11-hexa(4-(5-vinyloxypentyloxy)benzoyloxy)triphenylene (TP-29):

TP-29C (5.72 g), triethylamine (6.7 mL) and 1,2-dimethoxyethane (60 mL) were put into a 300-mL three-neck flask, then methanesulfonic acid chloride (2.75 g) was gradually and dropwise added thereto at 0° C., and stirred as such for 2 hours. This was restored to room temperature, and 4-dimethylaminopyridine (0.3 g) and TP-B (0.65 g) were added thereto and stirred for 6 hours. The reaction mixture was filtered, the filtrate was concentrated under reduced pressure and purified through silica gel column chromatography to give TP-29 (2.8 g, 82%).
Identification Date of TP-29:
IR (cm$^{-1}$): 2960, 2955, 2880, 1765, 1690, 1625, 1605, 1520, 1495, 1480, 1435, 1420, 1375, 1360, 1290, 1260, 1220, 1195, 1140, 1110, 1080, 1050, 1030, 880, 810, 780, 740.

Production of TP-55

Production of 4-(6-acryloyloxyhexyloxy)benzoic acid (TP-55C)

Ethyl p-hydroxybenzoate (33.2 g), 6-bromohexanol (54.3 g), potassium carbonate (41.5 g) and N,N-dimethylacetamide (200 mL) were put into a 500-mL three-neck flask, and stirred at 120° C. for 5 hours. After cooled, the reaction mixture was poured into water (200 mL), extracted with ethyl acetate (500 mL), and washed two times with water (100 mL). This was dried with anhydrous magnesium sulfate, and filtered. The solvent was removed through concentration under reduced pressure, the residue was dissolved in methanol (100 mL), and a methanol solution (20 mL) of potassium hydroxide (16.8 g) was dropwise and gradually added thereto, and heated under reflux for 2 hours. After cooled, the formed crystal was collected through filtration and dissolved in water (1 L). Concentrated hydrochloric acid (25.7 mL) was added thereto, and the precipitated crystal was collected through filtration under reduced pressure, and washed with water. This was dried to give 4-(6-hydroxyhexyloxy)benzoic acid (61.5 g, 86%). 4-(6-Hydroxyhexyloxy)benzoic acid (9.53 g), N,N-dimethylaniline (5.33 g) and dioxane (100 mL) were put into a 300-mL three-neck flask, and acrylic acid chloride (3.98 g) was gradually and dropwise added thereto at 60° C. and stirred for 6 hours. After cooled, this was poured into water with ice (200 mL), and the precipitated crystal was collected through filtration under suction, washed with hexane and dried to give TP-55C (9.4 g, 80%). Production of 2,3,6,7,10,11-hexa(4-(6-acryloyloxyhexyloxy)benzoyloxy) triphenylene (TP-55):

TP-55C (5.67 g), triethylamine (6.7 mL) and 1,2-dimethoxyethane (60 mL) were put into a 300-mL three-neck flask, then methanesulfonic acid chloride (2.75 g) was gradually and dropwise added thereto at 0° C., and stirred as such for 2 hours. This was restored to room temperature, and 4-dimethylaminopyridine (0.3 g) and TP-B (0.65 g) were added thereto and stirred for 6 hours. The reaction mixture was filtered, the filtrate was concentrated under reduced pressure and purified through silica gel column chromatography to give TP-55 (3.2 g, 80%).

Identification Date of TP-55

IR (cm$^{-1}$): 2950, 2870, 1740, 1730, 1610, 1605, 1585, 1520, 1480, 1430, 1415, 1375, 1320, 1300, 1260, 1200, 1180, 1130, 1080, 1010, 990, 905, 850, 820, 760, 700.

<Production of Planarization Film-Fitted Wafer>

(1) Preparation of Resist Solution for Planarization Film:

A composition of the following ingredients was mixed and stirred with a stirrer to prepare a resist solution for planarization film.

<Composition of Resist Solution for Planarization Film>

| | |
|---|---|
| Benzyl methacrylate/methacrylic acid copolymer (=70/30 by mol; weight-average molecular weight 30000; manufactured by Fujikura Chemical; trade name: Acrybase FF-187) | 16.4 parts |
| Dipentaerythritol pentaacrylate (manufactured by Nippon Kayaku; trade name: Kayarad DPHA) | 6.5 parts |
| Propylene glycol monomethyl ether acetate (manufactured by Daicel Chemical; trade name: MMPGAC) | 13.8 parts |
| Ethyl 3-ethoxypropionate (manufactured by Nagase Industry; trade name: ethyl 3-ethoxypropionate) | 12.3 parts |

-continued

<Composition of Resist Solution for Planarization Film>

| | |
|---|---|
| Triazine initiator mentioned below (manufactured by Panchim; trade name: Triazine PP) | 0.3 parts |

Triazine Initiator

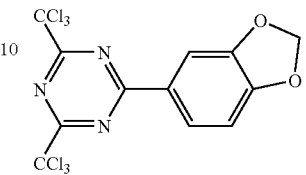

(2) Formation of Planarization Film:

A 6-inch silicon wafer was prepared, and the resist solution for planarization film produced in the above was applied uniformly onto it by spin coating to form a coating film. The formed coating film was heated on a hot plate having a surface temperature of 120° C. for 120 seconds. In the spin coating, the coating revolution speed was so controlled that the thickness of the coating film after heat treatment could be about 1 μm. Next, the heat-treated coating film was further heated in an oven at 220° C. for 1 hour to cure the coating film to be a planarization film.

In the manner as above, a planarization film-fitted wafer having a planarization film formed on the 6-inch silicon wafer was produced.

Example 1

Formation of Light-Shielding Color Filter (1) Preparation of Black Photosensitive Resin Composition:

A composition of the following ingredients was mixed to prepare a black photosensitive resin composition.

<Composition>

| | |
|---|---|
| Pigment dispersion A (K-042884-2, manufactured by Toyo Ink) (containing black pigment, carbon black (19.4% by mass) (solid content of black pigment = 23% by mass), dispersant (8.9% by mass), cyclohexanone (16.1% by mass) and propylene glycol monomethyl acetate (55.6% by mass) | 59.35 parts |
| Resin A (45% solution of benzyl methacrylate/methacrylic acid (=70/30 by mol) copolymer in propylene glycol monomethyl ether acetate, weight-average molecular weight, 30000; manufactured by Fujikura Chemical; trade name: Acrybase FF-187) | 19.98 parts |
| Polymerizable monomer TP-5 | 2.15 parts |
| Polymerizable monomer A (dipentaerythritol pentaacrylate; manufactured by Nippon Kayaku; trade name: Kayarad DPHA) | 4.29 parts |
| Photopolymerization initiator A (oxime compound I mentioned below, manufactured by Ciba Speciality Chemical; trade name: Irgacure OXE02) | 1.237 parts |
| Solvent A (propylene glycol monomethyl ether acetate; manufactured by Daicel Chemical; trade name: MMPGAC) | 8.83 parts |
| Surfactant A (Megafac F-144, Dai-Nippon Ink's fluorine-containing surfactant) | 0.08 parts |

| <Composition> | |
|---|---|
| Polymerization inhibitor A (p-methoxyphenol, manufactured by Kanto Chemical; trade name: p-methoxyphenol) | 0.003 parts |

*Oxime Compound I:

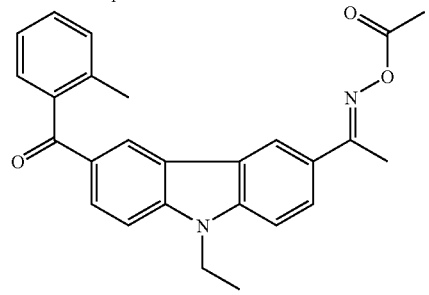

(2) Formation of Black Film:

The black photosensitive resin composition produced in the above was applied onto the planarization film on the silicon wafer by spin coating, and then heated and dried on a hot plate at a coating film surface temperature of 90° C. for 120 seconds, thereby forming a black film having a dry thickness of 2.30 μm.

(3) Formation of Black Pattern

Next, the dried black film was exposed to light from an i-line stepper (Canon's FPA-3000i5+) via a mask pattern having 5.0-μm square pixel patterns matrix-wise aligned in a region of 4 mm×3 mm on a substrate, to an exposure level of from 100 to 3000 mJ/m². After the patterning exposure, the black film was paddle-developed with an aqueous solution of 60% organic alkaline developer CD-2000 (manufactured by FUJIFILM Electronics Materials) (aqueous solution containing tetramethylammonium hydroxide in an amount of 0.3% by mass along with a nonionic surfactant (pH=10)), at 23° C. for 60 seconds.

Next, this was rinsed for 20 seconds with pure water by spin showering. Next, this was further rinsed with water, and then the water drops were blown away with high-pressure air. The silicon wafer was then spontaneously dried, and post-baked on a hot plate at 220° C. for 300 seconds.

In the manner as above, a black pattern was formed on the silicon wafer.

<Evaluation>

The black photosensitive resin composition and the black pattern produced in the above were evaluated in the manner mentioned below. The evaluated and measured data are shown in Table 2 below.

(1) Sensitivity:

The minimum irradiation dose with which the thickness of the light irradiation region does no more change depending on development is determined, and this is the index of evaluating the sensitivity of the composition. The samples having a smaller minimum irradiation dose have a higher sensitivity.

(2) Optical Density:

The optical density at a wavelength of 365 nm of a black film before exposure and development, as formed on the planarization film of a silicon wafer, is measured with a Macbeth densitometer (TD-904, manufactured by Macbeth), and the optical density ($OD^{365}$) of the film having a thickness of 2.30 μm is determined.

(3) Adhesiveness to Substrate:

The presence or absence of pattern defects resulting from peeling of matrix-like pixel patterns from a silicon wafer is checked with a measuring SEM (S-7800H, manufactured by Hitachi), and the samples are evaluated according to the following evaluation standards.

<Evaluation Standards>

A: No pattern defect was found.

B: Few pattern defects were found, but the pattern was partly broken.

C: Many pattern defects were found.

(4) Surface Layer Defects on Pattern Side Surfaces:

The presence or absence of pattern side surface layer defects in the matrix-like pixel patterns is checked with a measuring SEM (S-7800H, manufactured by Hitachi), and the samples are evaluated according to the following evaluation standards.

<Evaluation Standards>

A: No pattern defect was found.

B: Few pattern defects were found, but the pattern was partly broken.

C: Many pattern defects were found.

(5) Development Residue:

Of the patterned surface of the silicon wafer after development, the presence or absence of a residue in the region not exposed to light (unexposed region) is checked with a measuring SEM (S-7800H, manufactured by Hitachi), and the samples are evaluated according to the following evaluation standards.

<Evaluation Standards>

A: No residue was found at all in the unexposed region.

B: Some slight residue was found in the unexposed region, but it is practically no problem.

C: Much residue was found in the unexposed region.

(6) Pattern Profile:

The post-baked pixel pattern formed on a silicon wafer is cut in the direction parallel to the normal direction of the wafer surface, and the pattern profile on the cut section of the sample is checked with SEM (S-4800, manufactured by Hitachi High-Technologies), and the cross-sectional profile of the pattern is evaluated as to whether it is rectangular or not. The cross-sectional profile of the pattern is most preferably rectangular, but may be forward-tapered in some degree. However, a reversed-tapered profile is not good.

Examples 2 to 8

Black photosensitive resin compositions were produced in the same manner as in Example 1, except that the constitutive ingredients were changed as in Table 1 below; and the black patterns formed of the individual compositions were evaluated in the same manner. The evaluation and measurement results are as in Table 2 below.

Comparative Examples 1 to 3

Black photosensitive resin compositions were produced in the same manner as in Example 1, except that the constitutive ingredients were changed as in Table 1 below; and the black patterns formed of the individual compositions were evaluated in the same manner. The evaluation and measurement results are as in Table 2 below.

TABLE 1

| | Resin | Monomer 1 | Monomer 2 | Dispersion | Organic Solvent | Photo-polymerization Initiator | Surfactant | Polymerization Inhibitor |
|---|---|---|---|---|---|---|---|---|
| Example 1 | resin A (19.98 parts) | TP-5 (2.15 parts) | monomer A (4.29 parts) | dispersion A (59.35 parts) | solvent A (8.83 parts) | initiator A (1.237 parts) | surfactant A (0.08 parts) | polymerization inhibitor A (0.003 parts) |
| Example 2 | resin A (19.98 parts) | TP-29 (2.15 parts) | monomer A (4.29 parts) | dispersion A (59.35 parts) | solvent A (8.83 parts) | initiator A (1.237 parts) | surfactant A (0.08 parts) | polymerization inhibitor A (0.003 parts) |
| Example 3 | resin A (19.98 parts) | TP-55 (2.15 parts) | monomer A (4.29 parts) | dispersion A (59.35 parts) | solvent A (8.83 parts) | initiator A (1.237 parts) | surfactant A (0.08 parts) | polymerization inhibitor A (0.003 parts) |
| Example 4 | resin A (16.52 parts) | TP-55 (6.40 parts) | monomer A (1.60 parts) | dispersion A (59.35 parts) | solvent A (8.83 parts) | initiator A (0.314 parts) | surfactant A (0.08 parts) | polymerization inhibitor A (0.003 parts) |
| Example 5 | resin A (22.91 parts) | TP-55 (0.32 parts) | monomer A (4.80 parts) | dispersion A (59.35 parts) | solvent A (8.83 parts) | initiator A (0.314 parts) | surfactant A (0.08parts) | polymerization inhibitor A (0.003 parts) |
| Example 6 | resin B (19.98 parts) | TP-55 (2.15 parts) | monomer A (4.29 parts) | dispersion A (59.35 parts) | solvent A (8.83 parts) | initiator A (1.237 parts) | surfactant A (0.08 parts) | polymerization inhibitor A (0.003 parts) |
| Example 7 | resin C (19.98 parts) | TP-55 (2.15 parts) | monomer A (4.29 parts) | dispersion A (59.35 parts) | solvent A (8.83 parts) | initiator A (1.237 parts) | surfactant A (0.08 parts) | polymerization inhibitor A (0.003 parts) |
| Example 8 | resin D (19.98 parts) | TP-55 (2.15 parts) | monomer A (4.29 parts) | dispersion A (59.35 parts) | solvent A (8.83 parts) | initiator A (1.237 parts) | surfactant A (0.08 parts) | polymerization inhibitor A (0.003 parts) |
| Comparative Example 1 | resin A (11.78 parts) | — | monomer A (10.00 parts) | dispersion A (59.35 parts) | solvent A (8.83parts) | initiator A (0.314 parts) | surfactant A (0.08 parts) | polymerization inhibitor A (0.003 parts) |
| Comparative Example 2 | resin A (24.76 parts) | — | monomer A (4.29 parts) | dispersion A (59.35 parts) | solvent A (8.83 parts) | initiator A (0.314 parts) | surfactant A (0.08 parts) | polymerization inhibitor A (0.003 parts) |
| Comparative Example 3 | resin A (38.07 parts) | — | monomer A (2.70 parts) | dispersion A (59.35 parts) | solvent A (8.83 parts) | initiator A (1.237 parts) | surfactant A (0.08 parts) | polymerization inhibitor A (0.003 parts) |

The structure of the compound in the column of the photopolymerizable compound in the above Table 1 is shown below.

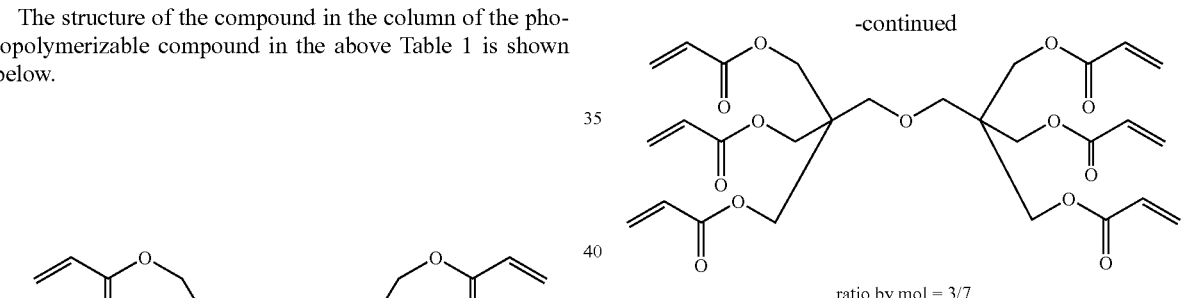

ratio by mol = 3/7
Monomer A

Resin B: 45% solution of benzyl methacrylate/methacrylic acid/2-hydroxyethyl methacrylate (=60/21/19 by mol) copolymer in propylene glycol monomethyl ether acetate, weight-average molecular weight, 14000.

Resin C: 45% solution of benzyl methacrylate/methacrylic acid/2-hydroxyethyl methacrylate (=60/21/19 by mol) copolymer in propylene glycol monomethyl ether acetate, weight-average molecular weight, 30000.

Resin D: 45% solution of benzyl methacrylate/methacrylic acid/2-hydroxyethyl methacrylate (=60/21/19 by mol) copolymer in propylene glycol monomethyl ether acetate, weight-average molecular weight, 100000.

TABLE 2

| | OD at 365 nm of Film before Exposure | Sensitivity (mJ/cm$^2$) | Adhesiveness to Substrate | Pattern Defects | Development Residue | Pattern Profile |
|---|---|---|---|---|---|---|
| Example 1 | 5.00 | 400 | A | A | A | rectangular |
| Example 2 | 5.00 | 400 | A | A | A | rectangular |
| Example 3 | 5.00 | 400 | A | A | A | rectangular |
| Example 4 | 5.00 | 100 | A | A | A | rectangular |
| Example 5 | 5.00 | 1000 | A | A | A | rectangular |
| Example 6 | 5.00 | 200 | A | A | A | rectangular |

TABLE 2-continued

| | OD at 365 nm of Film before Exposure | Sensitivity (mJ/cm²) | Adhesiveness to Substrate | Pattern Defects | Development Residue | Pattern Profile |
|---|---|---|---|---|---|---|
| Example 7 | 5.00 | 200 | A | A | A | rectangular |
| Example 8 | 5.00 | 200 | A | A | A | rectangular |
| Comparative Example 1 | 5.00 | 3000 | C | C | A | forward tapered |
| Comparative Example 2 | 5.00 | 2000 | C | C | A | forward tapered |
| Comparative Example 3 | 5.00 | 500 | A | C | C | rectangular |

As shown in the above Table 2, the compositions of Examples 1 to 5 had high sensitivity and were well patterned, as containing the polymerizable monomer specifically defined in the present invention, and the patterns were all good as having good adhesiveness to the underlying wafer, giving little development residue and having a good pattern profile.

In Examples 6 to 8, when the polymerizable monomer specifically defined in the present invention is combined with any of copolymer resins B to D having a hydroxyl group and a carboxylic acid group, then the adhesiveness of the film to the substrate was further enhanced and the sensitivity of the compositions was higher.

As opposed to these, the compositions of Comparative Examples 1 and 2 not containing the polymerizable monomer specifically defined in the present invention both had a low sensitivity and had pattern defects, and in addition, the pattern profile was forward-tapered and was not good.

Further, in Comparative Example 3 where the amount of the monomer A was reduced, the sensitivity of the compositions increased; however, the compositions gave development residue and the formed patterns had defects.

According to the present invention, there is provided a black photosensitive resin composition satisfying all the requirements of good stability (free from sensitivity change and patterning profile change with time), high light-shieldability and good adhesiveness to substrate and the requirement of the absence of surface layer defects on the side surfaces of the formed patterns.

The entire disclosure of each and every foreign patent application from which the benefit of foreign priority has been claimed in the present application is incorporated herein by reference, as if fully set forth.

What is claimed is:

1. A black photosensitive resin composition, comprising:

a black colorant;

a compound represented by Formula (I) or (II);

an alkali-soluble resin that includes a polymer containing monomers having at least one of a hydroxyl group and a carboxylic acid group as a main ingredient of the alkali-soluble resin, the polymer having a weight-average molecular weight of from 5000 to $1 \times 10^5$ in terms of polystyrene as measured by GPC method; and a photopolymerization initiator:

Formula (I):

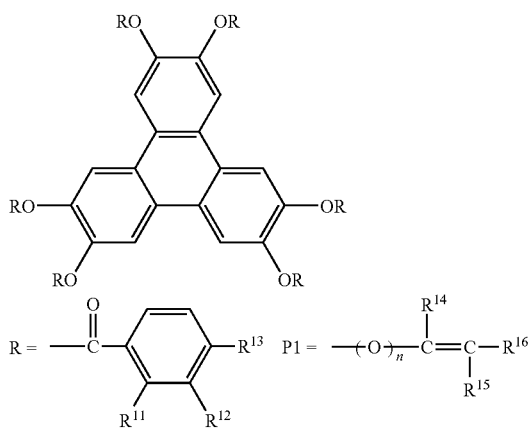

wherein $R^{11}$ and $R^{12}$ each independently represents a hydrogen atom or a methyl group;

$R^{13}$ represents a substituent P1 or an alkoxy group substituted with a substituent P1 at the terminal of the alkoxy group;

$R^{14}$ and $R^{15}$ in the substituent P1 each independently represents a hydrogen atom or an unsubstituted alkyl group;

$R^{16}$ in the substituent P1 represents a hydrogen atom, a 2-chloroethyl group, a methoxyethoxyethyl group or an unsubstituted alkyl group; and n represents 0 or 1:

Formula (II):

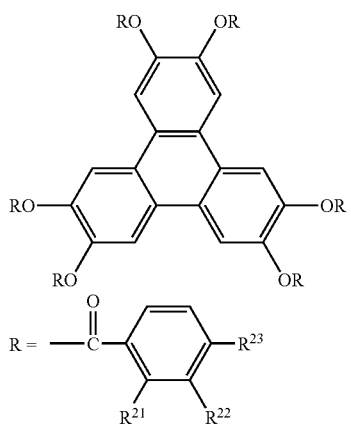

-continued

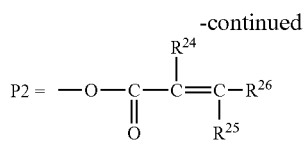

wherein $R^{21}$ and $R^{22}$ each independently represents a hydrogen atom or a methyl group;

$R^{23}$ represents an alkoxy group substituted with a substituent P2 at the terminal of the alkoxy group;

$R^{24}$ and $R^{25}$ in the substituent P2 each independently represents a hydrogen atom or an unsubstituted alkyl group; and $R^{26}$ in the substituent P2 represents a hydrogen atom, a 2-chloroethyl group, a methoxyethoxyethyl group or an unsubstituted alkyl group.

2. The black photosensitive resin composition according to claim 1,
wherein a content of the compound represented by Formula (I) or (II) is from 0.01 to 20% by mass of the total solid content of the black photosensitive resin composition.

3. The black photosensitive resin composition according to claim 1,
wherein the black colorant includes at least one of carbon black and titanium black.

4. The black photosensitive resin composition according to claim 1,
wherein the photopolymerization initiator is an oxime-type initiator.

5. The black photosensitive resin composition according to claim 1,
wherein the polymer contains a hydroxyl group and a carboxylic acid group.

6. A method of producing a light-shielding color filter, the method comprising:
providing a black photosensitive resin composition, comprising:
a black colorant;
a compound represented by Formula (I) or (II); and
a photopolymerization initiator:

Formula (I):

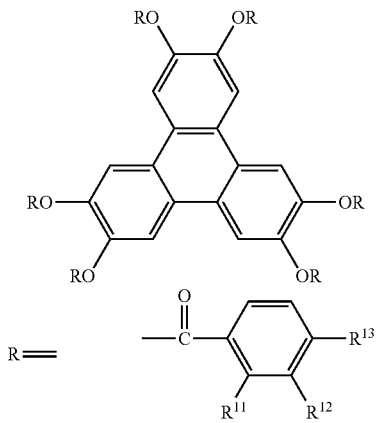

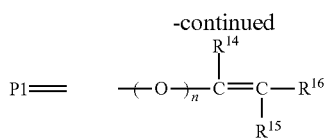

wherein $R^{11}$ and $R^{12}$ each independently represents a hydrogen atom or a methyl group;

$R^{13}$ represents a substituent P1 or an alkoxy group substituted with a substituent P1 at the terminal of the alkoxy group;

$R^{14}$ and $R^{15}$ in the substituent P1 each independently represents a hydrogen atom or an unsubstituted alkyl group;

$R^{16}$ in the substituent P1 represents a hydrogen atom, a 2-chloroethyl group, a methoxyethoxyethyl group or an unsubstituted alkyl group; and n represents 0 or 1:

Formula (II):

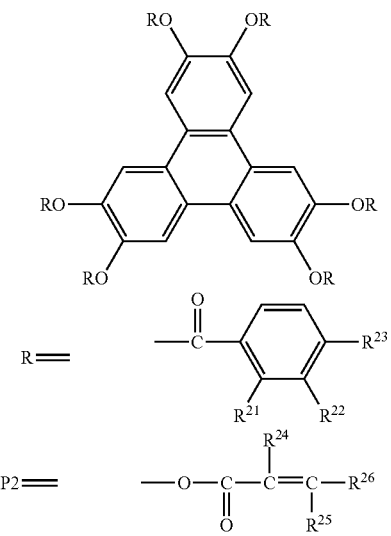

wherein $R^{21}$ and $R^{22}$ each independently represents a hydrogen atom or a methyl group;

$R^{23}$ represents an alkoxy group substituted with a substituent P2 at the terminal of the alkoxy group;

$R^{24}$ and $R^{25}$ in the substituent P2 each independently represents a hydrogen atom or an unsubstituted alkyl group; and $R^{26}$ in the substituent P2 represents a hydrogen atom, a 2-chloroethyl group, a methoxyethoxyethyl group or an unsubstituted alkyl group;

applying the black photosensitive resin composition onto a support so as to form a coating layer;
exposing the coating layer via a photomask so as to form an exposed coating layer; and
developing the exposed coating layer to form a pattern.

7. A light-shielding color filter produced by the method according to claim 6.

8. The method of producing a light-shielding color filter according to claim 6, wherein the black photosensitive resin composition further comprises:
an alkali-soluble resin that includes a polymer containing monomers having at least one of a hydroxyl group and a carboxylic acid group as a main ingredient of the alkali-soluble resin, the polymer having a weight-average molecular weight of from 5000 to $1\times10^5$ in terms of polystyrene as measured by GPC method.

9. The method of producing a light-shielding color filter according to claim 8,
wherein the polymer contains a hydroxyl group and a carboxylic acid group.

10. The method of producing a light-shielding color filter according to claim 6,
wherein the content of the compound represented by Formula (I) or (II) in the black photosensitive resin composition is from 0.01 to 20% by mass of the total solid content of the composition.

11. The method of producing a light-shielding color filter according to claim 6, wherein the black colorant in the black photosensitive resin composition includes at least one of carbon black and titanium black.

12. The method of producing a light-shielding color filter according to claim 6, wherein the photopolymerization initiator in the black photosensitive resin composition is an oxime-type initiator.

* * * * *